(12) United States Patent
Kim et al.

(10) Patent No.: US 10,038,147 B2
(45) Date of Patent: Jul. 31, 2018

(54) ORGANIC LIGHT-EMITTING DEVICE

(71) Applicants: SAMSUNG DISPLAY CO., LTD., Yongin, Gyeonggi-Do (KR); INDUSTRY-ACADEMIC COOPERATION FOUNDATION GYEONGSANG NATIONAL UNIVERSITY, Jinju, Gyeongnam (KR)

(72) Inventors: Mikyung Kim, Yongin (KR); Soonki Kwon, Jinju (KR); Yunhi Kim, Jinju (KR)

(73) Assignees: Samsung Display Co., Ltd., Yongin-si (KR); Industry-Academic Cooperation Foundation Gyeongsang National University, Jinju (KR)

( * ) Notice: Subject to any disclaimer, the term of this patent is extended or adjusted under 35 U.S.C. 154(b) by 307 days.

(21) Appl. No.: 14/738,564

(22) Filed: Jun. 12, 2015

(65) Prior Publication Data
US 2015/0364698 A1    Dec. 17, 2015

(30) Foreign Application Priority Data

Jun. 12, 2014  (KR) .................. 10-2014-0071489
Mar. 10, 2015  (KR) .................. 10-2015-0033248

(51) Int. Cl.
*H01L 51/00* (2006.01)
*H01L 51/50* (2006.01)

(52) U.S. Cl.
CPC ...... *H01L 51/0072* (2013.01); *H01L 51/0058* (2013.01); *H01L 51/0067* (2013.01);
(Continued)

(58) Field of Classification Search
None
See application file for complete search history.

(56) References Cited

U.S. PATENT DOCUMENTS 9,893,292  B2 *  2/2018  Heil ................. H01L 51/0059
2004/0239237  A1 *  12/2004  Matsusue ............ C07F 15/0033
                                                              313/504
(Continued)

FOREIGN PATENT DOCUMENTS

JP       10-251634 A         9/1998
JP       10251634 A  *       9/1998
(Continued)

OTHER PUBLICATIONS

Machine Translation of JP 10-251634 A (pub. 1998).*
(Continued)

*Primary Examiner* — Kevin M Bernatz
(74) *Attorney, Agent, or Firm* — Lewis Roca Rothgerber Christie LLP

(57) ABSTRACT

An organic light-emitting device includes: a first electrode; a second electrode facing the first electrode; an organic layer between the first electrode and the second electrode, the organic layer including an emission layer; and an electron transport region between the emission layer and the second electrode, the electron transport region including an electron transport material represented by Formula 1:

Formula 1

(Continued)

The organic light-emitting device may have low driving voltage, improved efficiency, improved luminance, and improved lifetime.

11 Claims, 3 Drawing Sheets

(52) U.S. Cl.
CPC ...... *H01L 51/5072* (2013.01); *H01L 51/5076* (2013.01); *H01L 2251/308* (2013.01)

(56) References Cited

U.S. PATENT DOCUMENTS

| | | | |
|---|---|---|---|
| 2007/0092753 A1 | 4/2007 | Begley et al. | |
| 2008/0111473 A1 | 5/2008 | Kawamura et al. | |
| 2011/0062481 A1* | 3/2011 | Oyamada | B82Y 20/00 257/98 |
| 2014/0014927 A1* | 1/2014 | Kim | H01L 51/0067 257/40 |
| 2014/0048792 A1* | 2/2014 | Chun | H01L 51/0072 257/40 |
| 2014/0367672 A1* | 12/2014 | Kim | H01L 51/5275 257/40 |

FOREIGN PATENT DOCUMENTS

| | | |
|---|---|---|
| JP | 2006-176448 A | 7/2006 |
| KR | 10-2008-0008722 A | 1/2008 |
| KR | 10-0831356 B1 | 5/2008 |
| KR | 10-2010-0101315 A | 9/2010 |
| KR | 10-2012-0122982 A | 11/2012 |
| KR | 102012122982 A * | 11/2012 |

OTHER PUBLICATIONS

Machine Translation of KR 10-2012-0045387 (pub. 2012).*
Abstract Translation of KR 10-2012-0045387 (pub. 2012).*
Figure images of KR 2012-122982 (pub. 2012).*
Abstract of KR 2012-122982 A (pub. 2012).*
Youn et al. NPL article (Tetrahedron journal—2009).*
Tobisu e tal. (Synthesis of Phenanthridine Derivatives via Oxidative Cyclization, Angew. Chem. Int. Ed., 2012, 11363-11366). (Year: 2012).*
Tumir et al. (Come-back of phenanthridine and phenanthridinum derivatives in the 21st century, Beilstein J. Org. Chem., 2014, 10, 2930-2954). (Year: 2014).*
Theobald et al. (The Chemistry of Phenanthridine and its Derivatives, Chem. Rev., 1950, 46(1), 170-189). (Year: 1950).*

* cited by examiner

ORGANIC LIGHT-EMITTING DEVICE

CROSS-REFERENCE TO RELATED APPLICATIONS

This application claims priority to and the benefit of Korean Patent Application No. 10-2014-0071489, filed on Jun. 12, 2014, and Korean Patent Application No. 10-2015-0033248, filed on Mar. 10, 2015, in the Korean Intellectual Property Office, the entire content of each of which is incorporated herein by reference.

BACKGROUND

1. Field

One or more aspects of embodiments of the present disclosure relate to organic light-emitting devices.

2. Description of the Related Art

Organic light-emitting devices (OLEDs) are self-emitting devices that have advantages such as wide viewing angles, excellent contrast, quick response, high brightness, excellent driving voltage characteristics, and can provide multicolored images.

An organic light-emitting device may have a structure in which a first electrode, a hole transport region, an emission layer, an electron transport region, and a second electrode are sequentially stacked on a substrate. Holes injected from the first electrode move to the emission layer via the hole transport region, while electrons injected from the second electrode move to the emission layer via the electron transport region. Carriers (e.g., holes and electrons) then recombine in the emission layer to generate excitons. When these excitons drop from an excited state to a ground state, light is emitted.

SUMMARY

One or more aspects of embodiments of the present disclosure are directed to organic light-emitting devices.

Additional aspects will be set forth in part in the description which follows and, in part, will be apparent from the description, or may be learned by practice of the presented embodiments.

According to one or more embodiments of the present disclosure, an organic light-emitting device includes: a first electrode; a second electrode facing the first electrode; and an organic layer between the first electrode and the second electrode, the organic layer including an emission layer and an electron transport region between the emission layer and the second electrode, the electron transport region including an electron transport material represented by Formula 1:

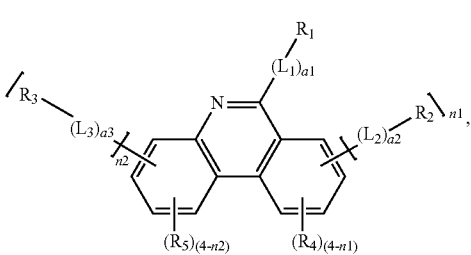

Formula 1 wherein, in Formula 1, $L_1$ to $L_3$ are each independently selected from a substituted or unsubstituted $C_2$-$C_{10}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a3 are each independently selected from 0, 1, 2, and 3;

$R_1$ to $R_3$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_4$ and $R_5$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; and n1 and n2 are each independently selected from 0, 1, 2, 3, and 4, wherein at least one substituent of the substituted $C_2$-$C_{10}$ alkylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_{10}$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figures 1, 2:
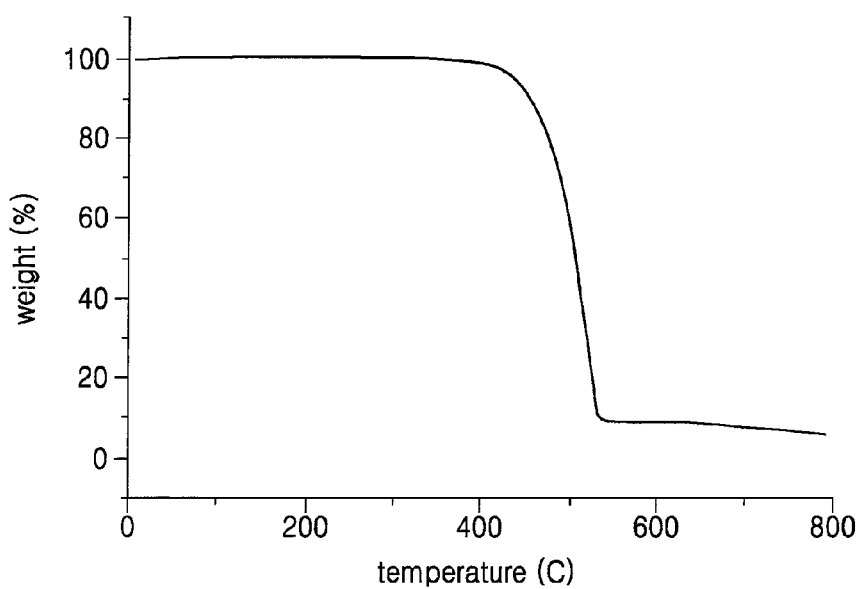
FIG. 1 is a schematic sectional view of a structure of an organic light-emitting device according to one or more embodiments of the present disclosure.
FIG. 2 illustrates results of thermogravimetric analysis (TGA) performed on Compound 5 according to Synthesis Example 1.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments of the present disclosure are merely described below, by referring to the figures, to explain aspects of the present description. As used herein, the term "and/or" includes any and all combinations of one or more of the associated listed items. Expressions such as "at least one of" and "at least one selected from", when preceding a list of elements, modify the entire list of elements and do not modify the individual elements of the list. Further, the use of "may" when describing embodiments of the present invention refers to "one or more embodiments of the present invention."

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, as used herein, the terms "use," "using," and "used" may be considered synonymous with the terms "utilize," "utilizing," and "utilized," respectively.

It will be understood that when a layer, region, or an element is referred to as being "on" another layer, region, or element, the layer, region, or element can be directly on another layer, region, or element or intervening layers, regions or elements.

In the drawings, sizes and thicknesses of layers, regions, and elements may be exaggerated for clarity, and thus are not limited thereto.

As used herein, a statement "an organic layer includes a compound represented by Formula 1", may refer to the organic layer including one or at least two compounds represented by Formula 1.

As used herein, the term "organic layer" refers to a single layer and/or a plurality of layers between first and second electrodes of an organic light-emitting device. A material in the "organic layer" is not limited to an organic material.

Hereinafter, a structure of an organic light-emitting device according to one or more embodiments of the present disclosure and a method of manufacturing the same will be described with reference to FIG. 1. FIG. 1 is a schematic sectional view of an organic light-emitting device 10 according to one or more embodiments of the present disclosure. Referring to FIG. 1, the organic light-emitting device 10 includes a first electrode 110, an organic layer 150, and a second electrode 190.

A substrate may be positioned under the first electrode 110 or on the second electrode 190 in FIG. 1. The substrate may be a glass or transparent plastic substrate with good mechanical strength, thermal stability, transparency, surface smoothness, ease of handling, and/or water resistance.

For example, the first electrode 110 may be formed by depositing or sputtering a first electrode-forming material on the substrate. When the first electrode 110 is an anode, a material having a high work function may be used as the first electrode-forming material so as to facilitate hole injection. The first electrode 110 may be a reflective electrode, a semi-transmissive electrode, or a transmissive electrode. Transparent and conductive materials such as ITO, IZO, $SnO_2$, and/or ZnO may be used to form the first electrode 110. When the first electrode 110 is a semi-transmissive electrode or a reflective electrode, the first electrode may be formed of at least one material selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including a plurality of layers. For example, the first electrode 110 may have a three-layered structure of ITO/Ag/ITO, but is not limited thereto.

The organic layer 150 may be positioned on the first electrode 110. The organic layer 150 may include an emission layer (EML).

The organic layer 150 may further include a hole transport region between the first electrode 110 and the EML, and an electron transport region between the EML and the second electrode 190.

The hole transport region may include at least one selected from a hole injection layer (HIL), a hole transport layer (HTL), a buffer layer (BL), and an electron blocking layer (EBL). The electron transport region may include at least one selected from a hole blocking layer (HBL), an electron transport layer (ETL), and an electron injection layer (EIL). However, embodiments of the present disclosure are not limited thereto.

The hole transport region may have a single-layered structure including a single material, a single-layered structure including a plurality of materials, or a multi-layered structure including a plurality of layers including different materials.

In some embodiments, the hole transport region may have a single-layered structure including a plurality of materials, or a multi-layered structure of HIL/HTL, HIL/HTL/buffer layer, HIL/buffer layer, HTL/buffer layer, or HIL/HTL/EBL, wherein the layers in each multi-layered structure are sequentially positioned on the first electrode 110 in the order stated above. However, embodiments of the present disclosure are not limited thereto.

When the hole transport region includes a HIL, the HIL may be formed on the first electrode 110 by using (utilizing) one or more suitable methods, for example, by using vacuum deposition, spin coating, casting, Langmuir-Blodgett (LB) deposition, inkjet printing, laser printing, laser induced thermal imaging (LITI), and/or the like.

When the HIL is formed using vacuum deposition, the deposition conditions may vary depending on the material that is used to form the HIL and the structure of the HIL. For example, the deposition conditions may be selected from the following conditions: a deposition temperature of about 100° C. to about 500° C., a degree of vacuum of about $10^{-8}$ to about $10^{-3}$ torr, and a deposition rate of about 0.01 to about 100 Å/sec.

When the HIL is formed using spin coating, the coating conditions may vary depending on the material that is used to form the HIL and the structure of the HIL. For example, the coating conditions may be selected from the following conditions: a coating rate of about 2,000 rpm to about 5,000 rpm and a heat treatment temperature of about 800° C. to about 200° C.

When the hole transport region includes a HTL, the HTL may be formed on the first electrode 110 or the HIL by using one or more suitable methods, for example, by using vacuum deposition, spin coating, casting, Langmuir-Blodgett (LB) deposition, inkjet printing, laser printing, laser induced thermal imaging (LITI), and/or the like. When the HTL is formed using vacuum deposition and/or spin coating, the conditions for deposition and coating may be similar to the above-described deposition and coating conditions for forming the HIL.

In some embodiments, the hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrenesulfonate)(PEDOT/PSS), polyaniline/camphor sulfonic acid (Pani/CSA), polyaniline/poly(4-styrenesulfonate) (PANI/PSS), quinine derivatives such as tetracyanoquinodimethane (TCNQ) and 2,3,5,6-tetrafluorotetracyano-1,4-benzoquinodimethane (F4-TCNQ), HT-D1, a compound represented by Formula 201, and a compound represented by Formula 202.

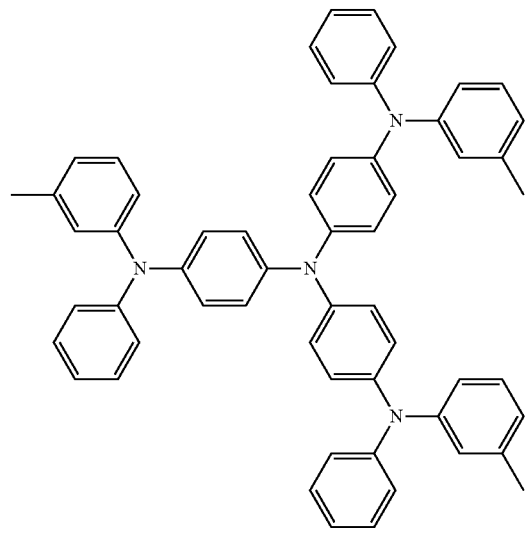

m-MTDATA

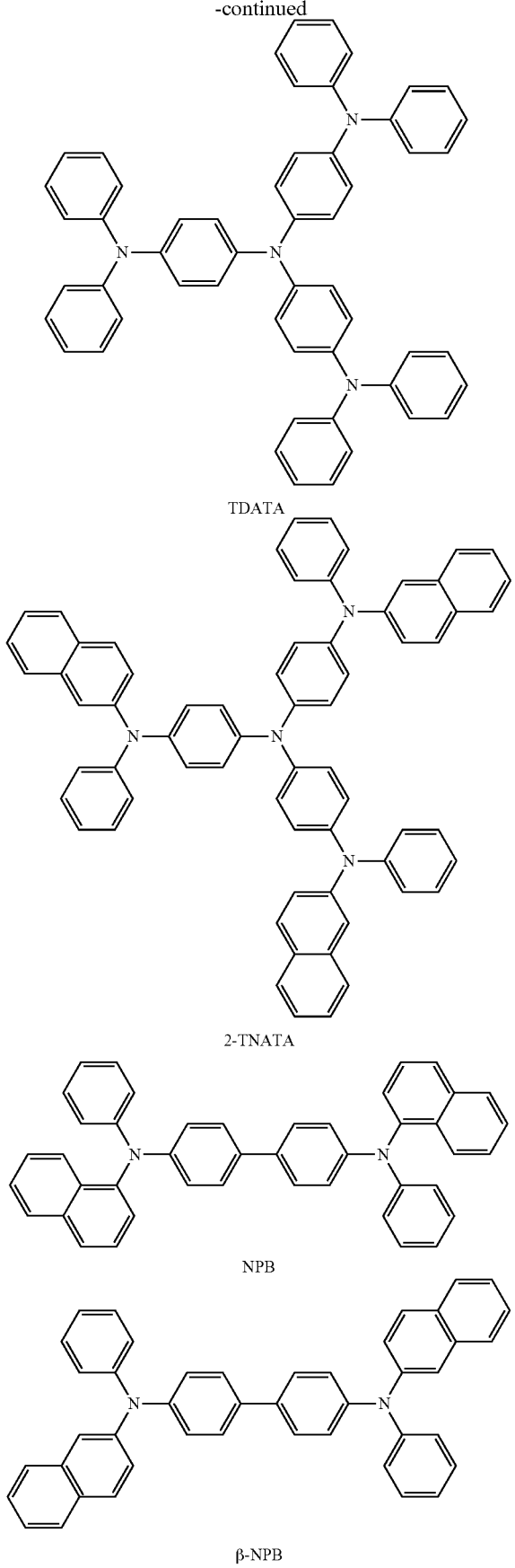
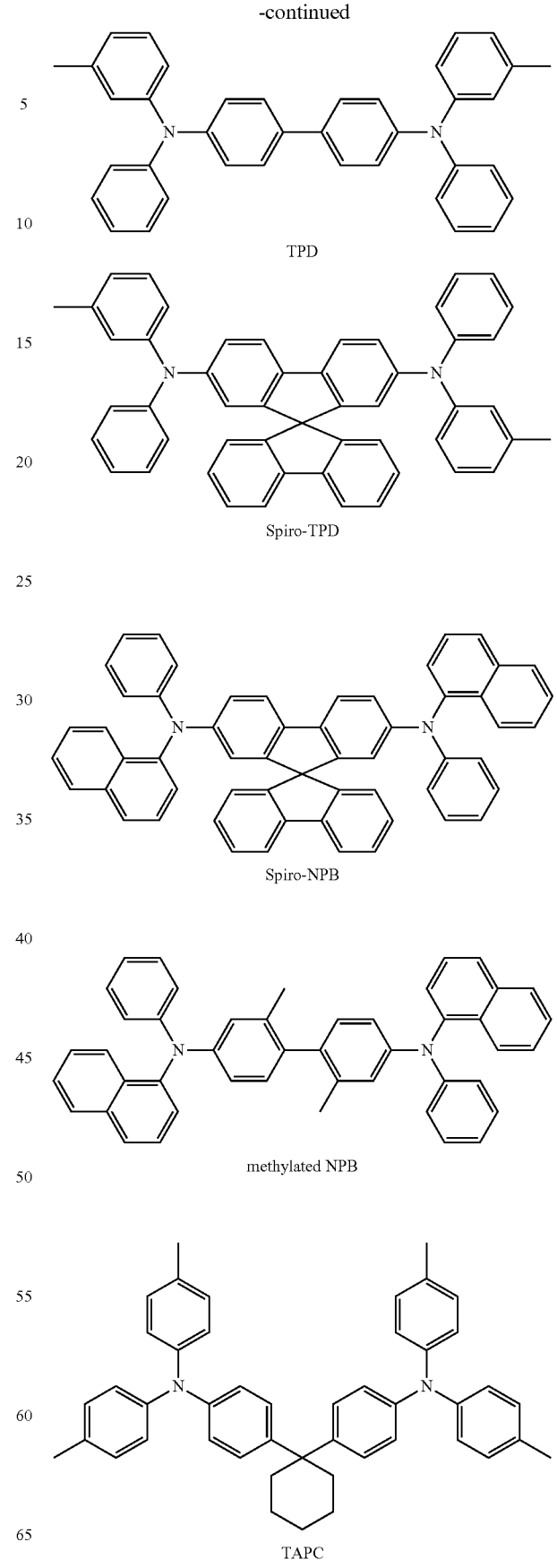

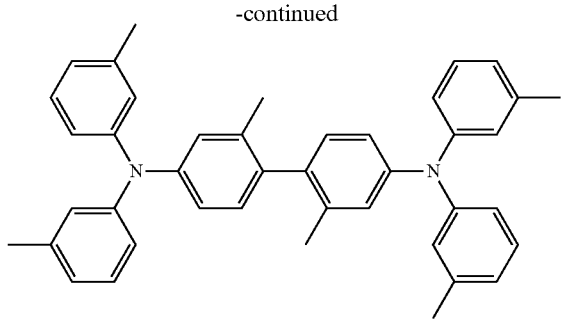

HMTPD

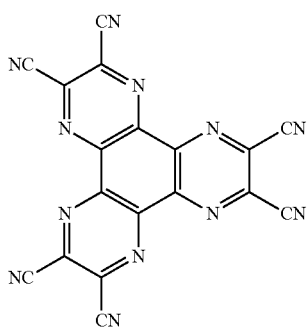

Compound HT-D1

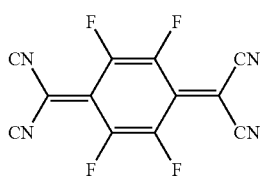

F4-TCNQ

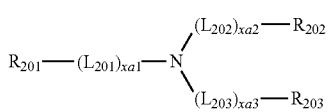

Formula 201

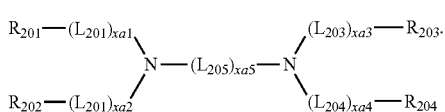

Formula 202

In Formulae 201 and 202, $L_{201}$ to $L_{205}$ may be each independently defined the same as $L_1$ described herein;

xa1 to xa4 may be each independently selected from 0, 1, 2, and 3;

xa5 may be selected from 1, 2, 3, 4, and 5; and $R_{201}$ to $R_{204}$ may be each independently defined the same as $R_1$ described herein.

For example, in Formulae 201 and 202, $L_{201}$ to $L_{205}$ may be each independently selected from:

a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3; and $R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

For example, the compound of Formula 201 may be a compound represented by Formula 201A:

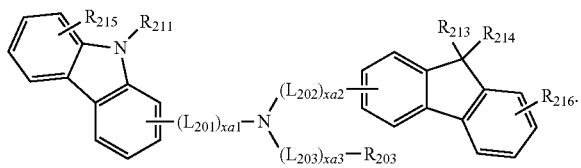

Formula 201A

For example, the compound of Formula 201 may be a compound represented by Formula 201A-1, but is not limited thereto:

Formula 201A-1

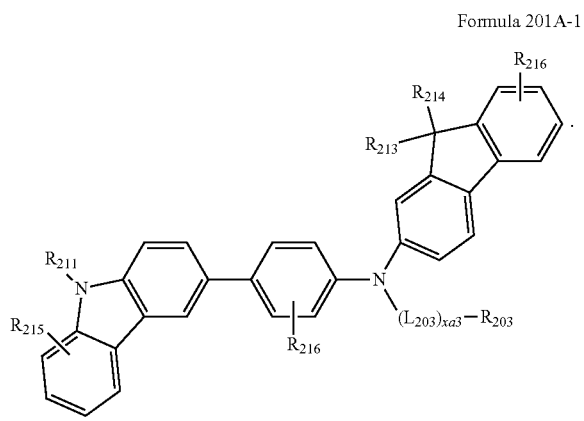

The compound of Formula 202 may be a compound represented by Formula 202A, but is not limited thereto:

Formula 202A

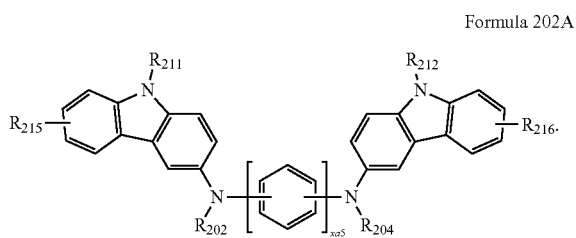

In Formulae 201A, 201A-1, and 202A, definitions for each of $L_{201}$ to $L_{203}$, xa1 to xa3, xa5, and $R_{202}$ to $R_{204}$ may be the same as provided herein;

$R_{211}$ and $R_{212}$ may be each independently defined the same as $R_{203}$ described herein; and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from:

a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthalenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be linked to each other to form a saturated or unsaturated ring.

The compound of Formula 201 and the compound of Formula 202 may each independently be selected from Compounds HT1 to HT20, but are not limited thereto.

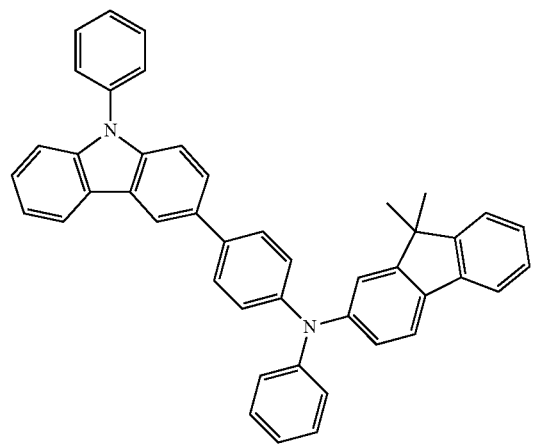

HT1

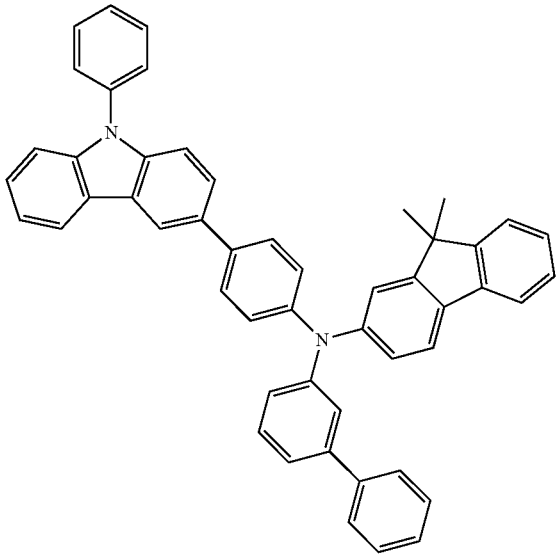

HT2

HT3
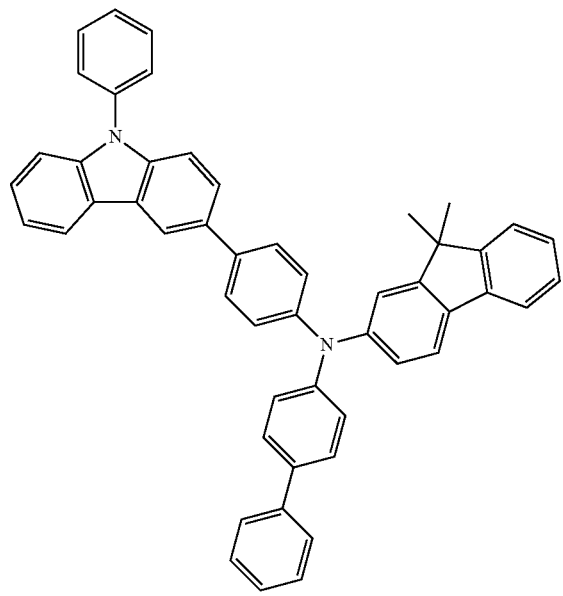
HT5
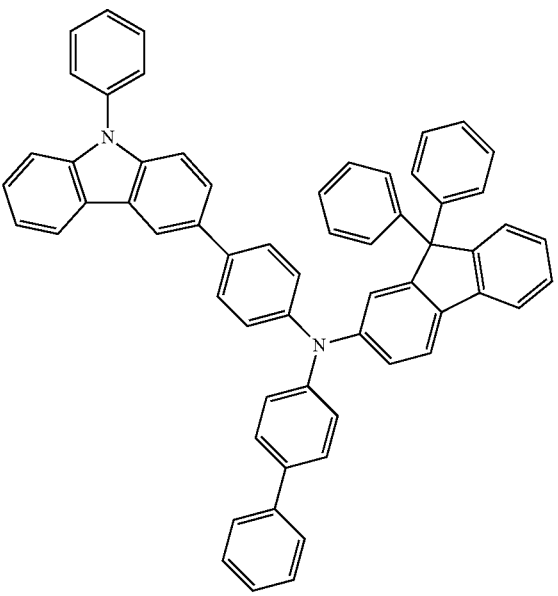
HT4
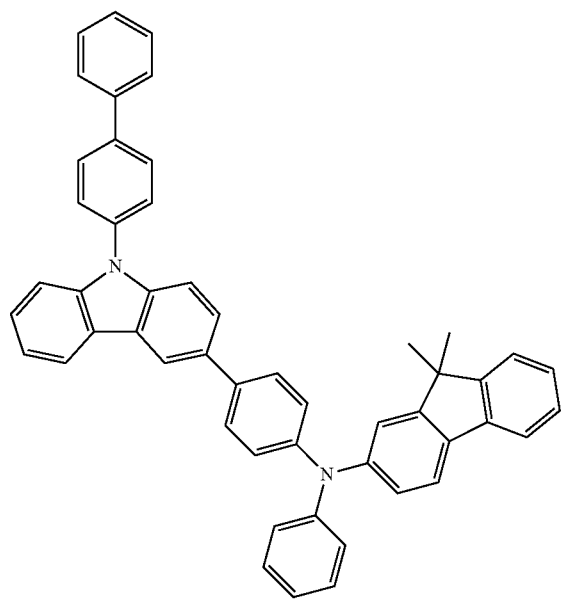
HT6
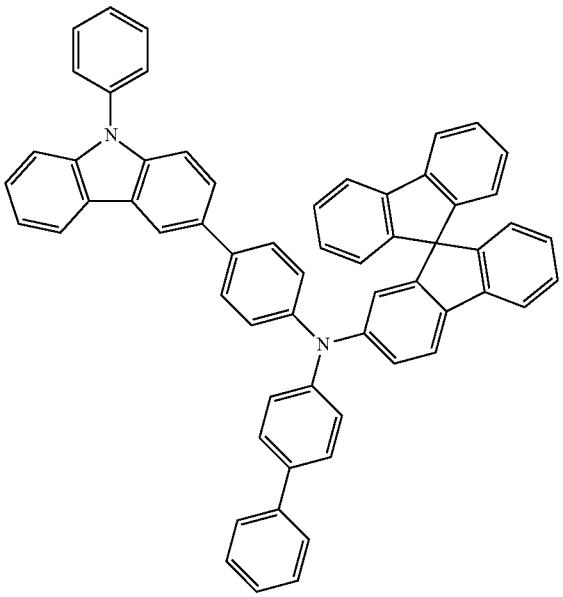

HT7
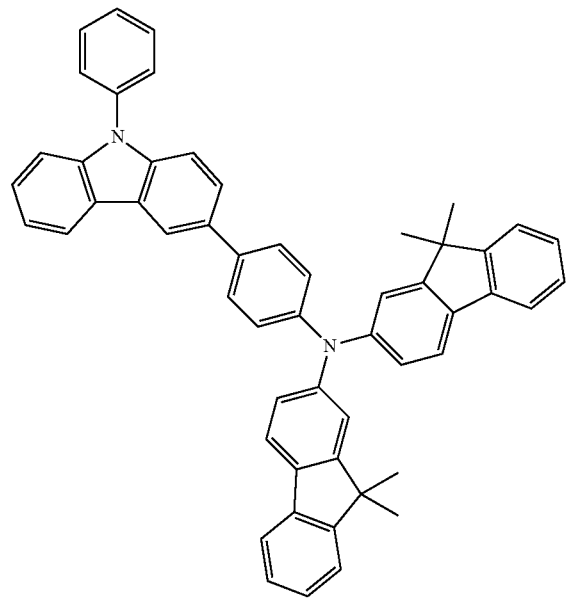
HT9
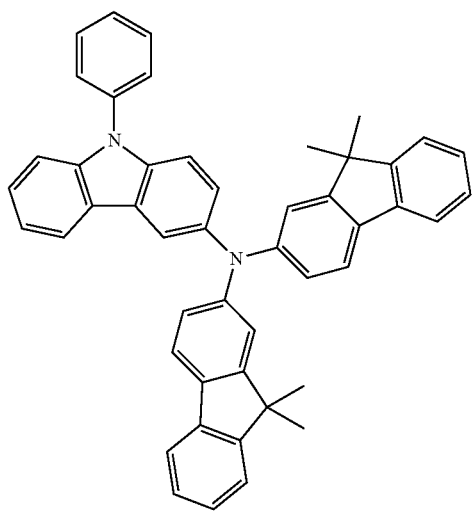
HT8
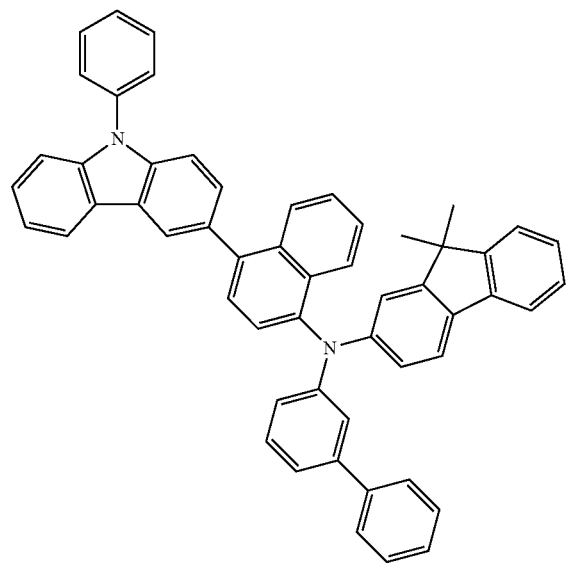
HT10
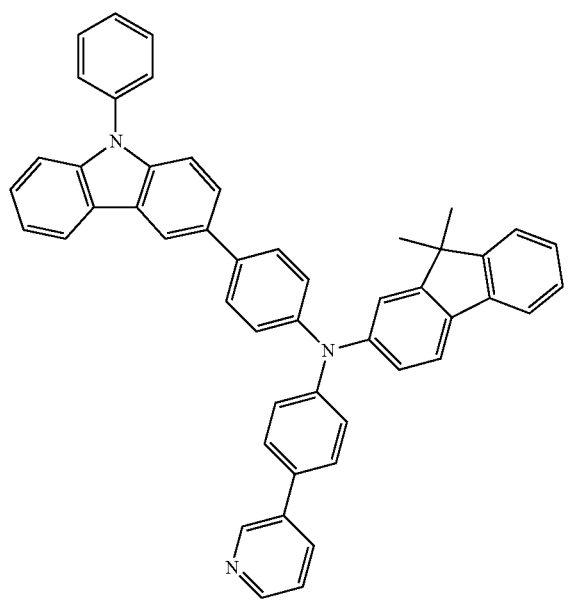

HT11
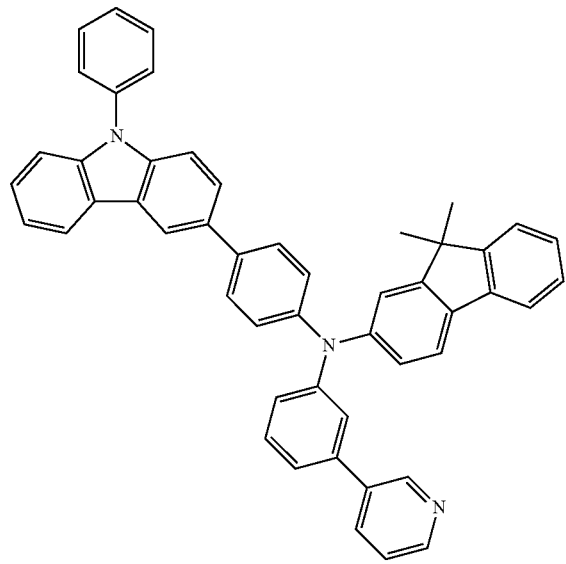
HT14
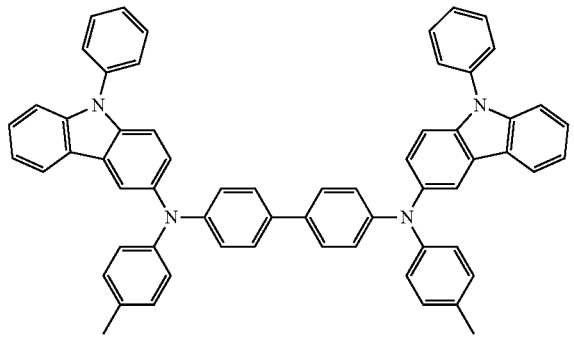
HT15
HT12
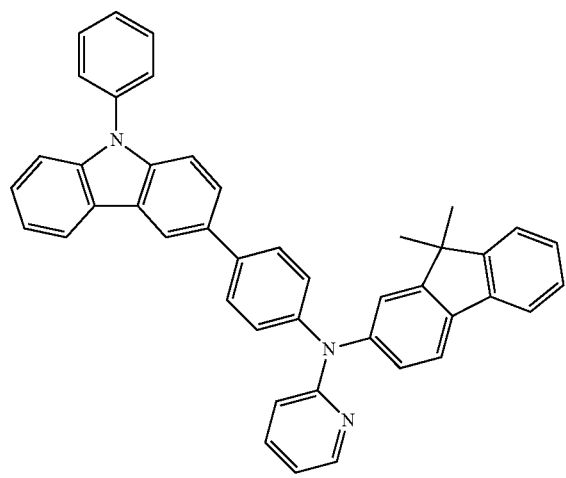
HT16
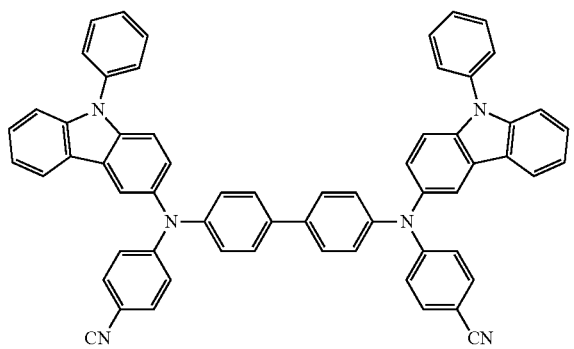
HT13
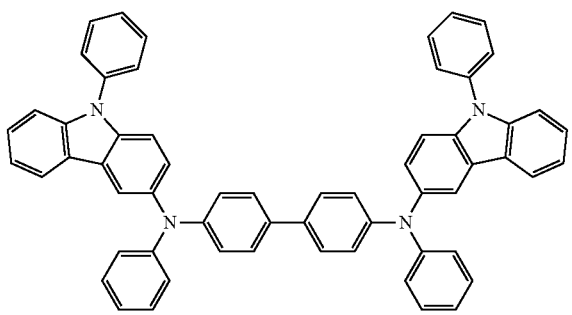
HT17
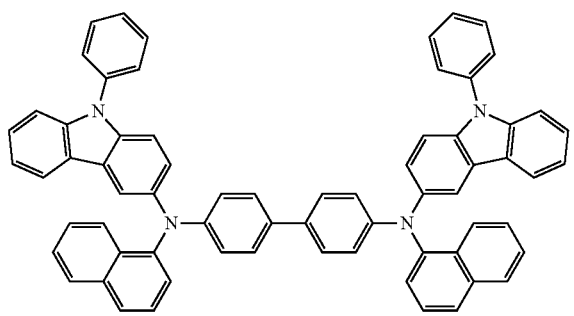

-continued

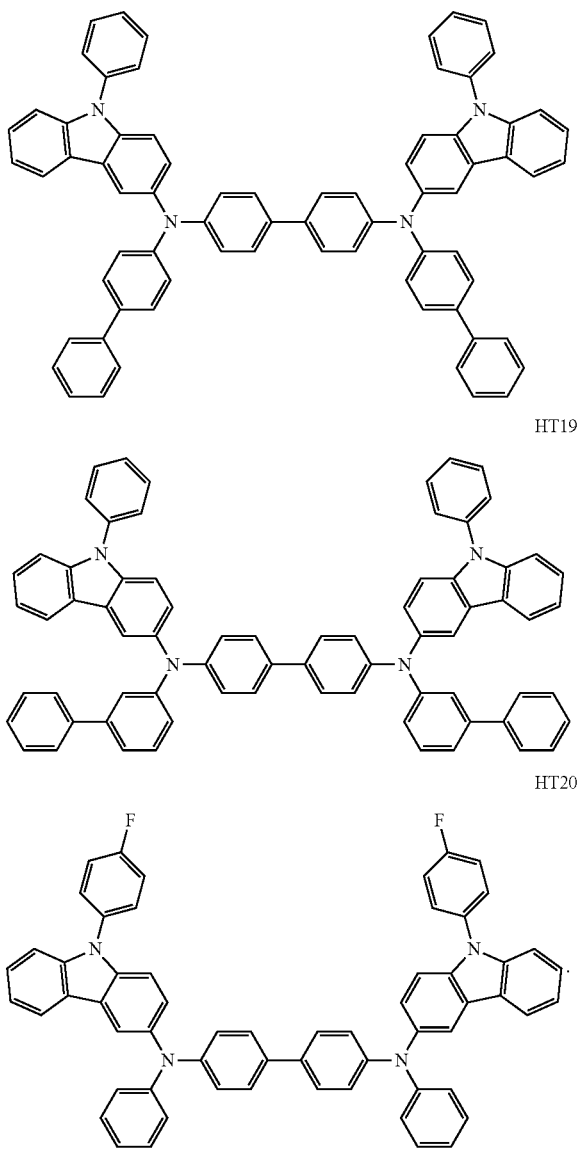

The thickness of the hole transport region may be from about 100 Å to about 10,000 Å, and in some embodiments, from about 100 Å to about 1,000 Å. When the hole transport region includes a HIL and a HTL, a thickness of the HIL may be from about 100 Å to about 10,000 Å, and in some embodiments, from about 100 Å to about 1,000 Å, and a thickness of the HTL may be from about 50 Å to about 2,000 Å, and in some embodiments, from about 100 Å to about 1,500 Å. When the thicknesses of the hole transport region, the HIL, and the HTL are within any of these ranges, satisfactory hole transport characteristics may be obtained without a substantial increase in driving voltage.

The hole transport region may further include a charge-generating material to improve conductivity, in addition to the materials described above. The charge-generating material may be homogeneously or inhomogeneously dispersed in the hole transport region.

The charge-generating material may be, for example, a p-dopant. The p-dopant may be selected from quinone derivatives, metal oxides, and cyano group-containing compounds, but is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-TCNQ), and/or the like; metal oxides such as tungsten oxide, molybdenum oxide, and/or the like; and Compound HT-D1.

The hole transport region may further include at least one of a buffer layer (BL) and an EBL, in addition to the HIL and HTL described above. The buffer layer may compensate for an optical resonance distance of light according to a wavelength of the light emitted from the EML, and thus may improve light-emission efficiency. A material in the buffer layer may be any material used in the hole transport region. The EBL may block migration of electrons from the electron transport region into EML.

The EML may be formed on the first electrode 110 or the hole transport region by using one or more suitable methods, for example, by using vacuum deposition, spin coating, casting, Langmuir-Blodgett (LB) deposition, inkjet printing, laser printing, laser induced thermal imaging (LITI), and/or the like. When the EML is formed using vacuum deposition and/or spin coating, the deposition and coating conditions for forming the EML may be similar to the above-described deposition and coating conditions for forming the HIL.

When the organic light-emitting device 10 is a full color organic light-emitting device, the EML may be patterned into a red emission layer, a green emission layer, and a blue emission layer to correspond to individual subpixels, respectively. In some embodiments, the EML may have a structure in which a red emission layer, a green emission layer and a blue emission layer are stacked upon one another, or a structure including a mixture of a red light-emitting material, a green light-emitting material, and a blue light-emitting material without separation of layers for the different color emission, and thus may emit white light.

The EML may include a host and a dopant.

The host may include at least one selected from TPBi, TBADN, ADN (herein also referred to as "DNA"), CBP, CDBP, and TCP.

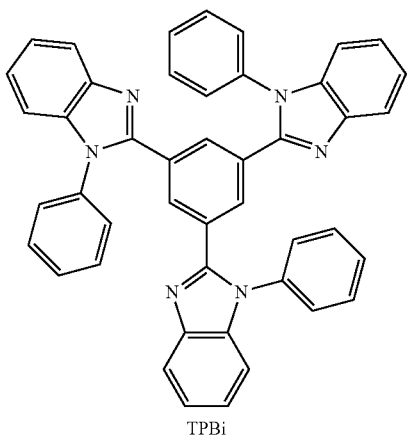

TPBi

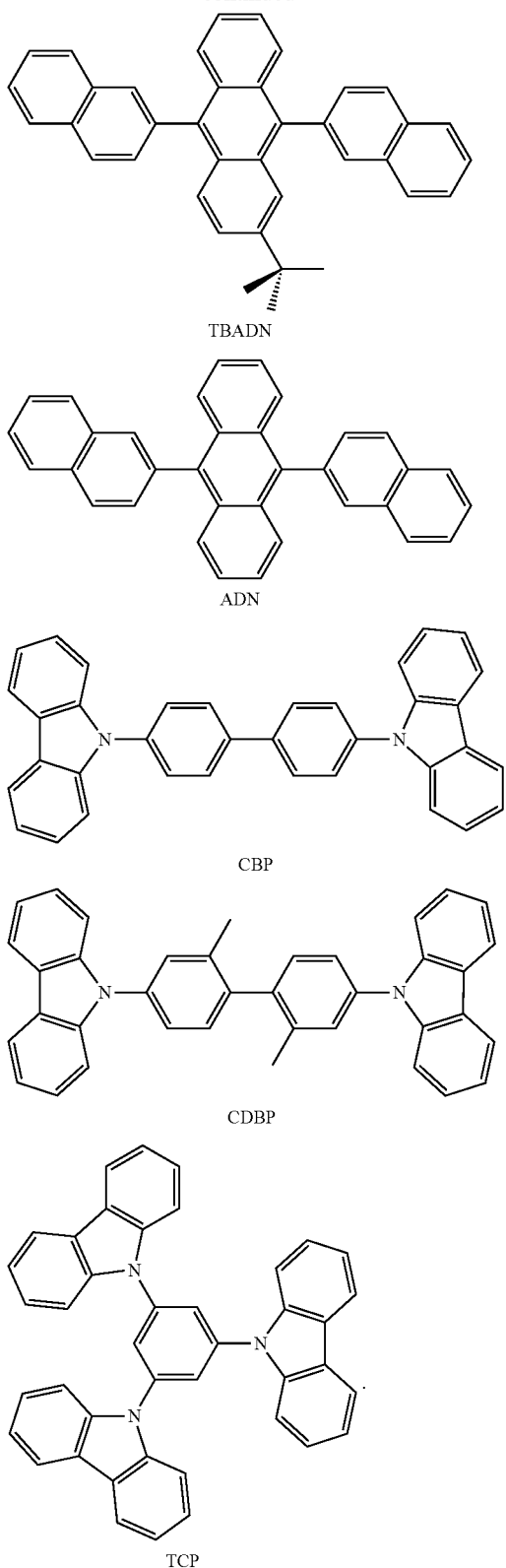

TBADN

ADN

CBP

CDBP

TCP

For example, the host may include a compound represented by Formula 301.

$$Ar_{301}\text{-}[(L_{301})_{xb1}\text{-}R_{301}]_{xb2}. \quad \text{Formula 301}$$

In Formula 301, $Ar_{301}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), where $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{301}$ may be defined the same as $L_{201}$ described herein;

$R_{301}$ may be selected from:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and
xb2 may be selected from 1, 2, 3, and 4.

For example, in Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and $R_{301}$ may be selected from:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group. However, embodiments of the present disclosure are not limited thereto.

The compound represented by Formula 301 may include, but is not limited to, at least one selected from Compound H1 to H42.

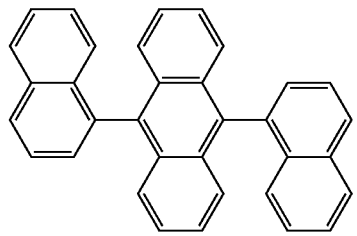

H1

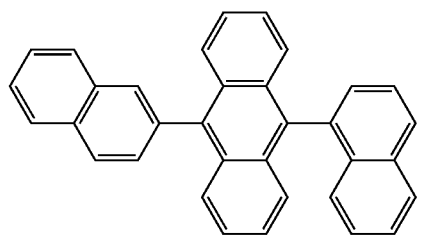

H2

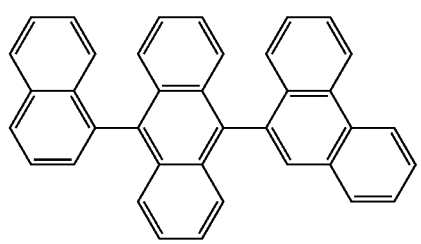

H3

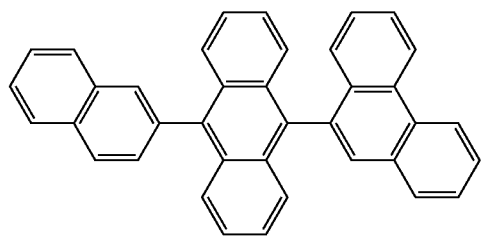

H4

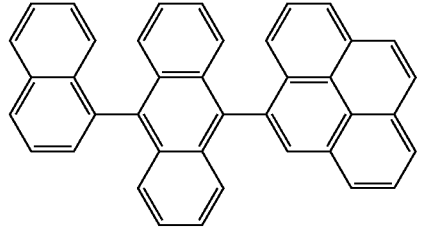

H5

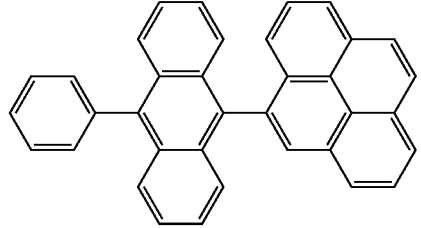

H6

-continued
H7
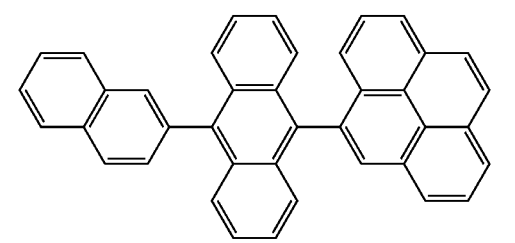
H8
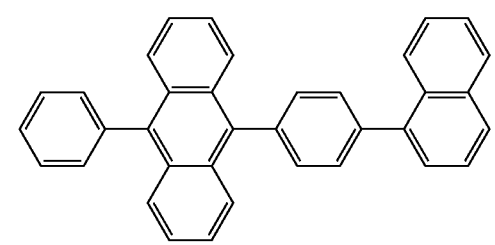
H9
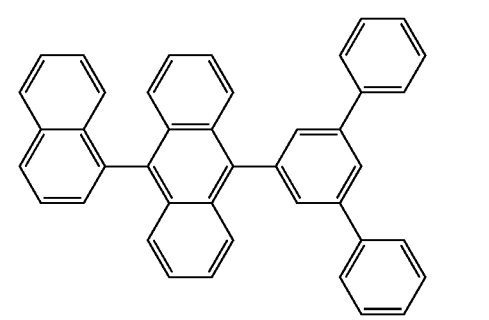
H10
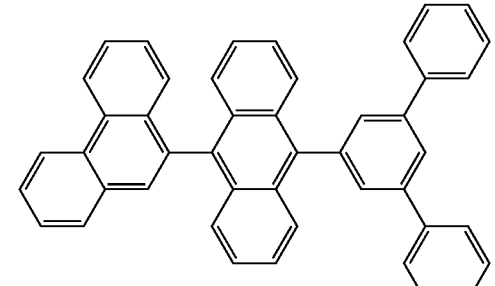
H11
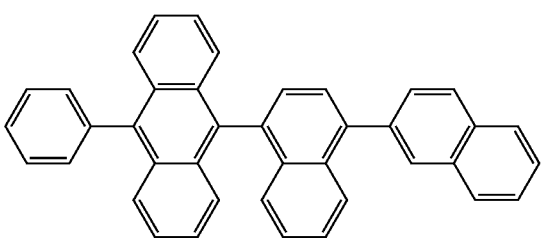
H12
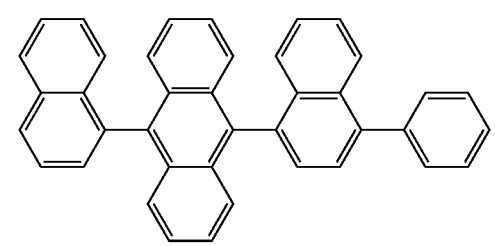
-continued
H13
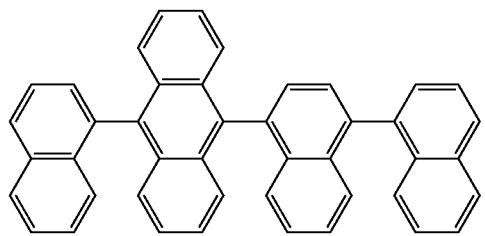
H14
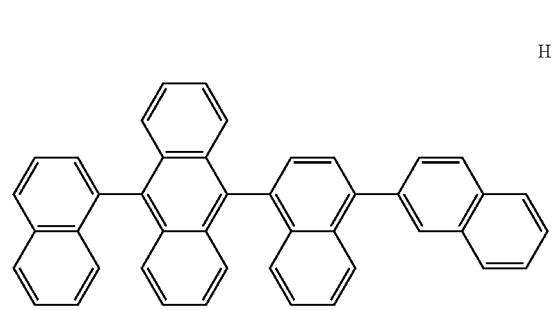
H15
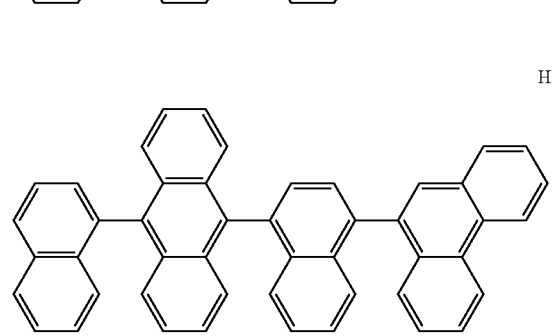
H16
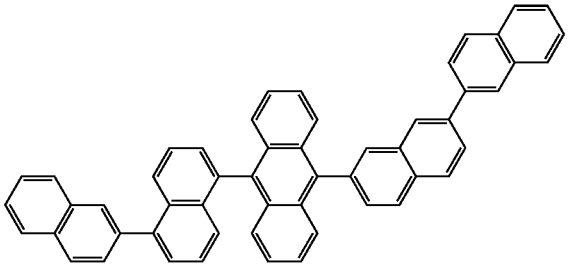
H17
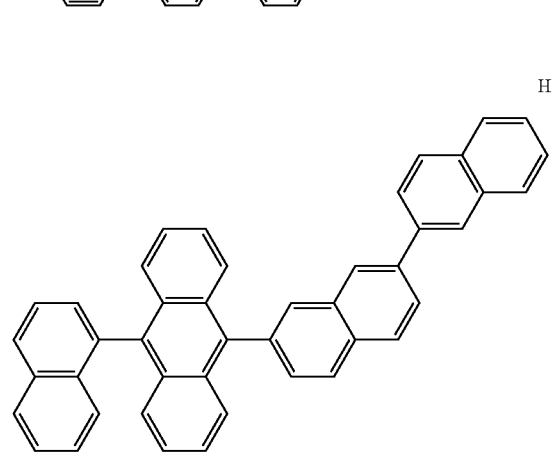

H18
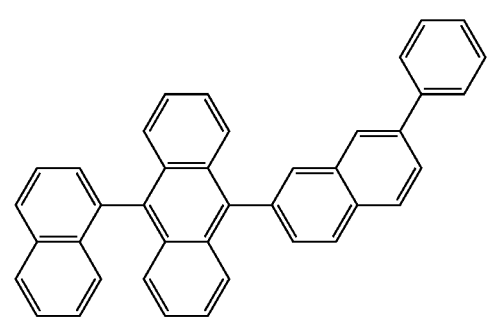
H19
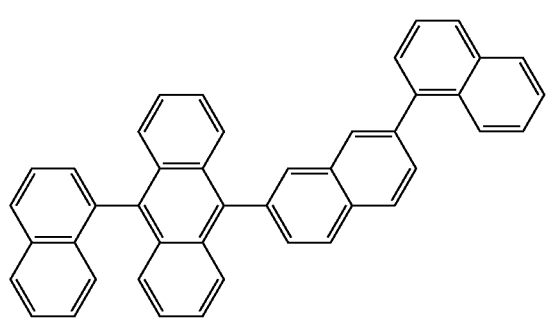
H20
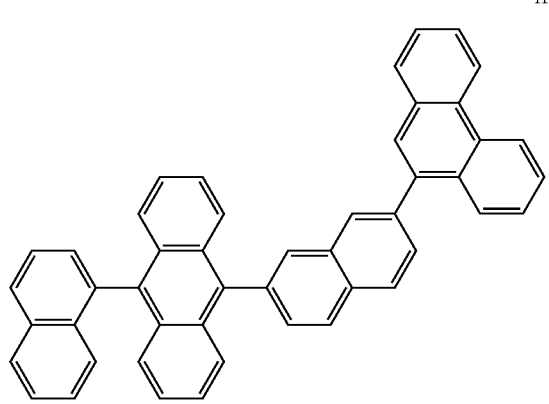
H21
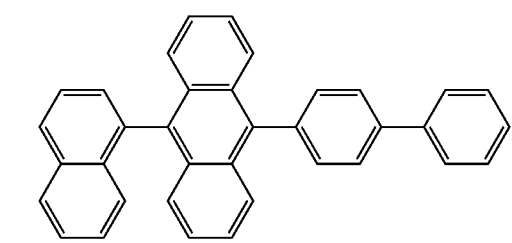
H22
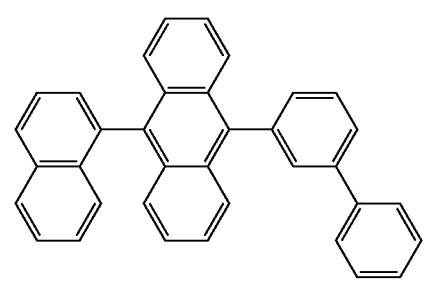
H23
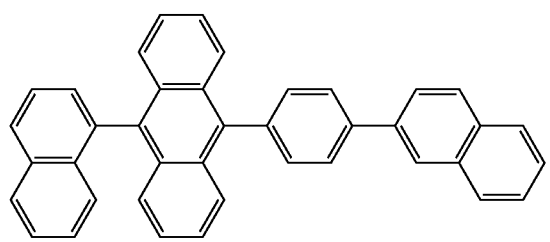
H24
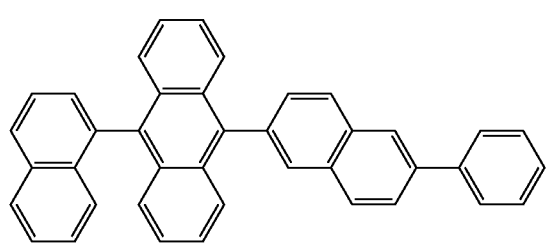
H25
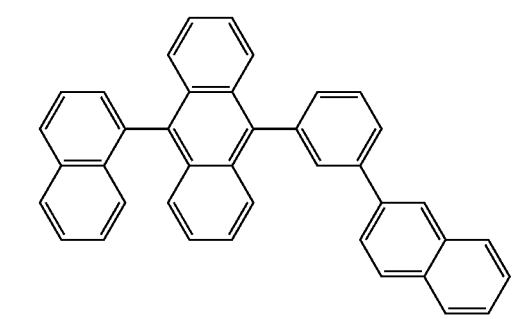
H26
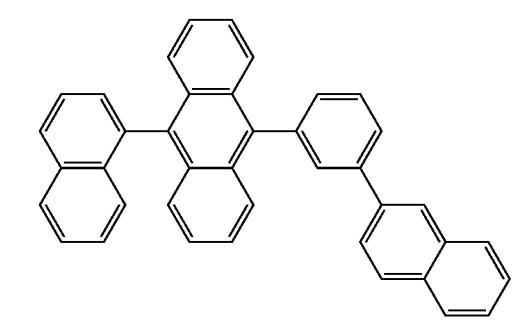
H27
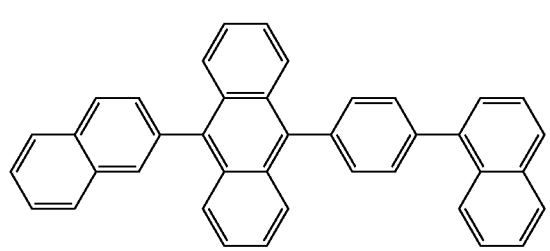

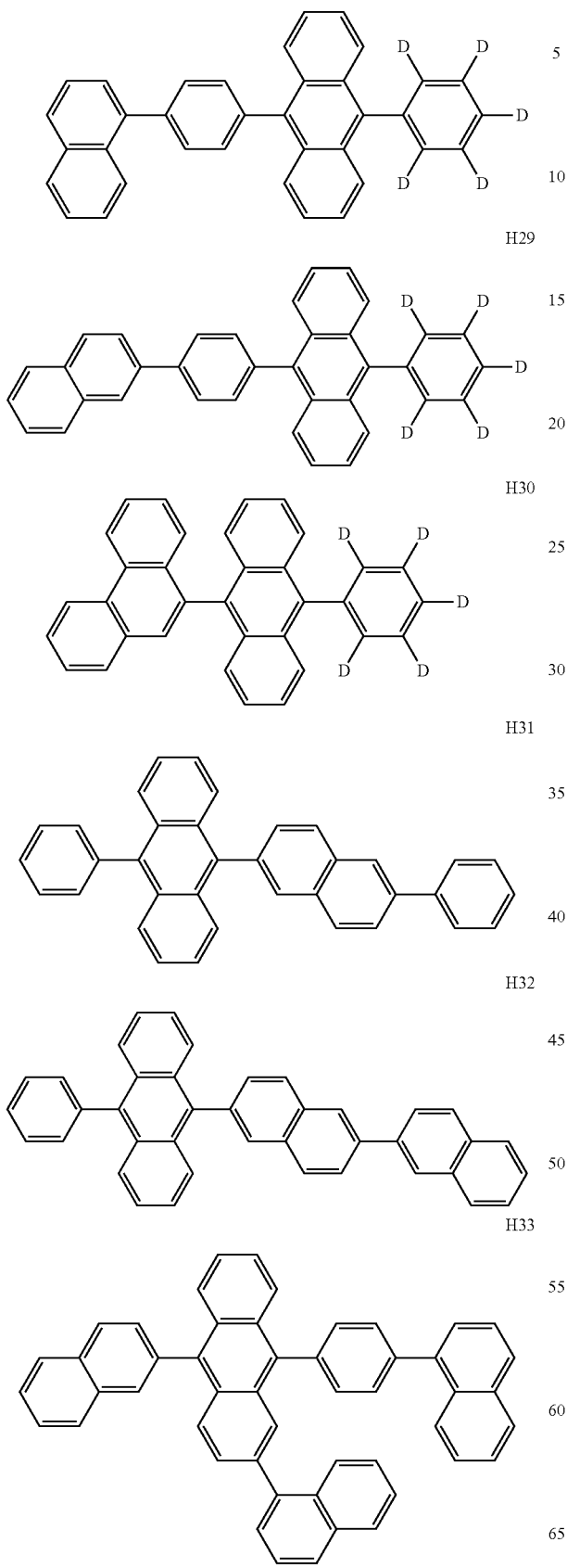
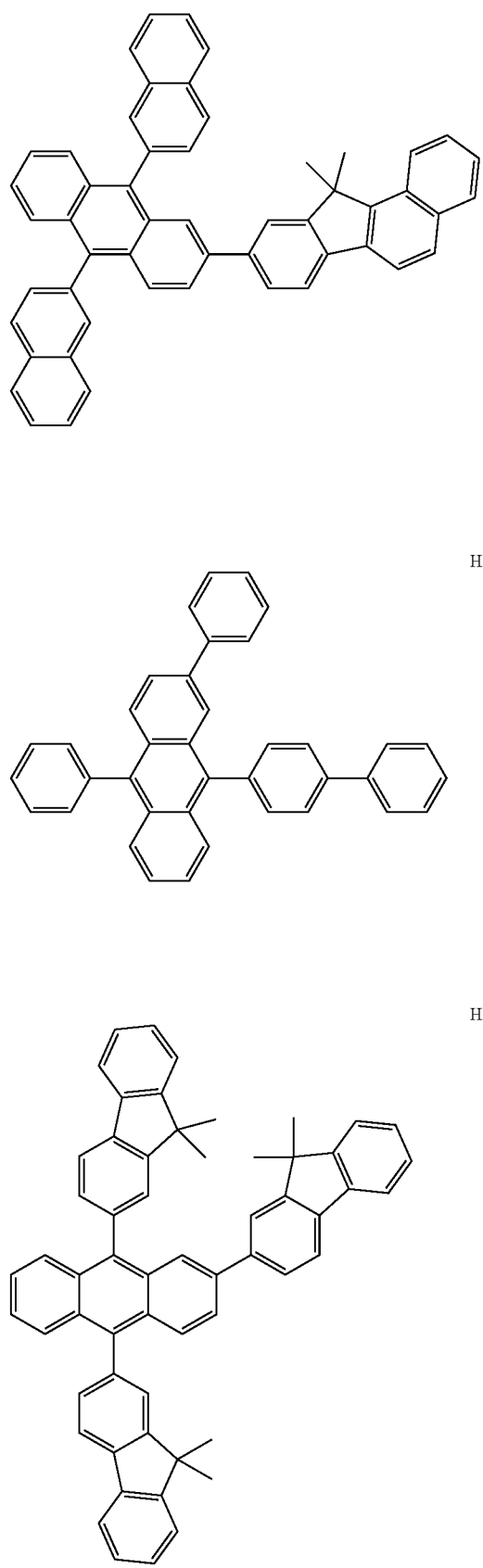

H37
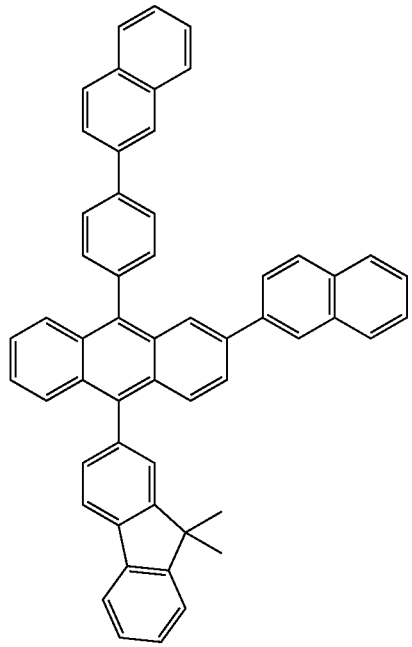
H38
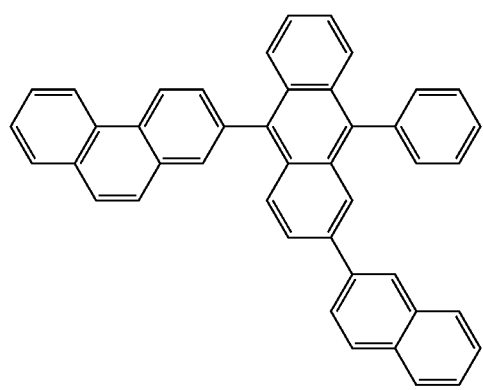
H39
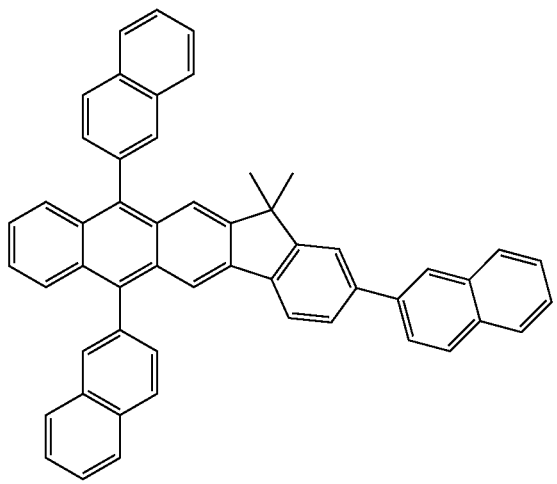
H40
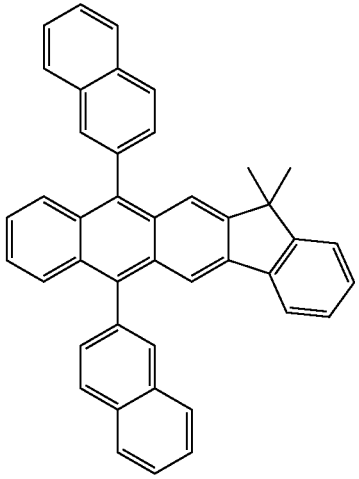
H41
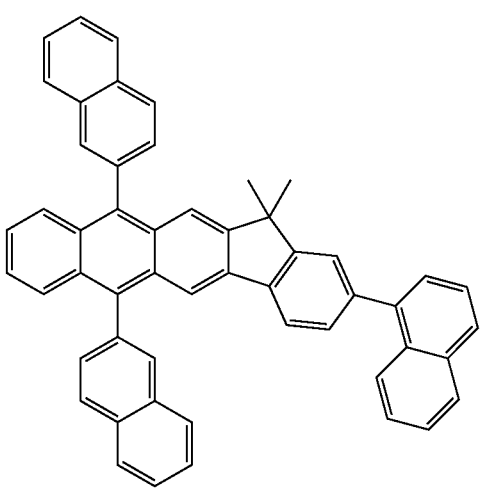
H42
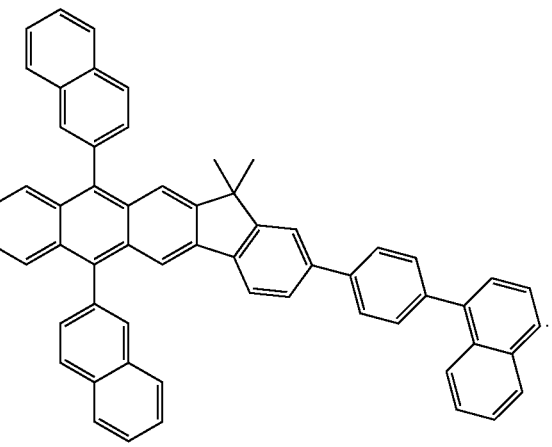
For example, the host may include, but is not limited to, at least one selected from compound H43 to H49.

H43
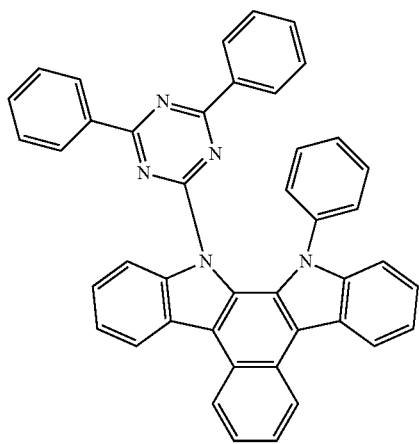
H44
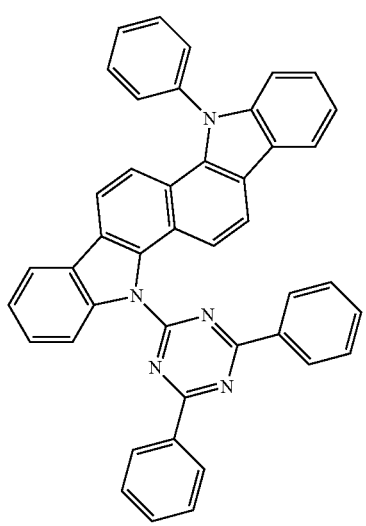
H45
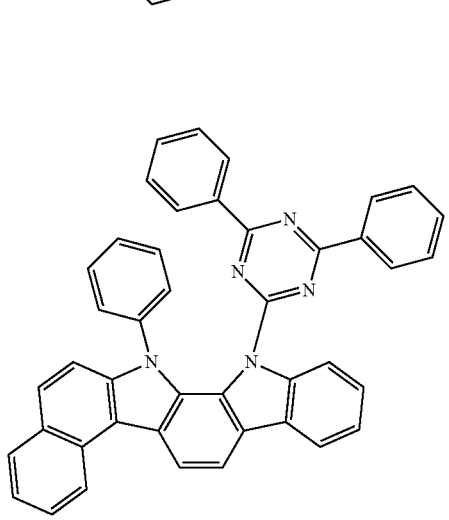
H46
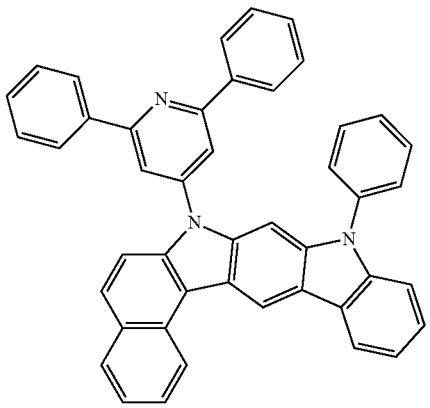
H47
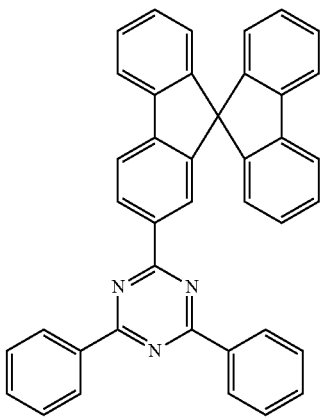
H48
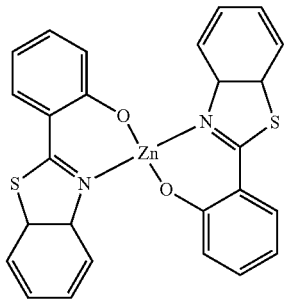
H49
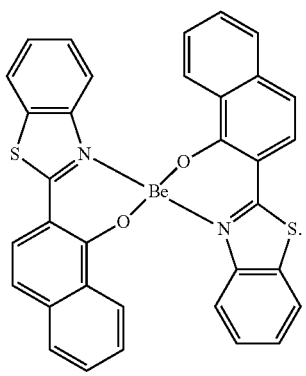
The dopant may further include at least one of a fluorescent dopant and a phosphorescent dopant.
The phosphorescent dopant may include an organometallic complex represented by Formula 401.

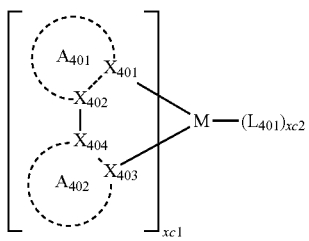

Formula 401

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently a nitrogen atom (—N—) or a carbon atom (—C—);

$A_{401}$ ring and $A_{402}$ ring may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_{10}$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$), a $C_3$-$C_{10}$ cycloalkyl group, a $C_1$-$C_{10}$ heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$), —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be 1, 2, or 3; and xc2 may be 0, 1, 2, or 3, where $Q_{401}$ to $Q_{407}$, $Q_{411}$ to $Q_{417}$, and $Q_{421}$ to $Q_{427}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group, For example, $L_{401}$ may be a monovalent, divalent, or trivalent organic ligand. For example, $L_{401}$ may be selected from a halogen ligand (for example, a Cl or F), a diketone ligand (for example, acetylacetonate, 1,3-diphenyl-1,3-propanedionate, 2,2,6,6-tetramethyl-3,5-heptanedionate, or hexafluoroacetonate), a carboxylic acid ligand (for example, picolinate, dimethyl-3-pyrazole carboxylate, or benzoate), a carbon monoxide ligand, an isonitrile ligand, a cyano ligand, and a phosphorous ligand (for example, phosphine or phosphite), but is not limited thereto.

When $A_{401}$ in Formula 401 has at least two substituents, the at least two substituents of $A_{401}$ may be linked to each other to form a saturated or unsaturated ring.

When $A_{402}$ in Formula 401 has at least two substituents, the at least two substituents of $A_{402}$ may be linked to each other to form a saturated or unsaturated ring.

When xc1 in Formula 401 is 2 or greater, the plurality of ligands in Formula 401, represented by

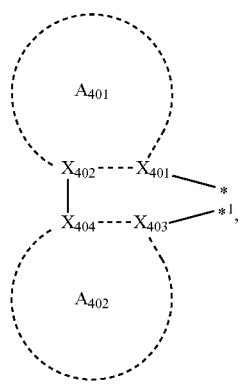

may be identical to or different from each other. When xc1 in Formula 401 is 2 or greater, $A_{401}$ and/or $A_{402}$ of one ligand may be respectively linked to $A_{401}$ and/or $A_{402}$ of another adjacent ligand directly (e.g., via a single bond) or via a linker or linking group (for example, a $C_1$-$C_5$ alkylene group, —N(R')— (where R' is a $C_1$-$C_{10}$ alkyl group or a $C_6$-$C_{20}$ aryl group), and/or —C(=O)—).

In some embodiments, the phosphorescent dopant may include at least one selected from Compounds PD1 to PD74, but is not limited thereto.

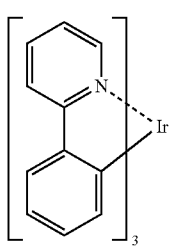

PD1

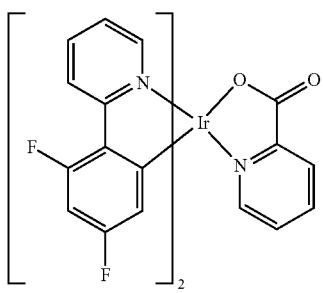

PD2

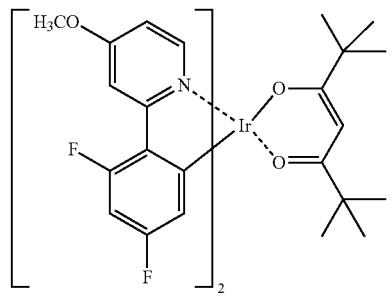

PD3

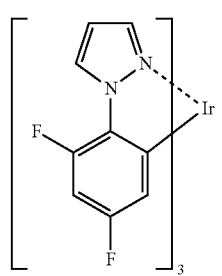

PD4

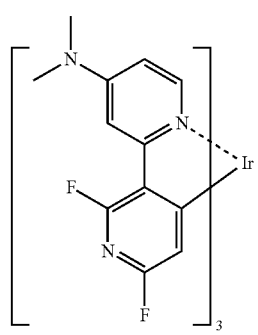

PD5

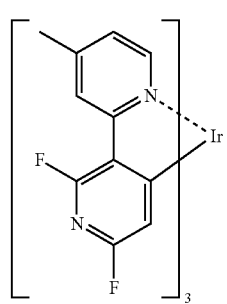

PD6

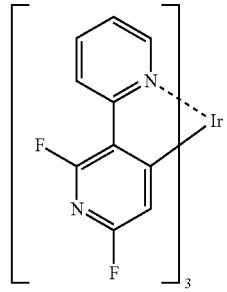

PD7

PD8 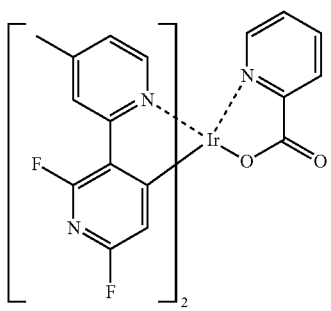
PD9 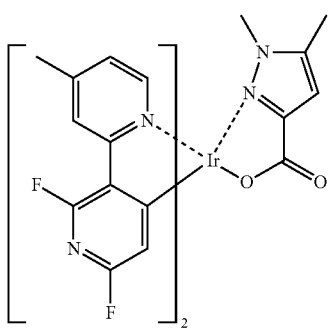
PD10 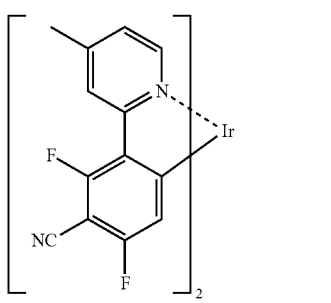
PD11 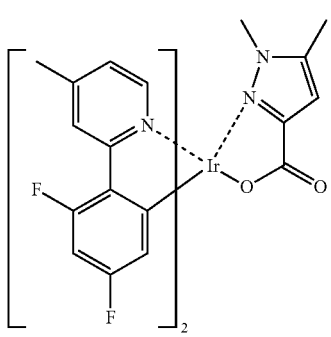
PD12 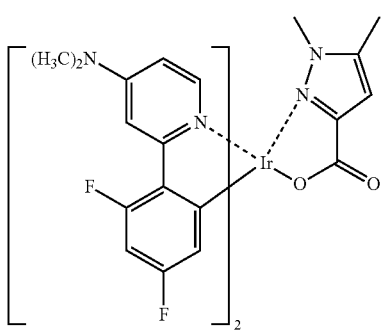
PD13 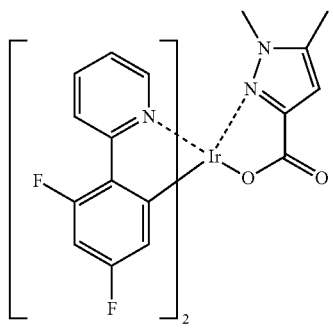
PD14 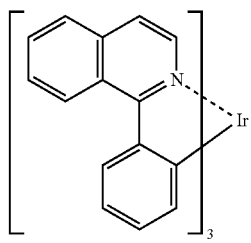
PD15 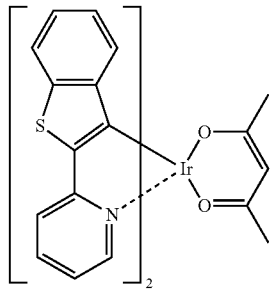
PD16 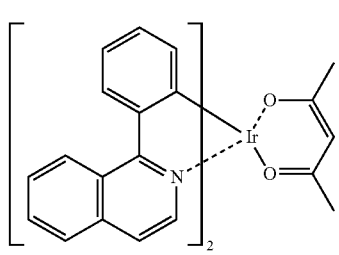
PD17 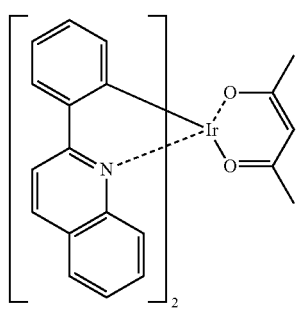

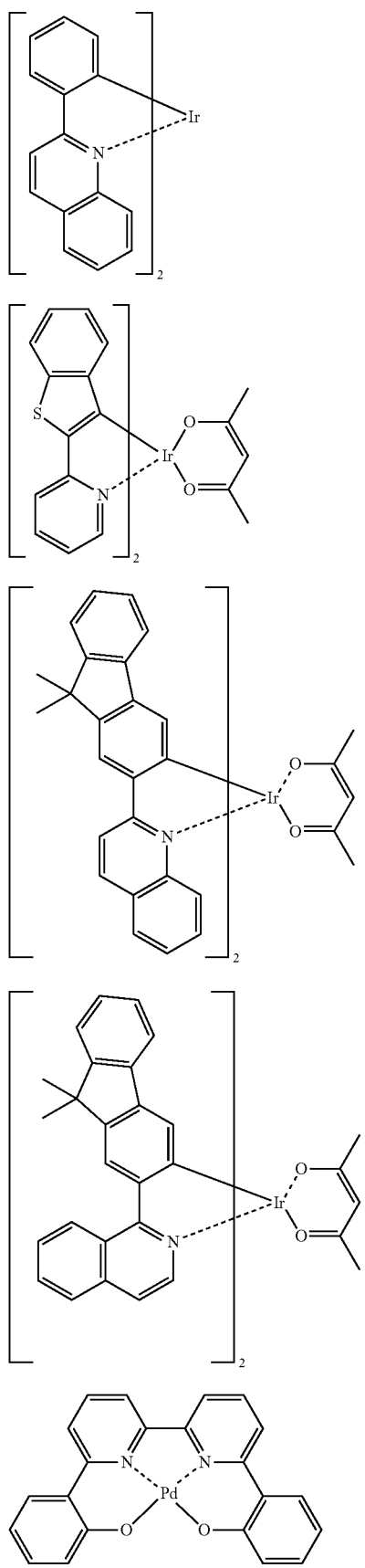
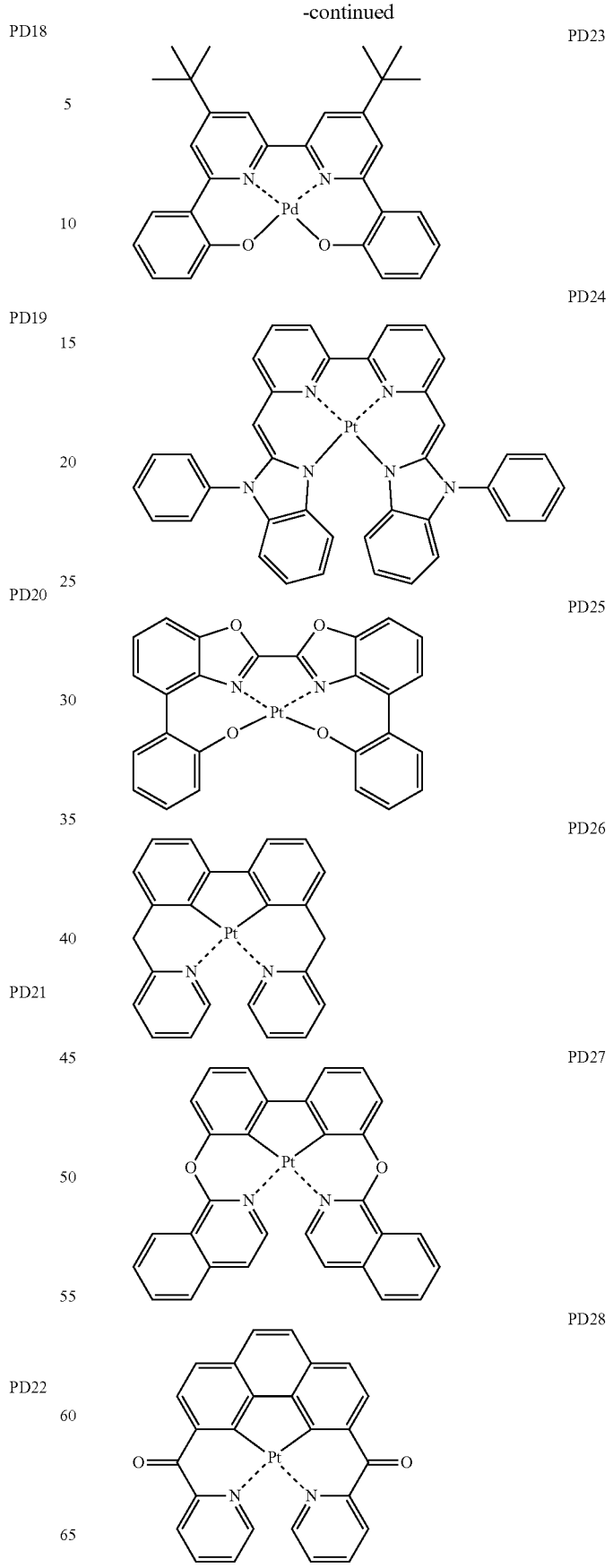

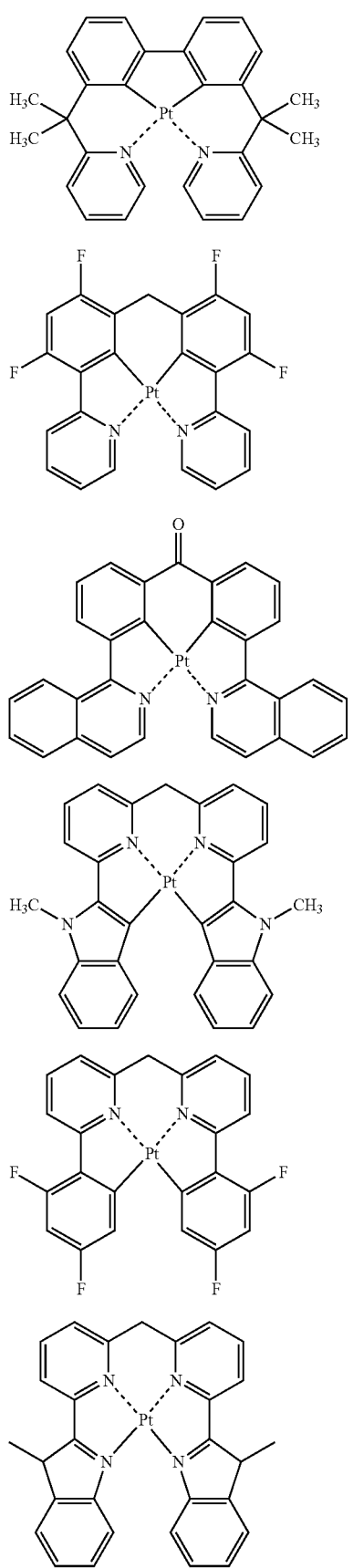
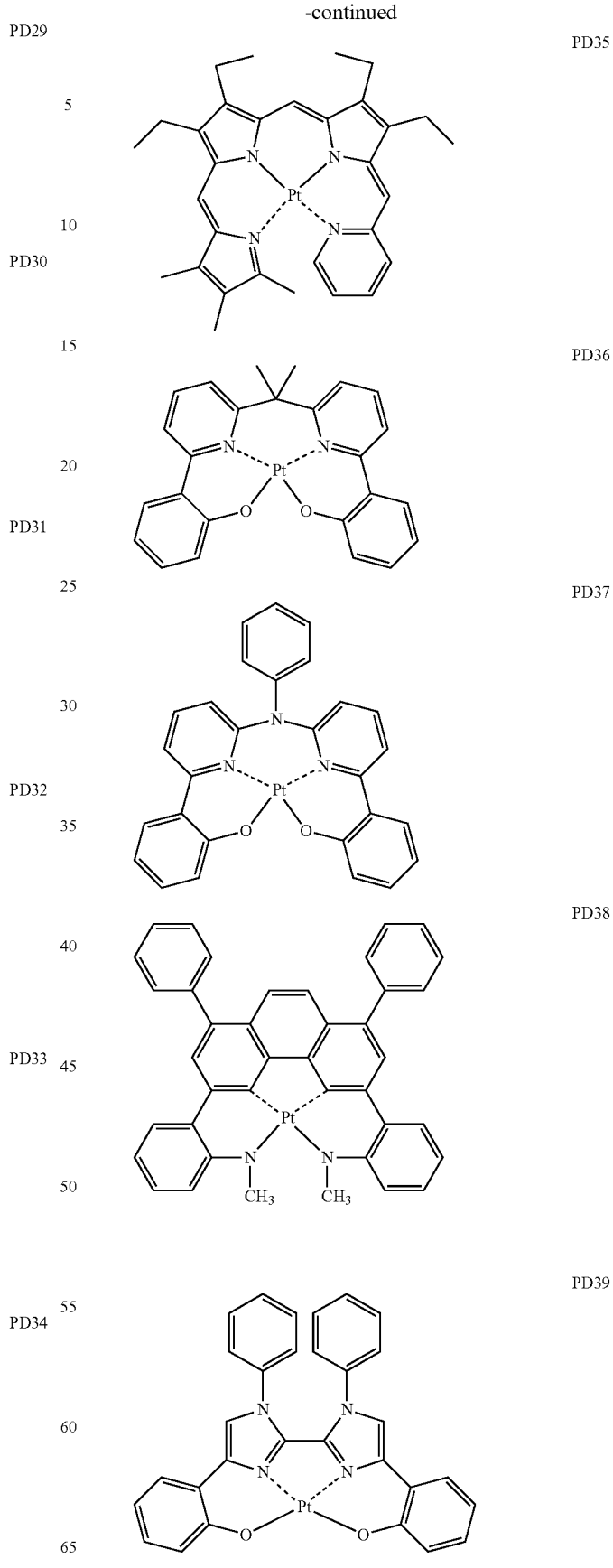

-continued
PD40
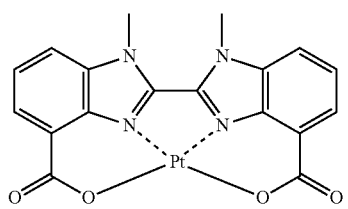
PD41
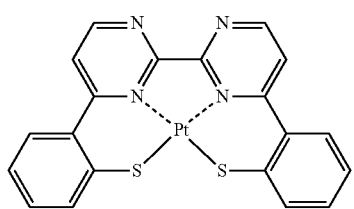
PD42
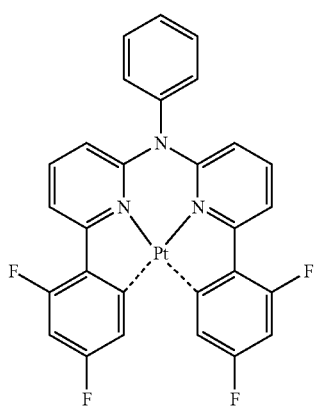
PD43
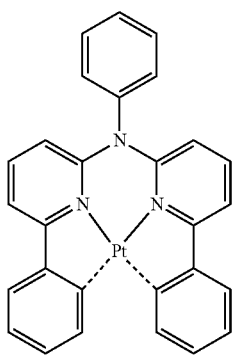
PD44
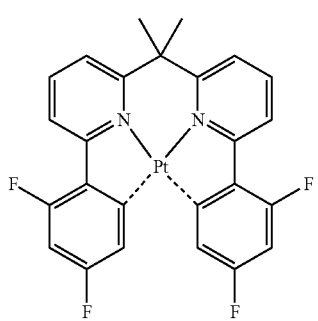
PD45
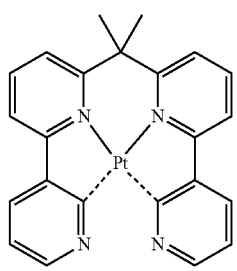
PD46
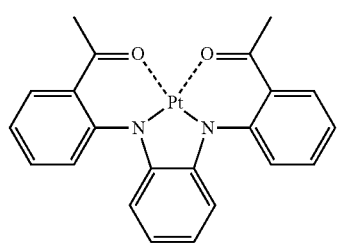
PD47
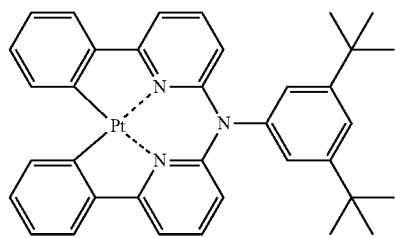
PD48
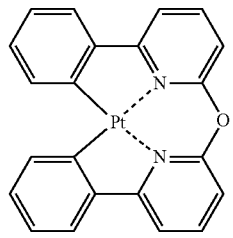
PD49
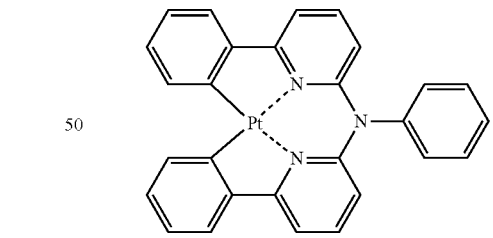
PD50
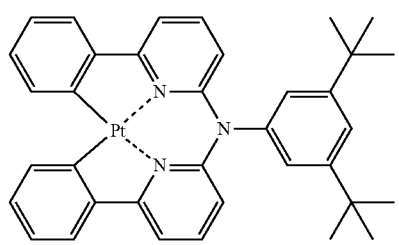

PD51 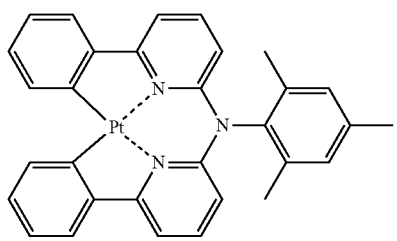
PD57 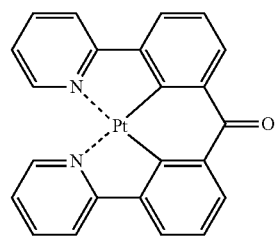
PD52 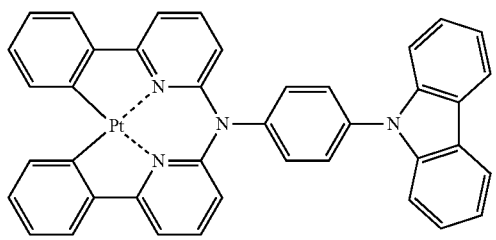
PD58 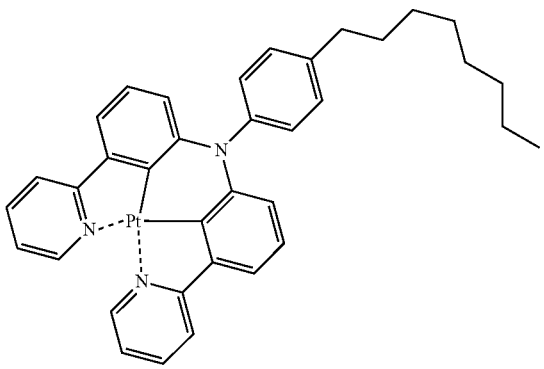
PD53 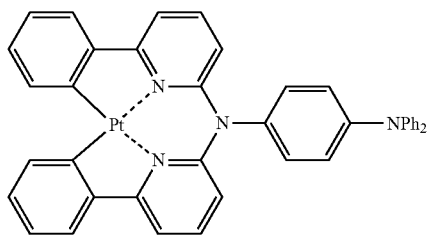
PD54 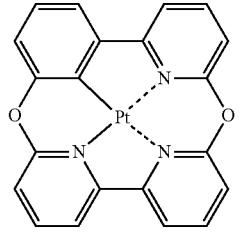 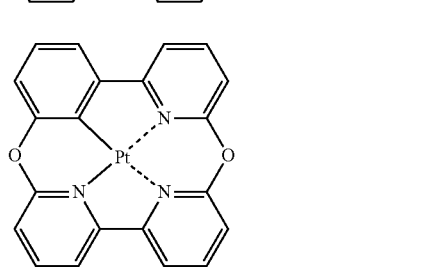
PD59 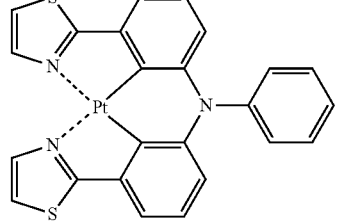
PD55 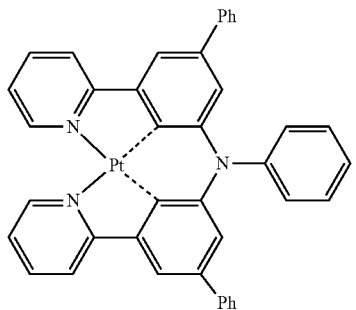
PD60 
PD56 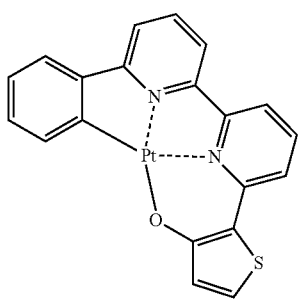
PD61 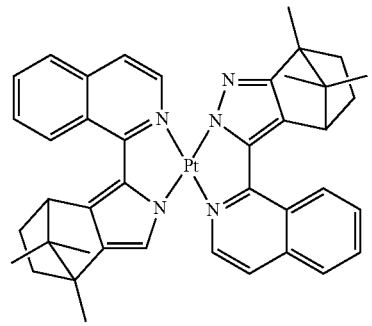

-continued
PD62
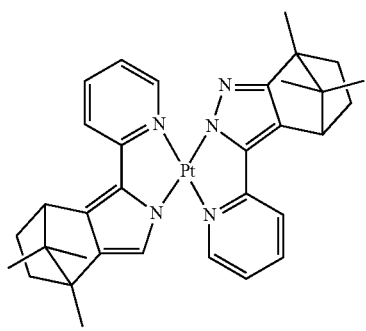
PD63
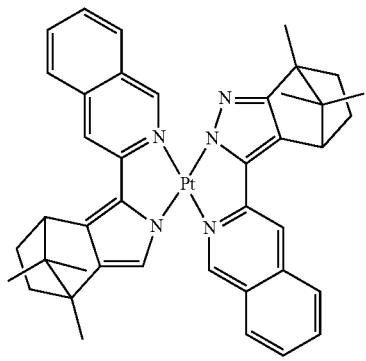
PD64
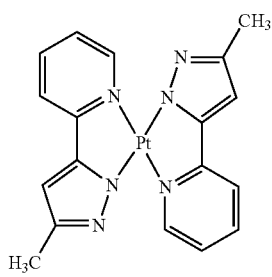
PD65
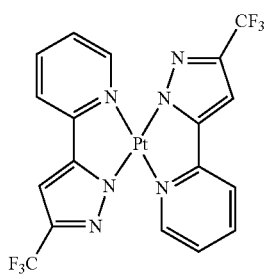
PD66
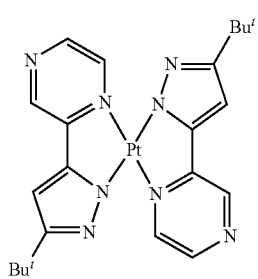
-continued
PD67
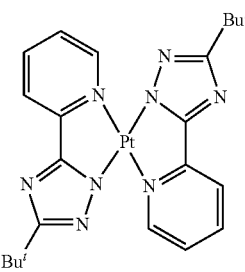
PD68
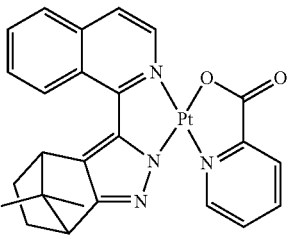
PD69
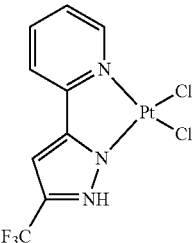
PD70
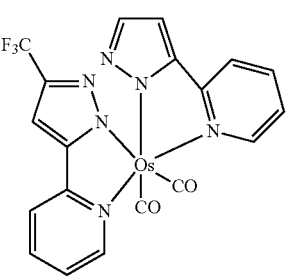
PD71
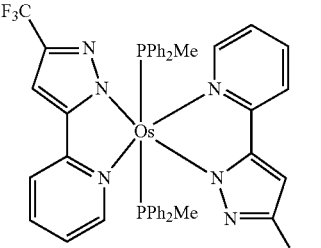
PD72
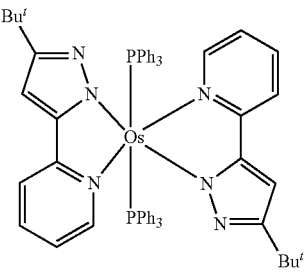

PD73
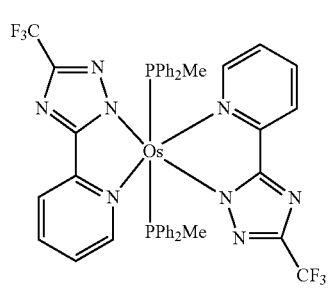
PD74
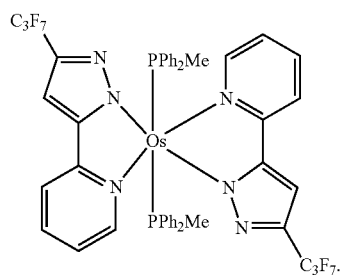
For example, the phosphorescent dopant may include PtOEP.
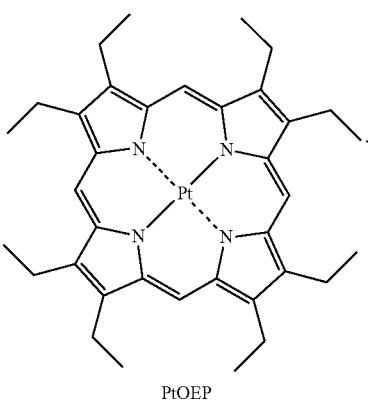
PtOEP
In some embodiments, the phosphorescent dopant may include at least one selected from DPVBi, DPAVBi, TBPe, DCM, DCJTB, Coumarin 6, and C545T.
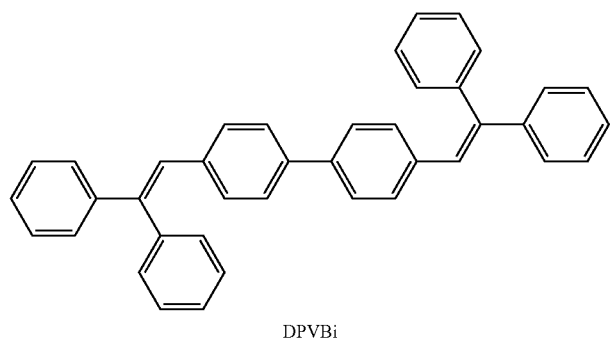
DPVBi
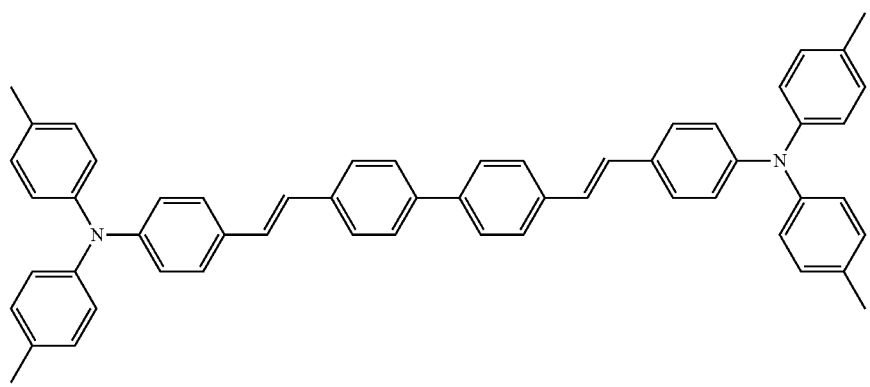
DPAVBi

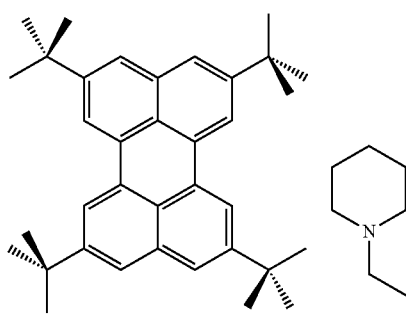
TBPe

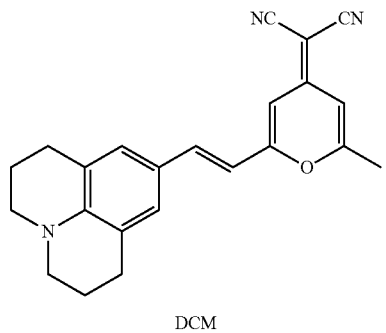
DCM

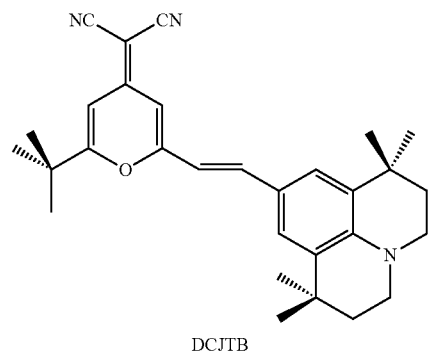
DCJTB

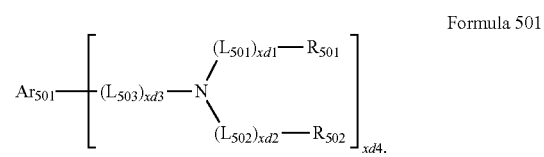

Coumarin 6

C545T

The fluorescent dopant may include a compound represented by Formula 501.

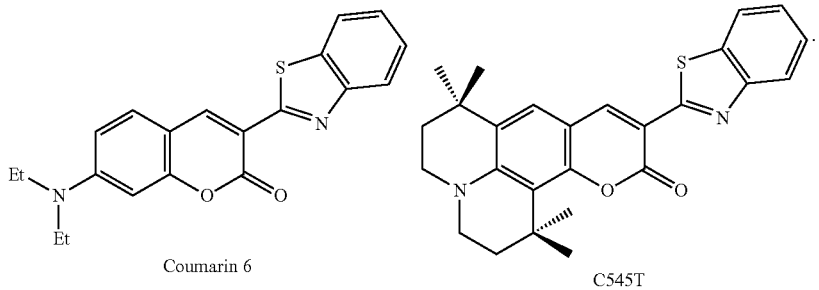
Formula 501

In Formula 501, $Ar_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$), where $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{501}$ to $L_{503}$ may be each independently defined the same as $L_{201}$ described herein;

$R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3; and xd4 may be selected from 1, 2, 3, and 4.

The fluorescent host may include at least one selected from Compounds FD1 to FD9.
FD1
FD2
FD3
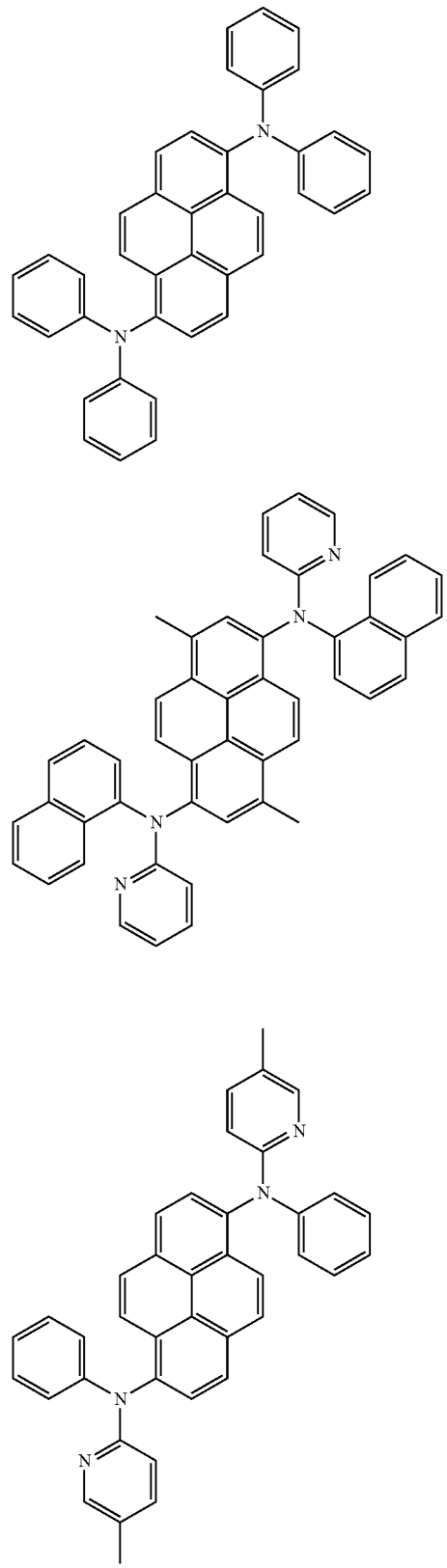
FD4
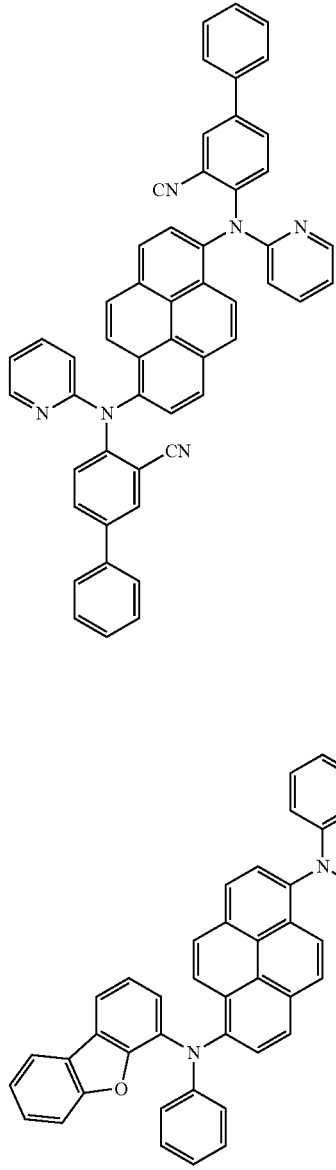
FD5
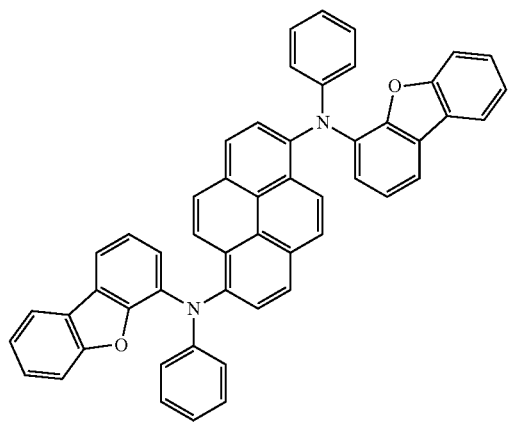
FD6
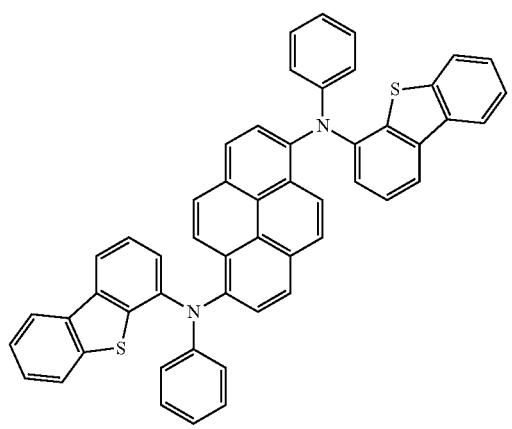

FD7

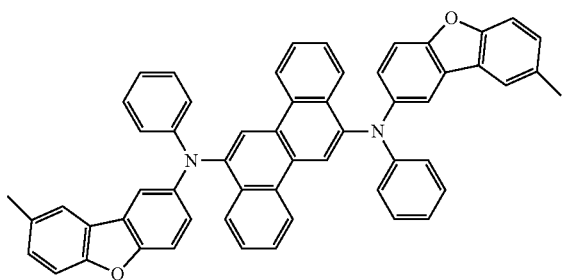

FD8

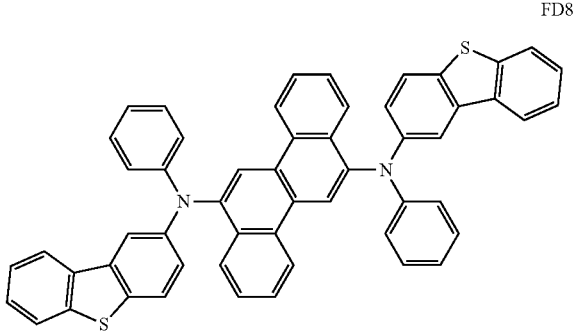

FD9

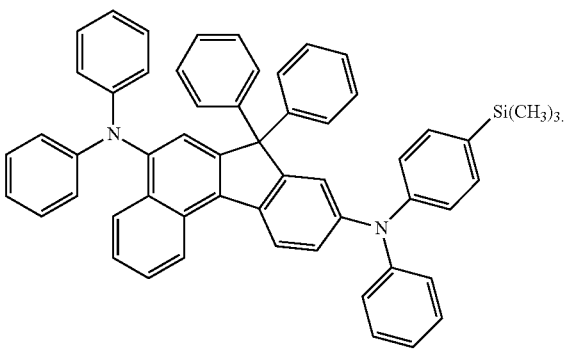

The amount of the dopant in the EML may be from about 0.01 parts to about 15 parts by weight based on 100 parts by weight of the host, but is not limited to this range.

The thickness of the EML may be about 100 Å to about 1000 Å, and in some embodiments, may be from about 200 Å to about 600 Å. When the thickness of the EML is within any of these ranges, the EML may have good light emitting ability without a substantial increase in driving voltage.

The electron transport region may be formed on the EML.

The electron transport region may include at least one selected from a hole blocking layer (HBL), an electron transport layer (ETL), and an electron injection layer (EIL). However, embodiments of the present disclosure are not limited thereto.

In some embodiments, the electron transport region may have a structure including an ETL/EIL or a HBL/ETL/EIL, wherein the layers forming the structure are sequentially stacked on the EML in the order stated above. However, embodiments of the present disclosure are not limited thereto.

The electron transport region may include an electron transport material represented by Formula 1. For example, the electron transport material represented by Formula 1 may be in the ETL of the electron transport region.

Formula 1

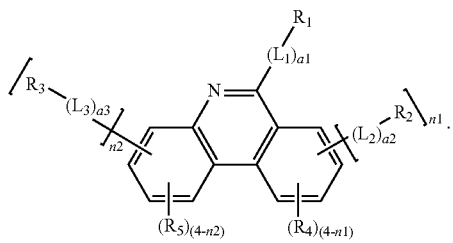

In Formula 1, $L_1$ to $L_3$ may be each independently selected from a substituted or unsubstituted $C_2$-$C_{10}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formula 1, $L_1$ to $L_3$ may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group. However, embodiments of the present disclosure are not limited thereto.

For example, in Formula 1, $L_1$ to $L_3$ may be each independently selected from:
a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, an acridinylene group, a phenanthrolinylene group, a benzoimidazolylene group, a benzofuranylene group, a benzothiophenylene group, a triazolylene group, a tetrazolylene group, a triazinylene group, a dibenzofuranylene group, and a dibenzothiophenylene group, and a phenylene group, a naphthylene group, a fluorenylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, an acridinylene group, a phenanthrolinylene group, a benzoimidazolylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an indazolyl group, a quinolinyl group, an isoquinolinyl group, a carbazolyl group, a benzoquinolinyl group, a phthalazinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group. However, embodiments of the present disclosure are not limited thereto.

In some embodiments, in Formula 1, $L_1$ to $L_3$ may be each independently selected from groups represented by Formulae 3-1 to 3-30.

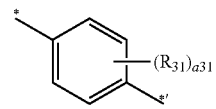

3-1

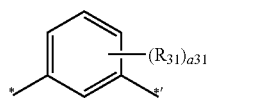
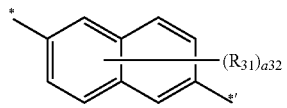
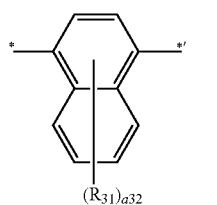
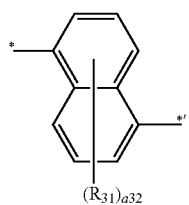
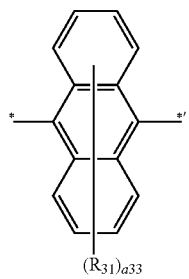
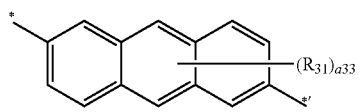
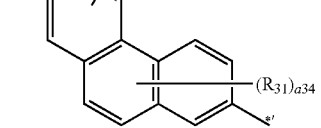
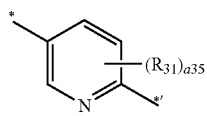
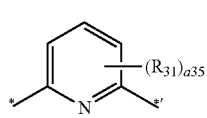
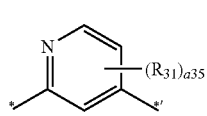
3-2
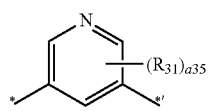
3-3
3-4
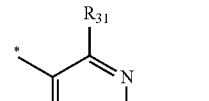
3-5
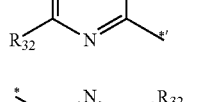
3-6
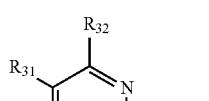
3-7
3-8
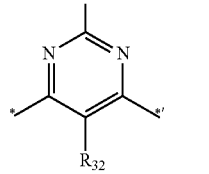
3-9
3-10
3-11
3-12
3-13
3-14
3-15
3-16
3-17
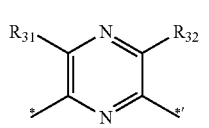
3-18
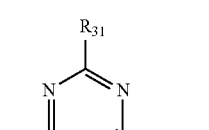
3-19
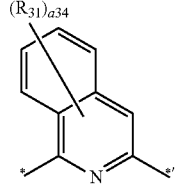
3-20
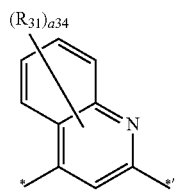

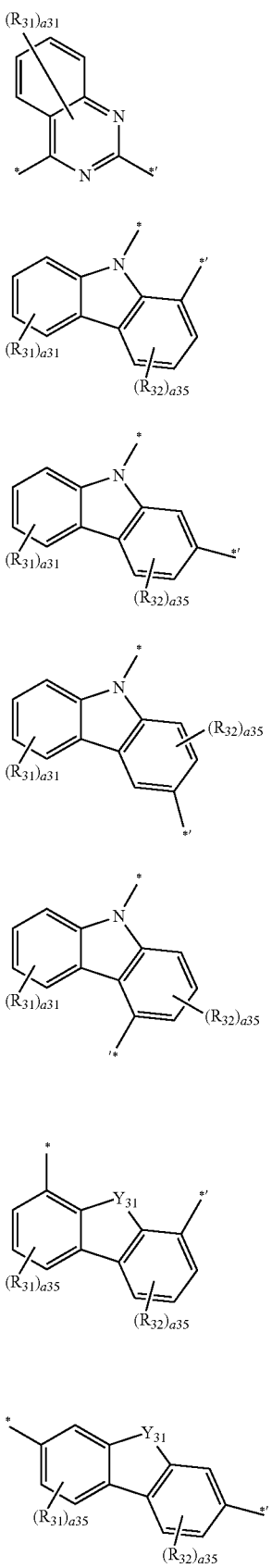

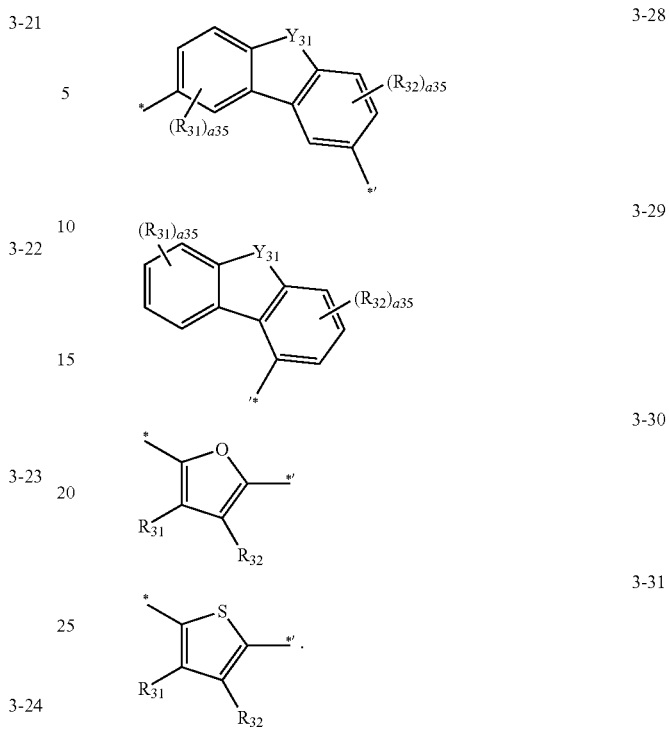

In Formulae 3-1 to 3-31, $Y_{31}$ may be selected from $C(R_{33})(R_{34})$, $N(R_{33})$, O, and S;

$R_{31}$ to $R_{34}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' may be each independently a binding site with an adjacent atom.

In some embodiments, in Formula 1, $L_1$ to $L_3$ may be each independently selected from groups represented by Formulae 4-1 to 4-56, but are not limited thereto.

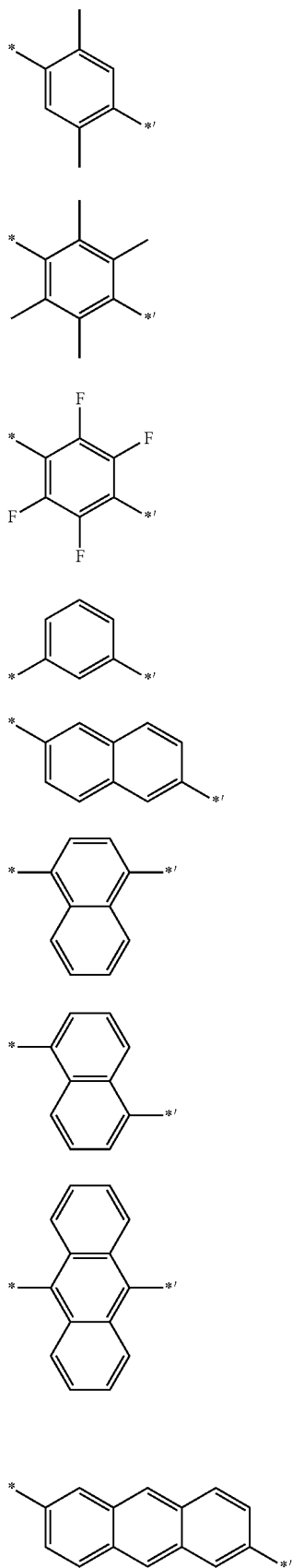
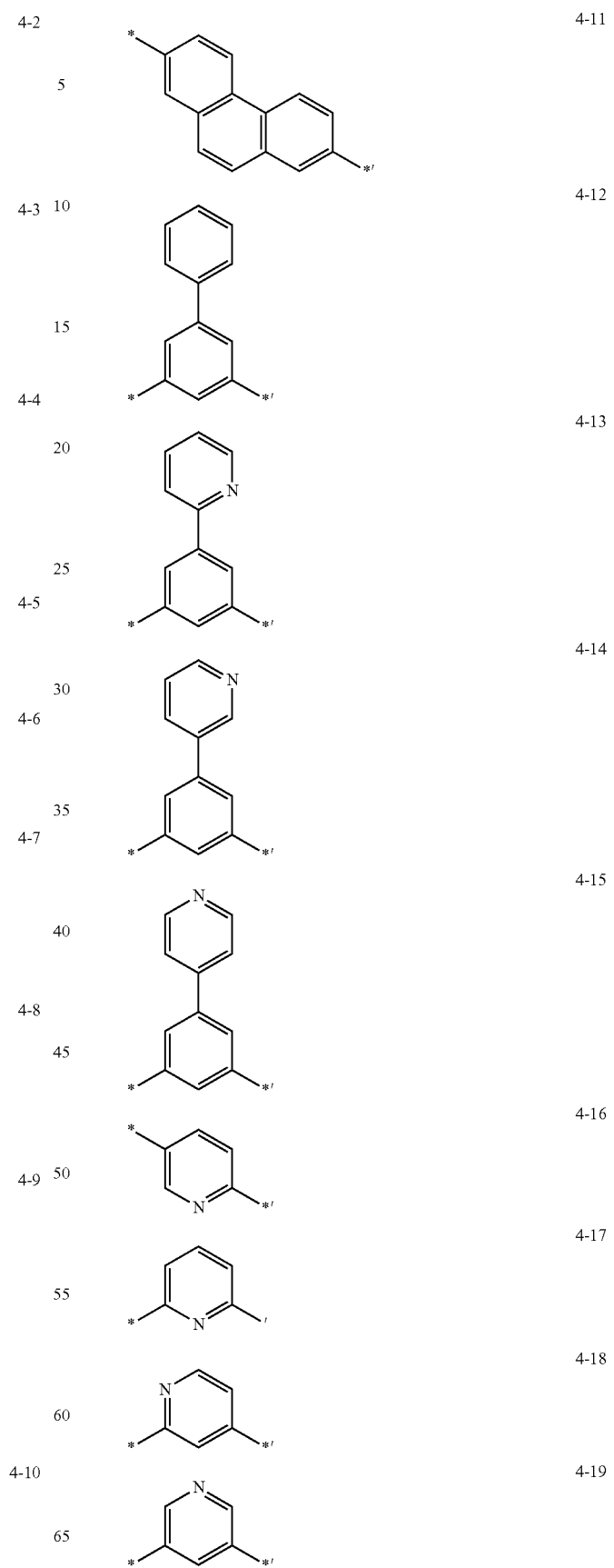

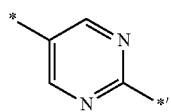
4-20
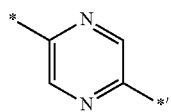
4-21
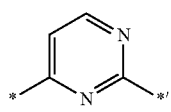
4-22
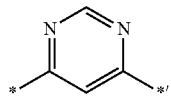
4-23
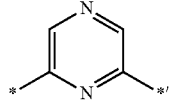
4-24
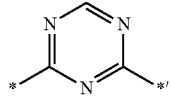
4-25
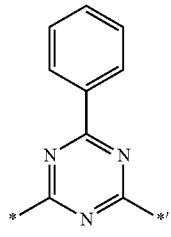
4-26
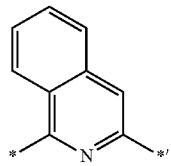
4-27
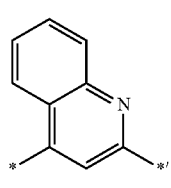
4-28
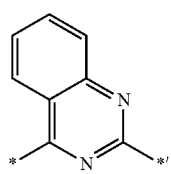
4-29
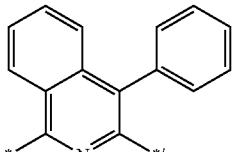
4-30
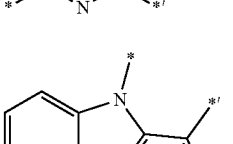
4-31
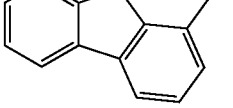
4-32
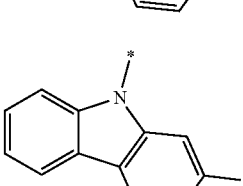
4-33
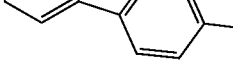
4-34
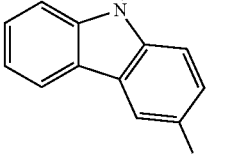
4-35
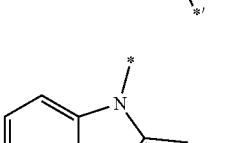
4-36
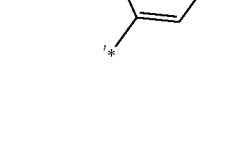
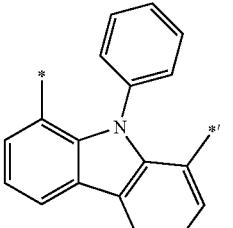
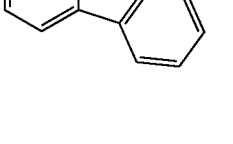
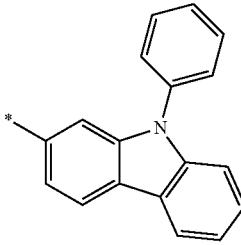

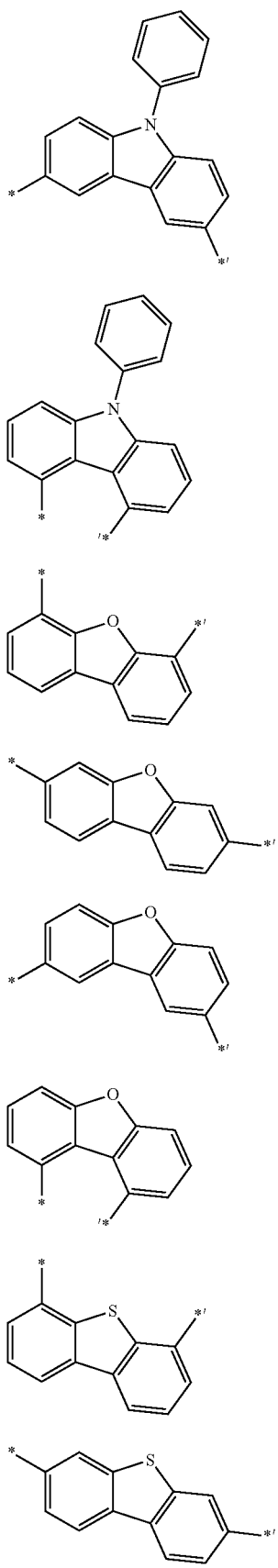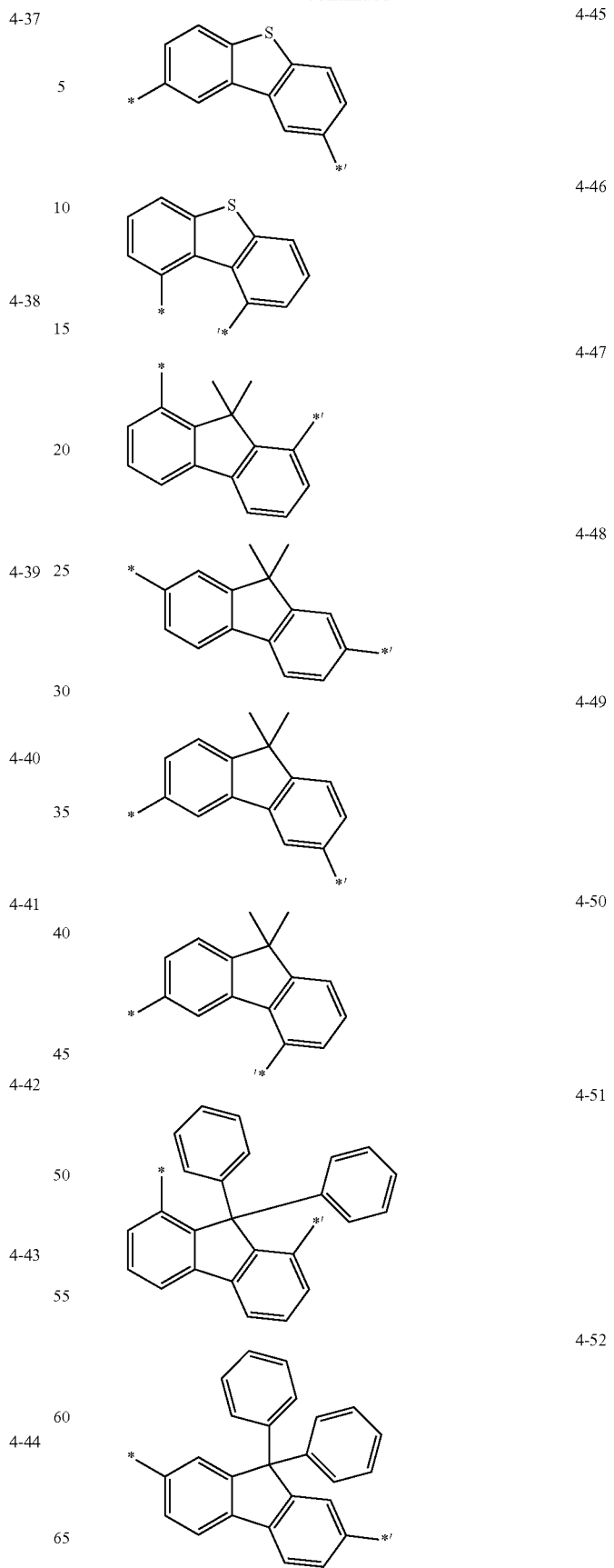

-continued

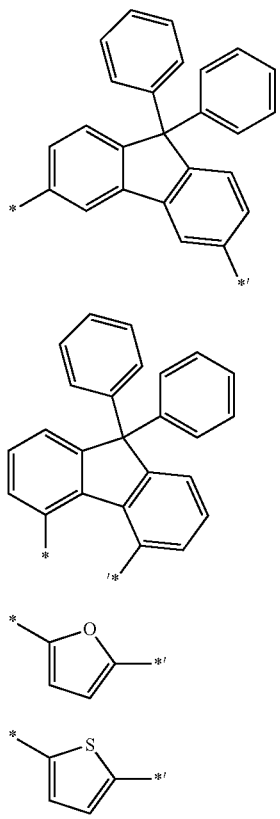

4-53

4-54

4-55

4-56

In Formulae 4-1 to 4-56, * and *' may be each independently a binding site with an adjacent atom.

In Formula 1, a1, which indicates the number of $L_1$s, may be selected from 0, 1, 2, and 3. For example, in Formula 1, a1 may be selected from 0 and 1, but is not limited thereto. When a1 is an integer of 2 or greater, a plurality of $L_1$s may be the same as or different from each other. When a1 is 0, $(L_1)_{a1}$ may indicate a single bond.

In Formula 1, a2, which indicates the number of $L_2$s, may be selected from 0, 1, 2, and 3. For example, in Formula 1, a2 may be selected from 0 and 1, but is not limited thereto. In some embodiments, in Formula 1, a2 may be 0. However, embodiments of the present disclosure are not limited thereto. When a2 is an integer of 2 or greater, a plurality of $L_2$s may be the same as or different from each other. When a2 is 0, $(L_2)_{a2}$ may indicate a single bond.

In Formula 1, a3, which indicates the number of $L_3$s, may be selected from 0, 1, 2, and 3. For example, in Formula 1, a3 may be selected from 0 and 1, but is not limited thereto. In some embodiments, in Formula 1, a3 may be 0. However, embodiments of the present disclosure are not limited thereto. When a3 is an integer of 2 or greater, a plurality of $L_3$s may be the same as or different from each other. When a3 is 0, $(L_3)_{a3}$ may indicate a single bond.

In Formula 1, $R_1$ to $R_3$ may be each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 1, $R_1$ to $R_3$ may be each independently selected from:

a methyl group, an ethyl group, a n-propyl group, an iso-propyl group, a n-butyl group, a sec-butyl group, an iso-butyl group, a tert-butyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, benzocarbazolyl group, and a dibenzocarbazolyl group. However, embodiments of the present disclosure are not limited thereto.

In some embodiments, in Formula 1, $R_1$ to $R_3$ may be each independently selected from:

a phenyl group, a naphthyl group, a fluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a benzimidazolyl group, a benzofuranyl group, a benzothiophenyl group, a triazolyl group, a triazinyl group, a dibenzofuranyl group, a dibenzothiophenyl group, a dibenzosilolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, and a phenyl group, a naphthyl group, a fluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a benzimidazolyl group, a benzofuranyl group, a benzothiophenyl group, a triazolyl group, a triazinyl group, a dibenzofuranyl group, a dibenzothiophenyl group, a dibenzosilolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a cyano group, a nitro group, a methyl group, an ethyl group, a n-propyl group, a tert-butyl group, a methoxy group, an ethoxy group, tert-butoxy group, a phenyl group, a naphthyl group, a fluorenyl group, a phenanthrenyl group, an anthracenyl group, a triphenylenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a naphthyridinyl group, a quinoxalinyl group, a quinazolinyl group, a carbazolyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, and a dibenzothiophenyl group. However, embodiments of the present disclosure are not limited thereto.

In some embodiments, in Formula 1, $R_1$ to $R_3$ may be each independently selected from groups represented by Formulae 5-1 to 5-51. However, embodiments of the present disclosure are not limited thereto.

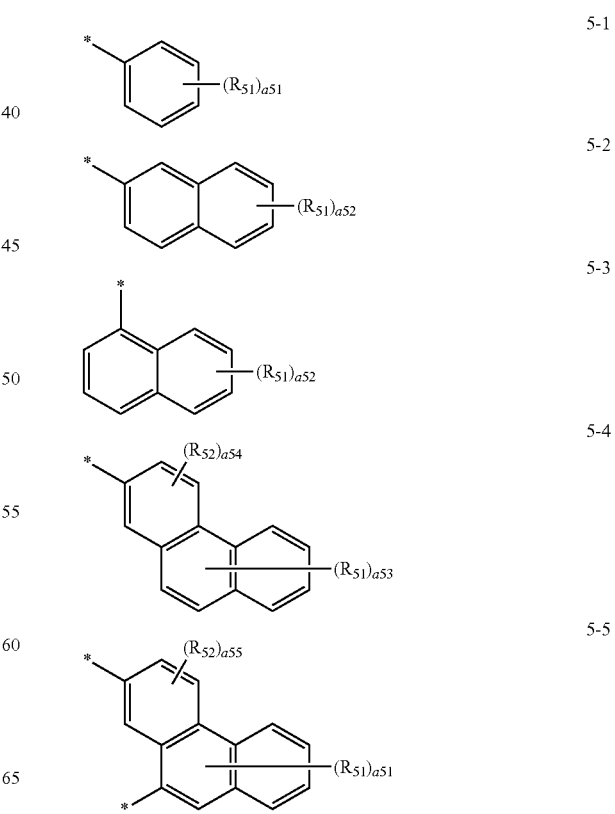

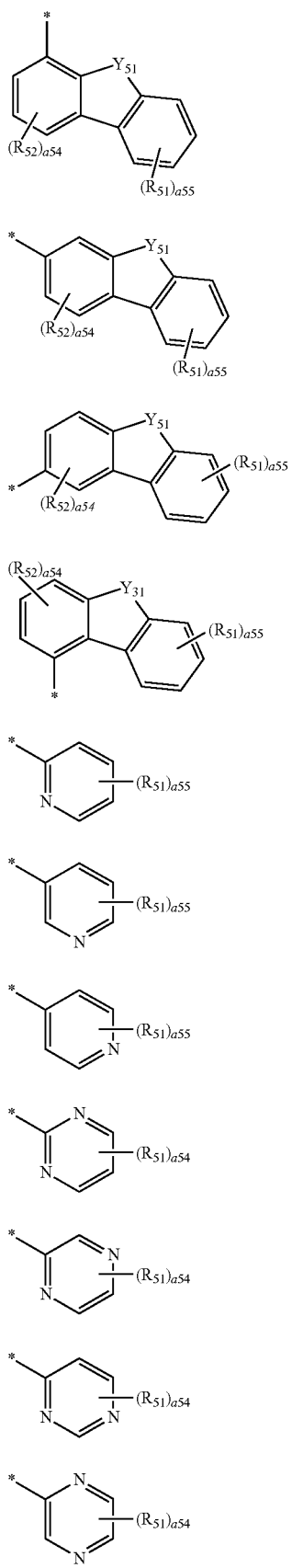
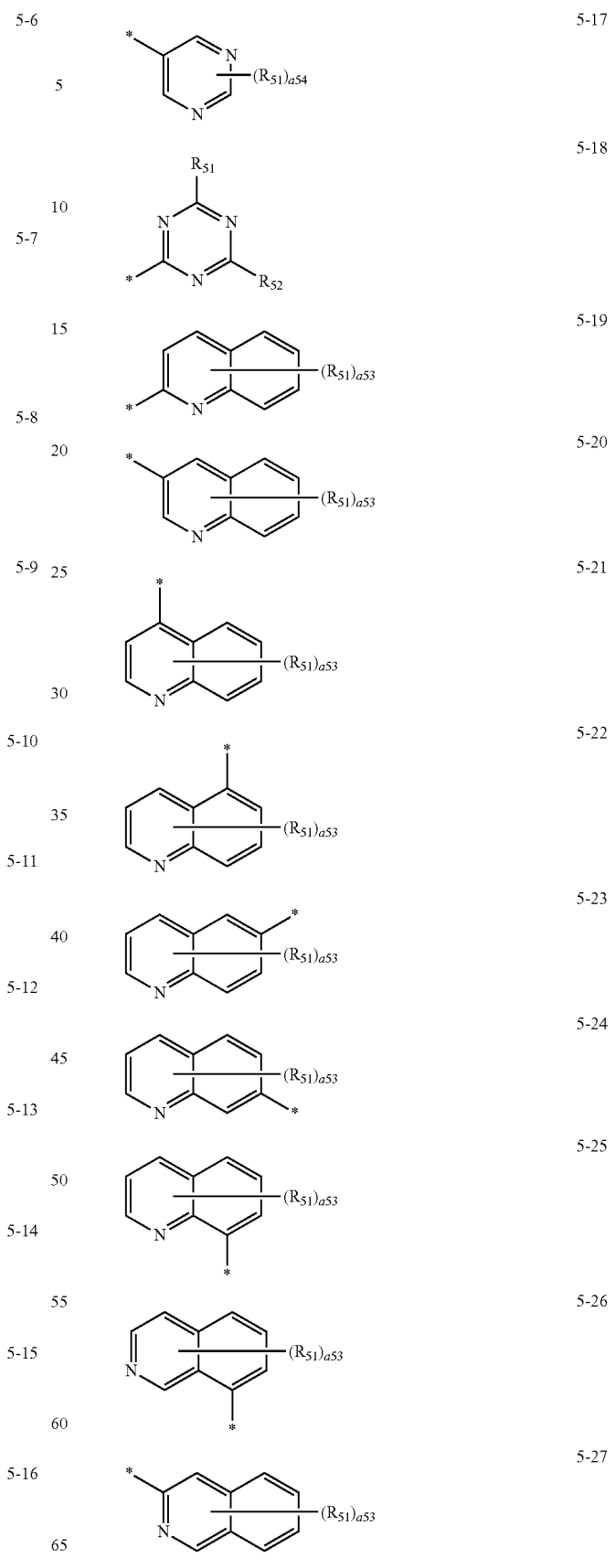

-continued
| | |
|---|---|
| 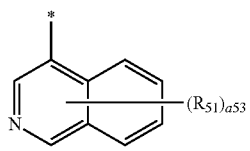 | 5-28 |
| 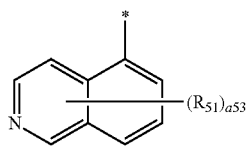 | 5-29 |
| 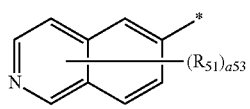 | 5-30 |
| 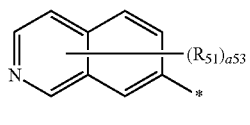 | 5-31 |
| 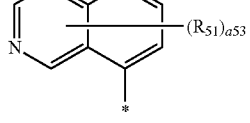 | 5-32 |
| 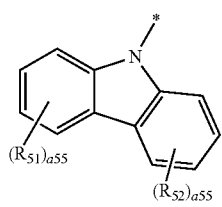 | 5-33 |
| 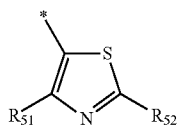 | 5-34 |
| 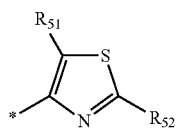 | 5-35 |
| 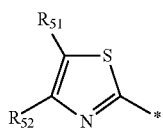 | 5-36 |
| 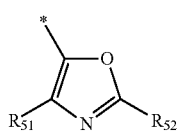 | 5-37 |
| 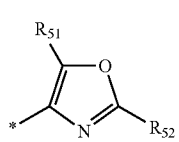 | 5-38 |
-continued
| | |
|---|---|
| 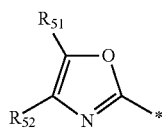 | 5-39 |
| 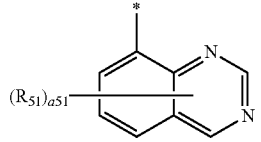 | 5-40 |
| 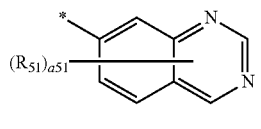 | 5-41 |
| 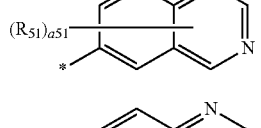 | 5-42 |
| 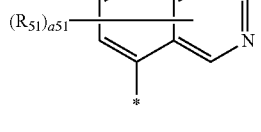 | 5-43 |
| 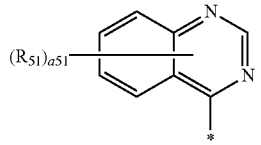 | 5-44 |
| 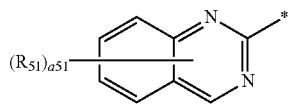 | 5-45 |
| 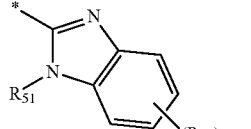 | 5-46 |
| 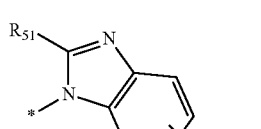 | 5-47 |
| 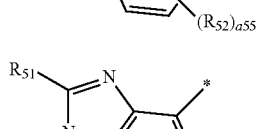 | 5-48 |
| 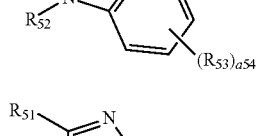 | 5-49 |
| 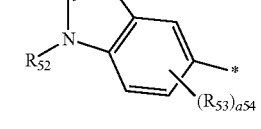 | |

-continued

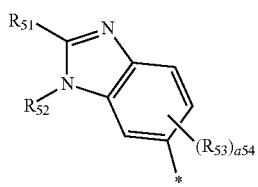

5-50

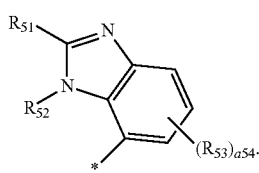

5-51

In Formulae 5-1 to 5-51, $Y_{51}$ may be selected from $C(R_{54})(R_{55})$, $N(R_{54})$, O, and S;

$R_{51}$ to $R_{55}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, -$CD_3$, —$CF_3$, $C_1$-$C_{20}$ alkoxy group, a phenyl group, a naphthyl group, a fluorenyl group, a spirofluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a51 may be selected from 1, 2, 3, 4, and 5;

a52 may be selected from 1, 2, 3, 4, 5, 6, and 7;

a53 may be selected from 1, 2, 3, 4, 5, and 6;

a54 may be selected from 1, 2, and 3;

a55 may be selected from 1, 2, 3, and 4; and

* may be a binding site with an adjacent atom.

In some embodiments, in Formula 1, $R_1$ to $R_3$ may be each independently selected from groups represented by Formulae 6-1 to 6-83. However, embodiments of the present disclosure are not limited thereto.

6-1

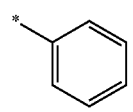

6-2

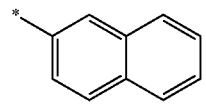

6-3

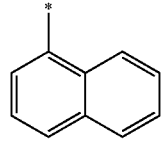

6-4

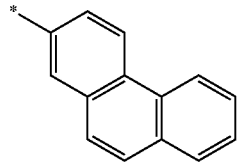

6-5

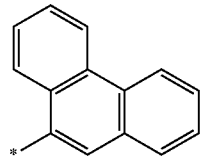

6-6

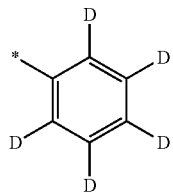

6-7

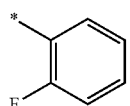

6-8

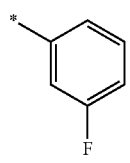

6-9

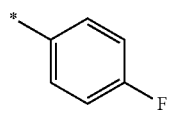

6-10

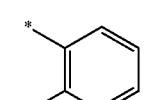

6-11

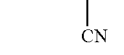

6-12

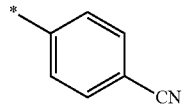

6-13

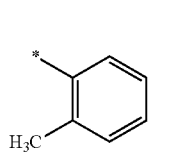

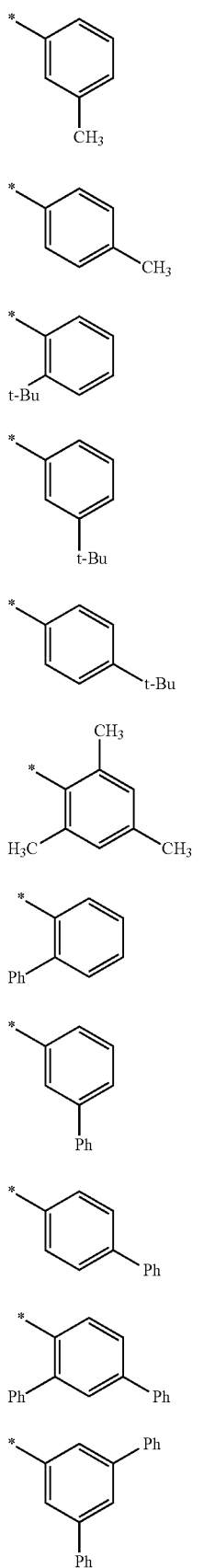
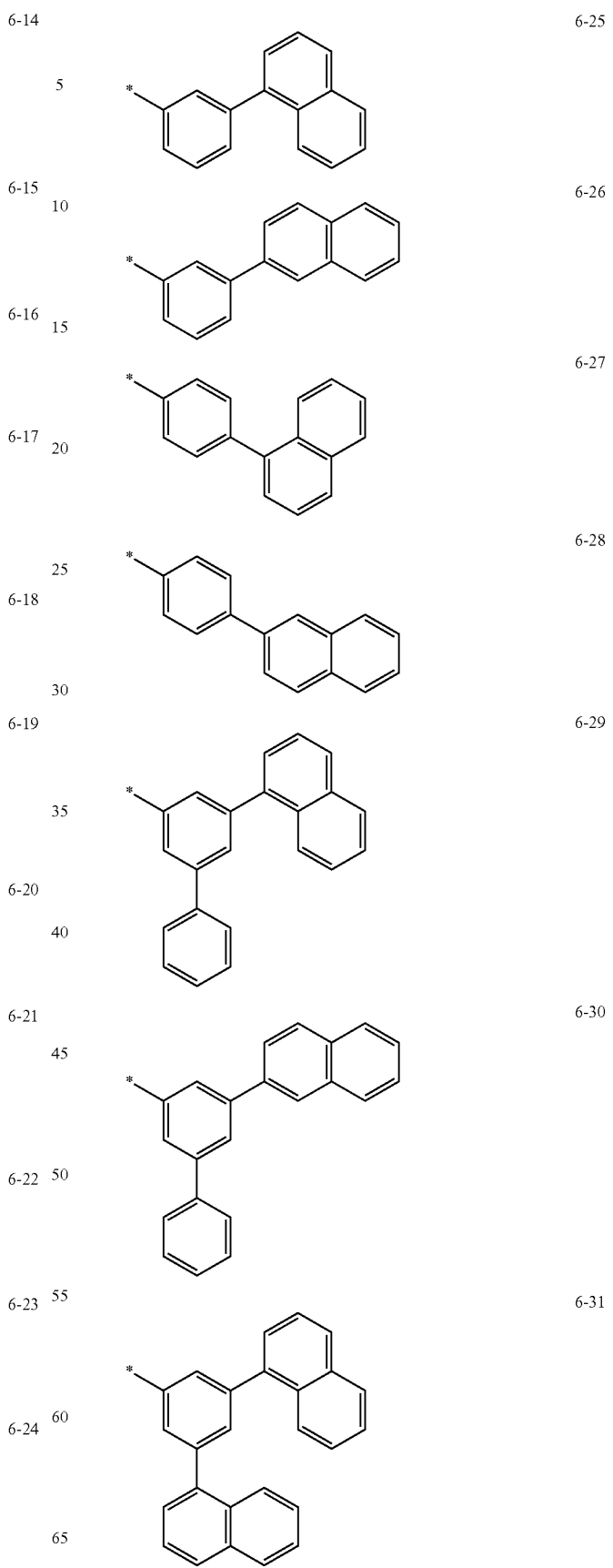

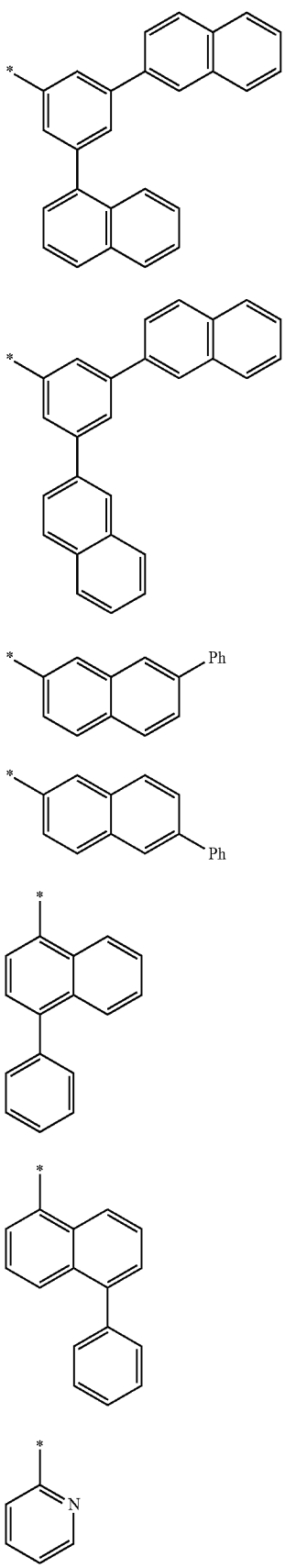
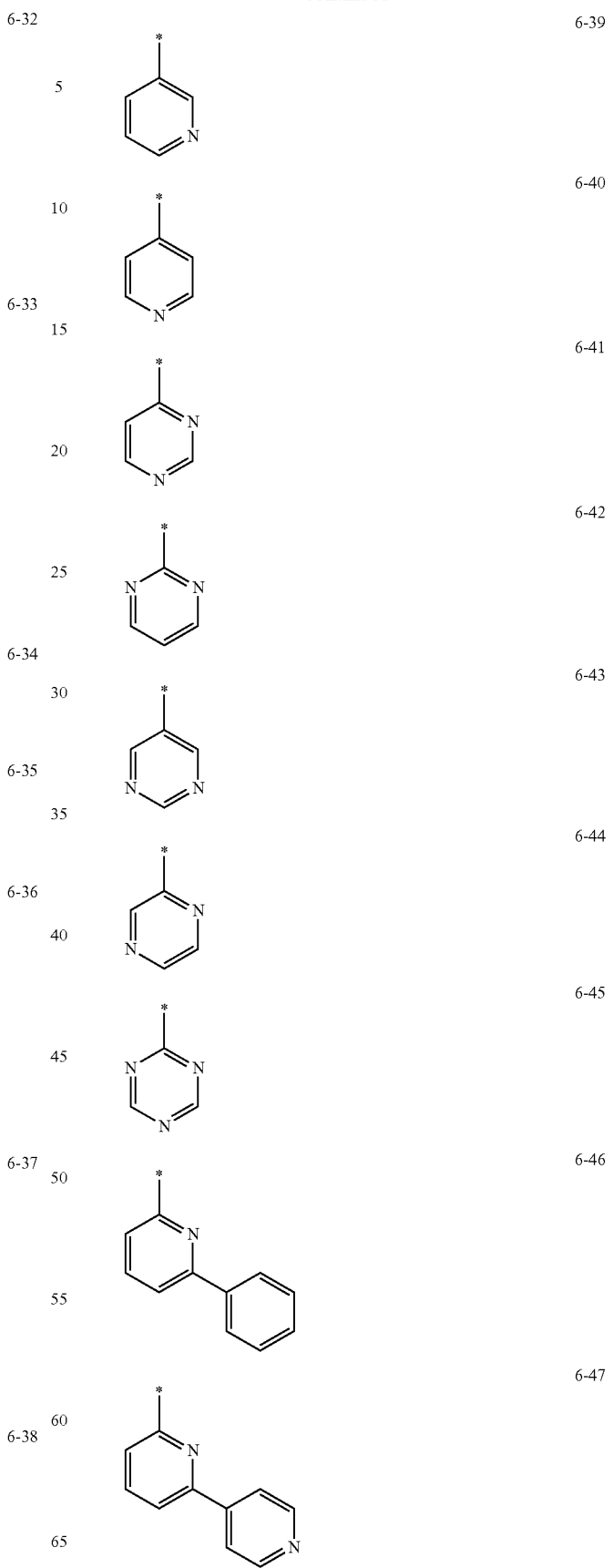

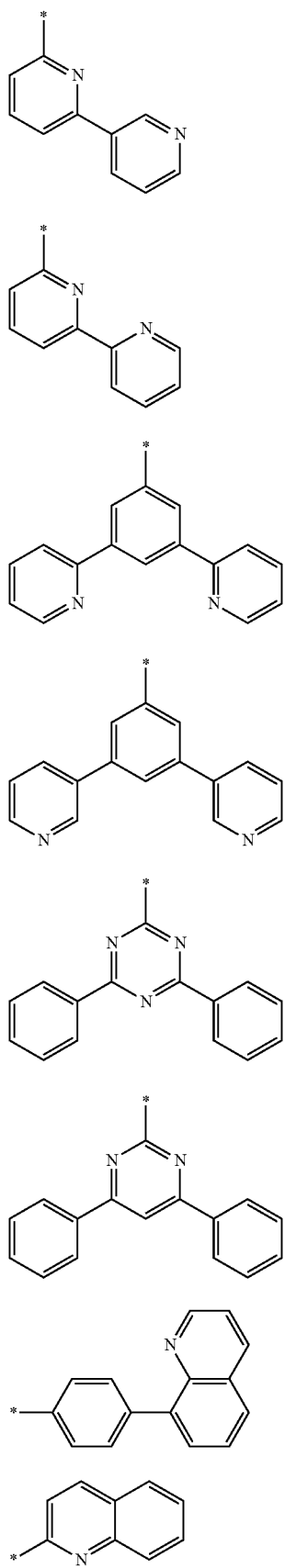
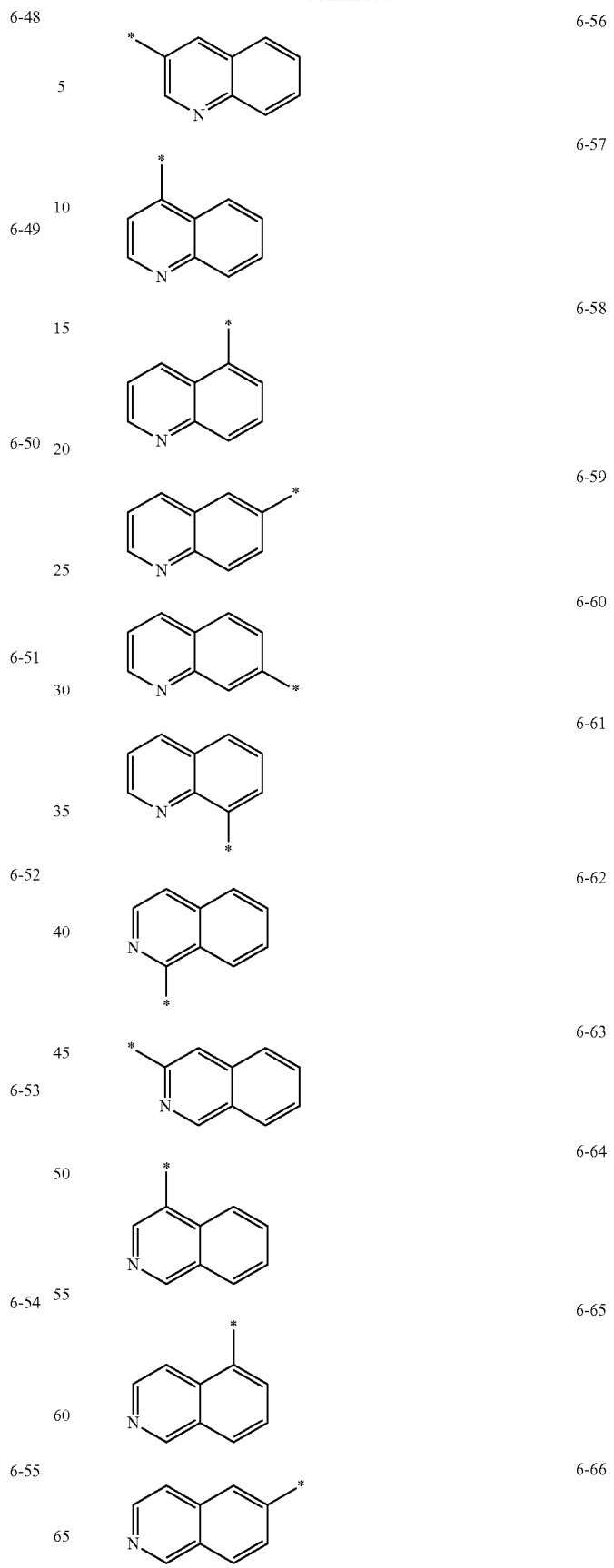

-continued 6-67 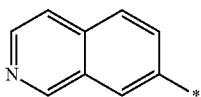

6-68 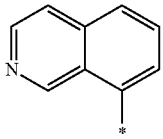

6-69 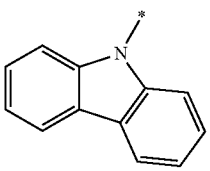

6-70 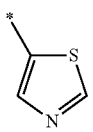

6-71 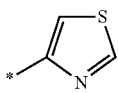

7-72 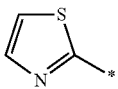

6-73 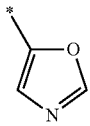

6-74 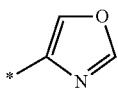

6-75 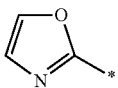

6-76 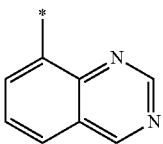

6-77 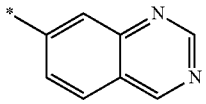

6-78 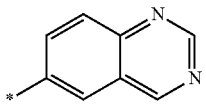

-continued 6-79 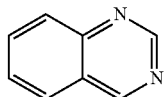

6-80 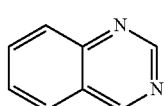

6-81 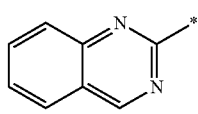

6-82 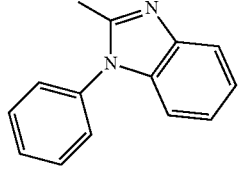

6-83 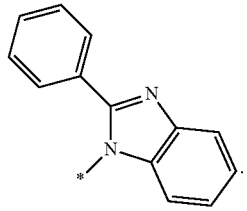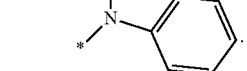

In Formulae 6-1 to 6-83,
t-Bu indicates a tert-butyl group;
Ph indicates a phenyl group; and
* indicates a binding site with an adjacent atom.

In Formula 1, $R_4$ and $R_5$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 1, $R_4$ and $R_5$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In some embodiments, in Formula 1, $R_4$ and $R_5$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, a n-propyl group, a tert-butyl group, a methoxy group, an ethoxy group, a phenyl group, and a naphthyl group. However, embodiments of the present disclosure are not limited thereto.

In some embodiments, in Formula 1, $R_4$ and $R_5$ may be each independently selected from hydrogen, deuterium, —F, —Cl, —Br, and —I. However, embodiments of the present disclosure are not limited thereto.

In Formula 1, n1, which indicates the number of moieties represented by *-$(L_2)_{a2}$-$R_2$, may be selected from 0, 1, 2, 3, and 4. When n1 is 2 or greater, a plurality of the moieties represented by *-$(L_2)_{a2}$-$R_2$ may be the same as or different from each other. For example, n1 may be 1. However, embodiments of the present disclosure are not limited thereto.

In Formula 1, n2, which indicates the number of moieties represented by *-$(L_3)_{a3}$-$R_3$, may be selected from 0, 1, 2, 3, and 4. When n2 is 2 or greater, a plurality of the moieties represented by *-$(L_3)_{a3}$-$R_3$ may be the same as or different from each other. For example, n2 may be 1. However, embodiments of the present disclosure are not limited thereto.

In some embodiments, the electron transport material of Formula 1 may be represented by Formula 1-1. However, embodiments of the present disclosure are not limited thereto.

Formula 1-1

In Formula 1-1, $L_1$ to $L_3$, a1 to a3, $R_1$ to $R_5$, n1, and n2 may be the same as they are defined in Formula 1.

For example, the electron transport material of Formula 1 may be represented by Formula 1-11. However, embodiments of the present disclosure are not limited thereto.

Formula 1-11

In Formula 1-11, $L_1$, a1, and $R_1$ to $R_3$ may be the same as they are defined in Formula 1.

For example, in Formula 1-11, $L_1$ may be selected from groups represented by Formulae 4-1 to 4-56; and a1 may be selected from 0 and 1. However, embodiments of the present disclosure are not limited thereto.

For example, in Formula 1-11, $R_1$ to $R_3$ may be each independently selected from groups represented by Formulae 6-1 to 6-83. However, embodiments of the present disclosure are not limited thereto.

In some embodiments, the electron transport material of Formula 1 may be selected from compounds represented by the following formulae. However, embodiments of the present disclosure are not limited thereto.

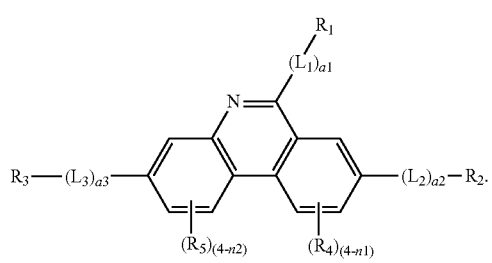

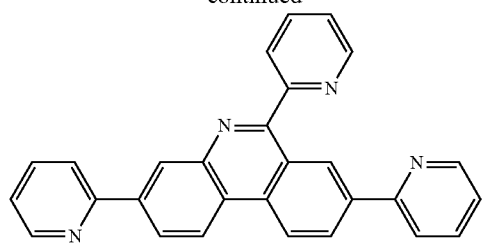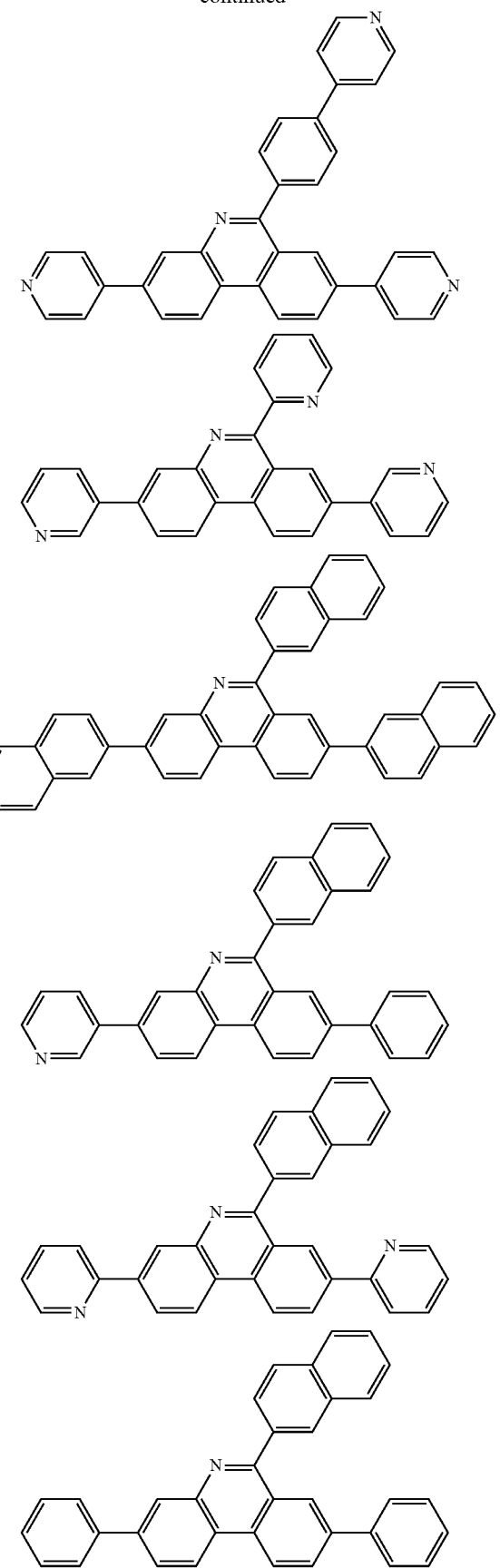

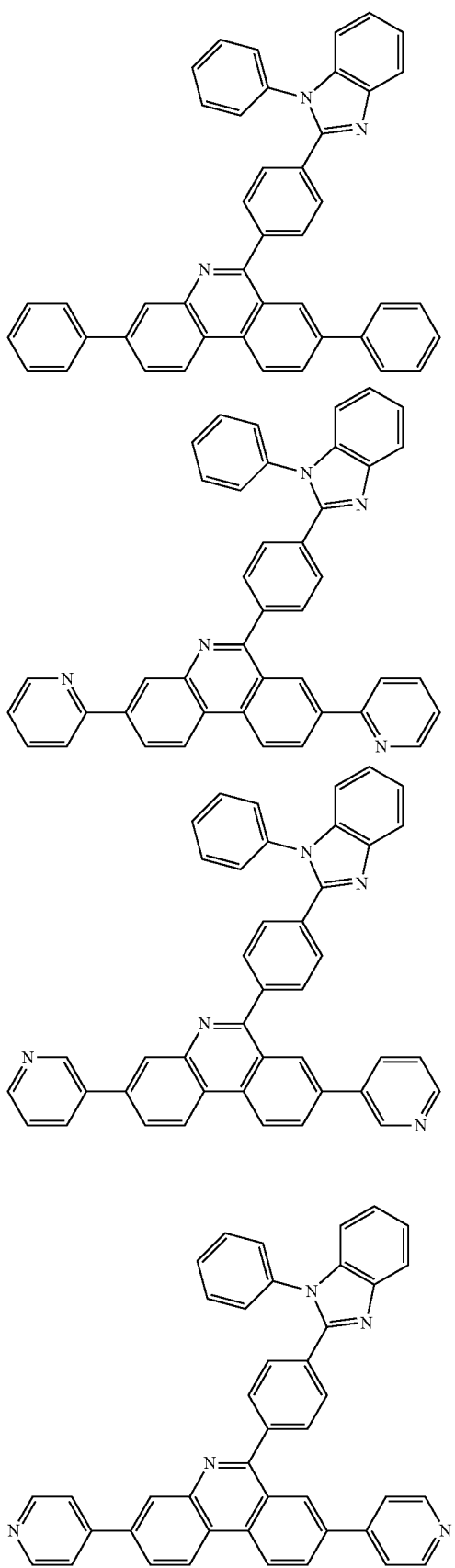

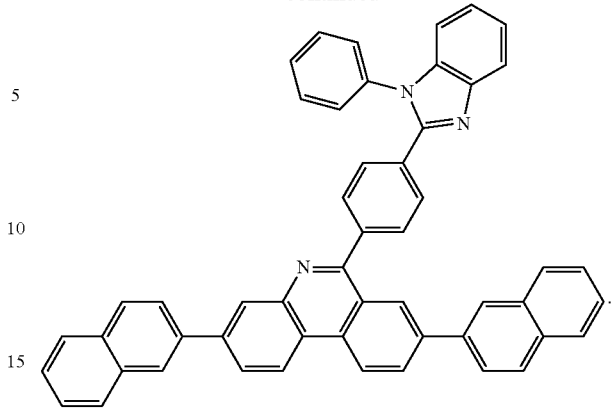

The electron transport material represented by Formula 1 may have improved hole blocking characteristics with a deep highest occupied molecular orbital (HOMO) level. Therefore, in an organic light-emitting device including the electron transport material of Formula 1, excitons may be effectively accumulated in the emission layer, so that the efficiency of the organic light-emitting device may be improved.

In some embodiments, the electron transport region may further include an alkali metal complex, in addition to the electron transport material of Formula 1. For example, the electron transport material of Formula 1 and the alkali metal complex may be in the ETL of the electron transport region.

The alkali metal complex may be represented by one of Formulae 2-1 to 2-4. However, embodiments of the present disclosure are not limited thereto.

Formula 2-1

Formula 2-2

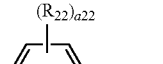

Formula 2-3

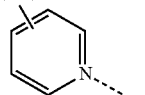

Formula 2-4

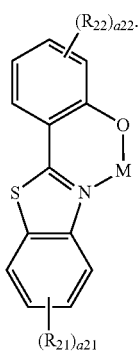

In Formulae 2-1 to 2-4,

M may be an alkali metal;

$R_{21}$ to $R_{23}$ may be each independently defined the same as $R_4$ in Formula 1;

$R_{21}$ to $R_{23}$ may optionally be linked to one another to form a ring; and a21 and a22 may be each independently selected from 1, 2, 3, and 4.

For example, in Formulae 2-1 to 2-4, M may be selected from Li, Na, and Cs, but is not limited thereto.

For example, in Formulae 2-1 to 2-4, M may be Li. However, embodiments of the present disclosure are not limited thereto.

The alkali metal complex represented by one of Formulae 2-1 to 2-4 may be selected from Compounds ET-D1 to ET-D8, but is not limited thereto.

ET-D1

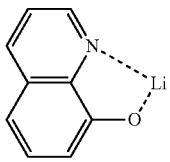

ET-D2

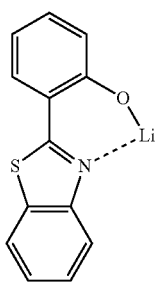

ET-D3

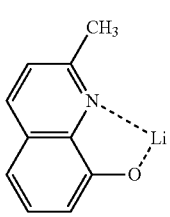

ET-D4

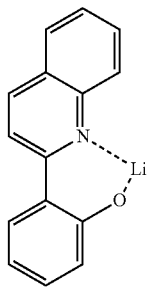

ET-D5

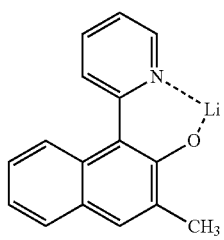

ET-D6

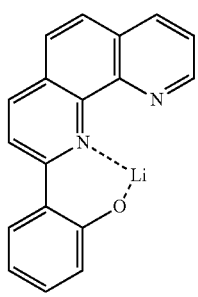

ET-D7

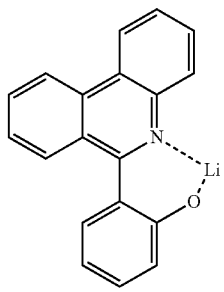

ET-D8

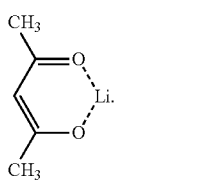

In some embodiments, a weight ratio of the electron transport material to the alkali metal complex may be in a range of about 10:90 to about 90:10, for example, in a range of about 20:80 to about 80:20, in a range of about 30:70 to about 70:30, in a range of about 40:60 to about 60:40, or about 50:50. However, embodiments of the present disclosure are not limited thereto.

Due to the interaction between a metal ion of the alkali metal complex and a phenanthridine core of the electron transport material of Formula 1, an organic light-emitting device including the alkali metal complex and the electron transport material may have improved electron transport characteristics, and consequently improved efficiency.

In some embodiments, the electron transport region of the organic light-emitting device may include a hole blocking layer. For example, when the emission layer includes a phosphorescent dopant, the electron transport region may include a hole blocking layer to prevent or substantially block the diffusion of triplet excitons or holes into the ETL.

When the electron transport region includes a hole blocking layer, the hole blocking layer may be formed on the emission layer by using one or more suitable of methods, for example, by using vacuum deposition, spin coating, casting, Langmuir-Blodgett (LB) deposition, inkjet printing, laser printing, laser induced thermal imaging (LITI), and/or the like. When the hole blocking layer is formed using vaccum deposition and/or spin coating, the depositon and coating conditions for the hole blocking layer may be similar to the above-described deposition and coating conditions for forming the HIL.

The hole blocking layer may include at least one of BCP and Bphen. However, embodiments of the present disclosure are not limited thereto.

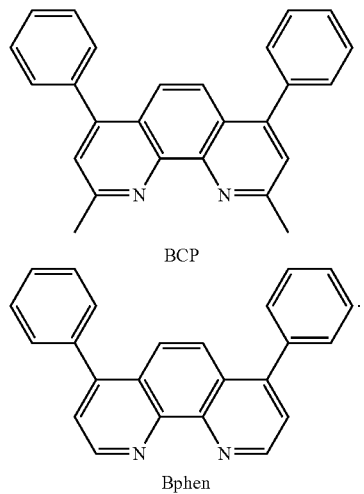

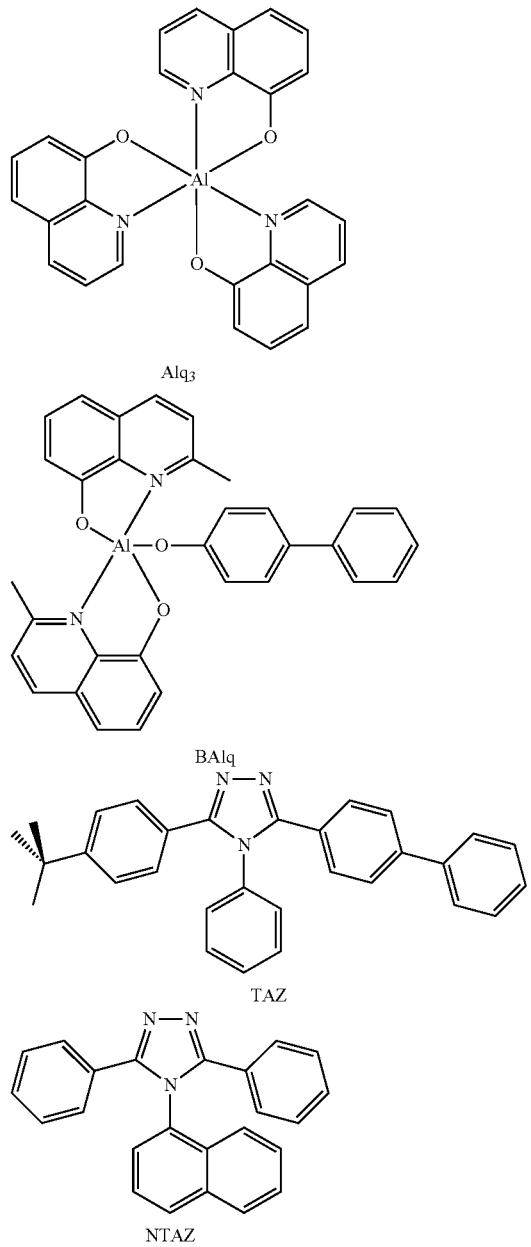

The thickness of the hole blocking layer may be from about 20 Å to about 1000 Å, and in some embodiments, from about 30 Å to about 300 Å. When the thickness of the hole blocking layer is within any of these ranges, the hole blocking layer may have satisfactory hole blocking characteristics without a substantial increase in driving voltage.

In some embodiments, the electron transport region of the organic light-emitting device may include an electron transport layer (ETL). The ETL may be formed on the emission layer or hole blocking layer by using one or more suitable methods, for example, by using vacuum deposition, spin coating, casting, Langmuir-Blodgett (LB) deposition, inkjet printing, laser printing, laser induced thermal imaging (LITI), and/or the like. When the ETL is formed using vacuum deposition and/or spin coating, the deposition and coating conditions for the ETL may be similar to the above-described deposition and coating conditions for forming the HIL.

In some embodiments, the ETL may further include at least one selected from BCP, Bphen, $Alq_3$, Balq, TAZ, and NTAZ, in addition to the electron transport material represented by Formula 1.

The thickness of the ETL may be from about 100 Å to about 1,000 Å, and in some embodiments, from about 150 Å to about 500 Å. When the thickness of the ETL is within any of these ranges, the ETL may have satisfactory electron transporting ability without a substantial increase in driving voltage.

The electron transport region may further include an EIL that may facilitate injection of electrons from the second electrode 190.

The EIL may be formed on the ETL by using one or more suitable methods, for example, by using vacuum deposition, spin coating, casting, Langmuir-Blodgett (LB) deposition, inkjet printing, laser printing, laser induced thermal imaging (LITI), and/or the like. When the EIL is formed using vacuum deposition and/or spin coating, the deposition and coating conditions for forming the EIL may be similar to the above-described deposition and coating conditions for forming the HIL.

The EIL may include at least one selected from LiF, NaCl, CsF, Li$_2$O, BaO, and LiQ.

The thickness of the EIL may be from about 1 Å to about 100 Å, and in some embodiments, from about 3 Å to about 90 Å. When the thickness of the EIL is within any of these ranges, the EIL may have satisfactory electron injection ability without a substantial increase in driving voltage.

The second electrode 190 may be positioned on the organic layer 150 described above. The second electrode 190 may be a cathode, which is an electron injecting electrode. A material for forming the second electrode 190 may be a metal, an alloy, an electrically conductive compound, which have a low-work function, or a mixture thereof. Non-limiting examples of materials for forming the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, a material for forming the second electrode 190 may be ITO and/or IZO. The second electrode 190 may be a reflective electrode, a semi-transmissive electrode, or a transmissive electrode.

Although the organic light-emitting device of FIG. 1 has been described above, embodiments of the present disclosure are not limited thereto.

As used herein, a $C_1$-$C_{60}$ alkyl group refers to a linear or branched aliphatic hydrocarbon monovalent group having 1 to 60 carbon atoms in the main chain. Non-limiting examples of the $C_1$-$C_{60}$ alkyl group include a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group refers to a divalent group having the same structure as the $C_1$-$C_{60}$ alkyl group.

As used herein, a $C_1$-$C_{60}$ alkoxy group refers to a monovalent group represented by -OA$_{101}$ (where A$_{101}$ is the $C_1$-$C_{60}$ alkyl group, as described above). Non-limiting examples of the $C_1$-$C_{60}$ alkoxy group include a methoxy group, an ethoxy group, and an isopropyloxy group.

As used herein, a $C_2$-$C_{60}$ alkenyl group refers to a hydrocarbon chain that includes at least one carbon-carbon double bond at one or more positions along a carbon chain of the $C_2$-$C_{60}$ alkyl group (e.g., in the middle or at either terminal end of the $C_2$-$C_{60}$ alkyl group). Non-limiting examples of the $C_2$-$C_{60}$ alkenyl group include an ethenyl group, a propenyl group, and a butenyl group. A $C_2$-$C_{60}$ alkylene group refers to a divalent group having the same structure as the $C_2$-$C_{60}$ alkenyl group.

As used herein, a $C_2$-$C_{60}$ alkynyl group refers to a hydrocarbon chain that includes at least one carbon-carbon triple bond at one or more positions along a carbon chain of the $C_2$-$C_{60}$ alkyl group (e.g., in the middle or at either terminal end of the $C_2$-$C_{60}$ alkyl group). Non-limiting examples of the $C_2$-$C_{60}$ alkynyl group include an ethynyl group and a propynyl group. A $C_2$-$C_{60}$ alkynylene group used herein refers to a divalent group having the same structure as the $C_2$-$C_{60}$ alkynyl group.

As used herein, a $C_3$-$C_{10}$ cycloalkyl group refers to a monovalent, monocyclic hydrocarbon group having 3 to 10 carbon atoms as ring-forming atoms. Non-limiting examples of the $C_3$-$C_{10}$ cycloalkyl group include a cyclopropyl group, a cyclobutyl group, a cyclopentyl group, a cyclohexyl group, and a cycloheptyl group. A $C_3$-$C_{10}$ cycloalkylene group refers to a divalent group having the same structure as the $C_3$-$C_{10}$ cycloalkyl group.

As used herein, a $C_1$-$C_{10}$ heterocycloalkyl group refers to a monovalent monocyclic group having 1 to 10 carbon atoms as ring-forming atoms, and at least one hetero atom selected from N, O, P, and S as a ring-forming atom. Non-limiting examples of the $C_1$-$C_{10}$ heterocycloalkyl group include a tetrahydrofuranyl group and a tetrahydrothiophenyl group. A $C_1$-$C_{10}$ heterocycloalkylene group refers to a divalent group having the same structure as the $C_1$-$C_{10}$ heterocycloalkyl group.

As used herein, a $C_3$-$C_{10}$ cycloalkenyl group refers to a monovalent monocyclic group that has 3 to 10 carbon atoms as ring-forming atoms, and includes at least one double bond in the ring, but does not have aromaticity. Non-limiting examples of the $C_3$-$C_{10}$ cycloalkenyl group include a cyclopentenyl group, a cyclohexenyl group, and a cycloheptenyl group. A $C_3$-$C_{10}$ cycloalkenylene group refers to a divalent group having the same structure as the $C_3$-$C_{10}$ cycloalkenyl group.

As used herein, a $C_1$-$C_{10}$ heterocycloalkenyl group refers to a monovalent monocyclic group that has at least one hetero atom selected from N, O, P, and S as a ring-forming atom, and 1 to 10 carbon atoms as the remaining ring-forming atoms, and that includes at least one double bond in the ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group used herein refers to a divalent group having the same structure as the $C_1$-$C_{10}$ heterocycloalkenyl group.

As used herein, a $C_6$-$C_{60}$ aryl group refers to a monovalent, aromatic carbocyclic aromatic group having 6 to 60 carbon atoms as ring-forming atoms, and a $C_6$-$C_{60}$ arylene group refers to a divalent, aromatic carbocyclic group having 6 to 60 carbon atoms as ring-forming atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include at least two rings, the respective rings may be fused to each other.

As used herein, a $C_1$-$C_{60}$ heteroaryl group refers to a monovalent, aromatic carbocyclic aromatic group having 1 to 60 carbon atoms as ring-forming atoms, and at least one hetero atom selected from N, O, P, and S as a ring-forming atom. A $C_1$-$C_{60}$ heteroarylene group refers to a divalent, aromatic carbocyclic group having 1 to 60 carbon atoms as ring-forming atoms, and at least one hetero atom selected from N, O, P, and S as a ring-forming atom. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl and/or the $C_1$-$C_{60}$ heteroarylene include at least two rings, the respective rings may be fused to each other.

As used herein, a $C_6$-$C_{60}$ aryloxy group refers to a monovalent group represented by -OA$_{102}$ (where A$_{102}$ is the $C_6$-$C_{60}$ aryl group, as described above), and a $C_6$-$C_{60}$ arylthio group refers to a monovalent group represented by -SA$_{103}$ (where A$_{103}$ is the $C_6$-$C_{60}$ aryl group, as described above).

As used herein, a monovalent non-aromatic condensed polycyclic group refers to a monovalent group that includes at least two rings condensed to each other, includes only carbon atoms (for example, 8 to 60 carbon atoms) as ring-forming atoms, and does not have overall aromaticity. A non-limiting example of the monovalent non-aromatic condensed polycyclic group is a fluorenyl group. As used herein, a divalent non-aromatic condensed polycyclic group refers to a divalent group with the same structure as the monovalent non-aromatic condensed polycyclic group.

As used herein, the monovalent non-aromatic condensed heteropolycyclic group refers to a monovalent group that includes at least two rings condensed to each other, includes carbons (for example, 2 to 60 carbon atoms) and at least one heteroatom selected from N, O, P and S as ring-forming atoms, and does not have overall aromaticity. A non-limiting example of the monovalent non-aromatic condensed heteropolycyclic group is a carbazolyl group. As used herein, a divalent non-aromatic condensed heteropolycyclic group refers to a divalent group with the same structure as the monovalent non-aromatic condensed heteropolycyclic group.

As used herein, at least one substituent of the substituted $C_2$-$C_{10}$ alkylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_{10}$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may be each independently selected from hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, at least one substituent of the substituted $C_2$-$C_{10}$ alkylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group, a $C_1$-$C_{30}$ alkyl group, a $C_2$-$C_{30}$ alkenyl group, a $C_2$-$C_{30}$ alkynyl group, and a $C_1$-$C_{30}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_{10}$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), and —B(Q$_{16}$)(Q$_{17}$), a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from a cyclopentyl group, a cyclohexyl group, a cycloheptyl group, a cyclooctyl group, a cyclopentenyl group, a cyclohexenyl group, a cycloheptenyl group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from a cyclopentyl group, a cyclohexyl group, a cycloheptyl group, a cyclooctyl group, a cyclopentenyl group, a cyclohexenyl group, a cycloheptenyl group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group that are each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{30}$ alkyl group, a C$_2$-C$_{30}$ alkenyl group, a C$_2$-C$_{30}$ alkynyl group, and a C$_1$-C$_{30}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{30}$ aryl group, a C$_6$-C$_{30}$ aryloxy group, a C$_6$-C$_{30}$ arylthio group, a C$_1$-C$_{30}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), and —B(Q$_{26}$)(Q$_{27}$), and —N(Q$_{31}$)(Q$_{32}$), —Si(Q$_{33}$)(Q$_{34}$)(Q$_{35}$), and —B(Q$_{36}$)(Q$_{37}$), where Q$_{11}$ to Q$_{17}$, and Q$_{31}$ to Q$_{37}$ may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from hydrogen, a C$_1$-C$_{30}$ alkyl group, a C$_2$-C$_{30}$ alkenyl group, a C$_2$-C$_{30}$ alkynyl group, a C$_1$-C$_{30}$ alkoxy group, a cyclopentyl group, a cyclohexyl group, a cycloheptyl group, a cyclooctyl group, a cyclopentenyl group, a cyclohexenyl group, a cycloheptenyl group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group. However, embodiments of the present disclosure are not limited thereto.

The acronym "Ph" used herein refers to phenyl or phenyl group, the acronym "Me" used herein refers to methyl or methyl group, the acronym "Et" used herein refers to ethyl or ethyl group, and the acronym "ter-Bu" or "Bu$^t$" used herein refers to tert-butyl or tert-butyl group.

One or more embodiments of the present disclosure will now be described in more detail with reference to the following synthesis examples and other examples of compounds and organic light-emitting devices. However, these examples are for illustrative purposes only and are not intended to limit the scope of the present disclosure. In the following synthesis examples, the expression that "'B', instead of 'A', was used" means that the amounts of 'B' and 'A' were the same in equivalent amounts.

EXAMPLES

Synthesis Example 1

Synthesis of Compound 5

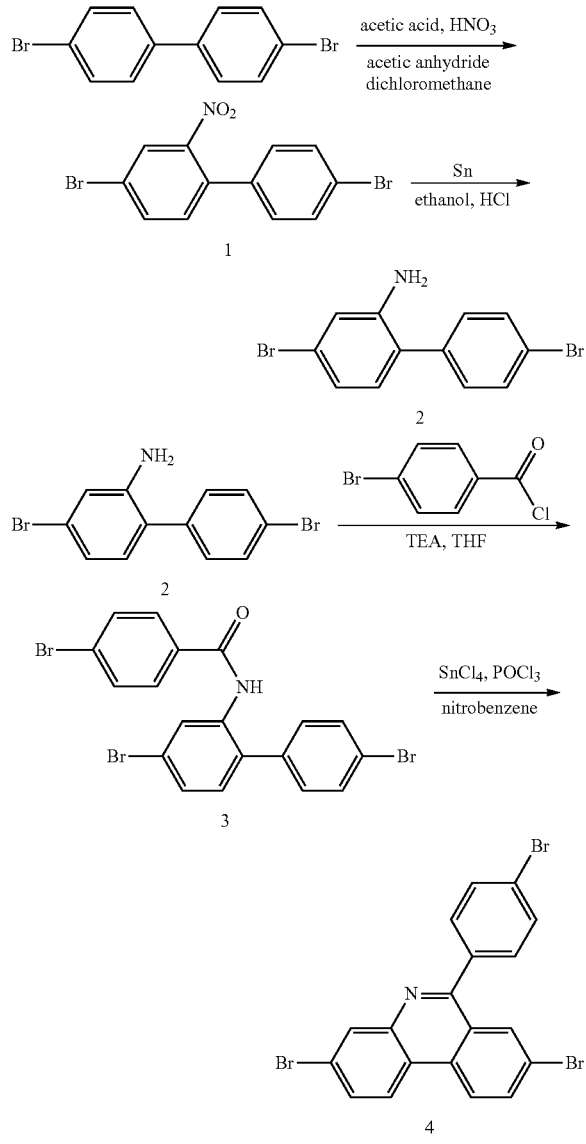

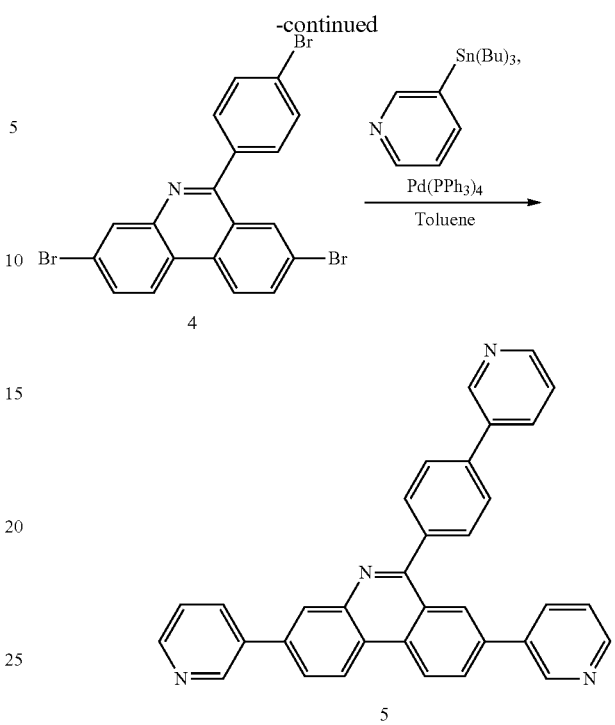

1) Synthesis of Intermediate 1

After 20.0 g (64.0 mmol) of 4,4-dibromobiphenyl was placed into a 1000-mL, 3-necked flask and dissolved with 70 mL of $CH_2Cl_2$, 240 mL of acetic anhydride was added thereto and stirred. The resulting reaction product was cooled down (using ice) to a temperature of about 0° C., and a mixture of 50 mL of acetic acid and 70 ml of nitric acid was slowly dropwise added thereto through a dropwise funnel. After being stirred for about 8 hours, the resulting product was cooled down using ice, and 300 mL of a 2M NaOH solution was added thereto, stirred, and then filtered to obtain a yellow solid, followed by extraction with $CH_2Cl_2$, drying with anhydrous magnesium sulfate ($MgSO_4$), and distillation under reduced pressure. The resulting product was washed with hexane and dried to obtain 17.0 g of Intermediate 1. This Intermediate 1 was structurally identified by $^1H$ nuclear magnetic resonance (NMR).

$^1H$ NMR (300 MHz, $CD_2Cl_2$, δ): 8.10 (d, 1H), 7.85 (dd, 1H), 7.62 (d, 2H), 7.35 (d, 1H), 7.22 ppm (d, 2H).

2) Synthesis of Intermediate 2

17.0 g (47.6 mmol) of Intermediate 1 was dissolved with 160 mL of ethanol in a 500-mL, 3-necked flask, and 80 mL of a 35% HCl solution was added thereto. Then, 11.3 g (95.2 mmol) of tin powder was slowly added thereto and the resulting mixture was then refluxed at about 90° C. for about 9 hours. After the temperature of the reaction product cooled down to room temperature, a 2M NaOH solution was added thereto to obtain a pH of 9. The resulting solid was filtered, washed sufficiently with distilled water, and dried to obtain 13.1 g of Intermediate 2 (Yield: 84%). This Intermediate 2 was structurally identified by $^1H$ NMR.

$^1H$ NMR (300 MHz, CDCl3, δ): 7.60 (d, 2H), 7.31 (d, 2H), 6.95-6.93 (m, 3H), 3.78 ppm (s, 2H).

3) Synthesis of Intermediate 3

After 10.0 g (30.6 mmol) of Intermediate 2 was placed into a 500-mL, 3-necked flask and dissolved with 200 mL of THF, 10 mL of triethylamine was added thereto. After the temperature of the reaction product was cooled down to 0° C., a solution of 10.4 g (47.4 mmol) of 4-bromobenzoyl chloride in tetrahydrofuran (THF) was slowly dropwise added thereto and the resulting mixture was stirred at room temperature for about 9 hours, followed by extraction with ethyl acetate, drying with anhydrous MgSO$_4$, and then distillation under reduced pressure. The resulting product was purified by column chromagotraphy with a mixture of ethyl acetate and hexane (1:50) as an eluent to obtain 8.0 g of Intermediate 3 (Yield: 51%). This Intermediate 3 was structurally identified by $^1$H NMR.

$^1$H NMR (300 MHz, CD2Cl2, δ): 8.67 (d, 1H), 7.82 (s, 1H), 7.70 (d, 2H), 7.63 (d, 2H), 7.53 (d, 2H), 7.42 (dd, 1H), 7.34 (d, 2H), 7.21 ppm (d, 1H).

4) Synthesis of Intermediate 4

After 8.0 g (15.6 mmol) of Intermediate 3 was placed into a 250-mL, 3-necked flask and dissolved with 40 mL of nitrobenzene, 3.6 g (21.8 mmol) of POCl$_3$ was added thereto and the resulting mixture was then refluxed at about 200° C. for 1 hour. Then, 0.8 g (3.0 mmol) of tin chloride was slowly added thereto. After 2 hours, the reaction was terminated, followed by extraction with ethyl acetate, drying with anhydrous MgSO$_4$, and then distillation under reduced pressure. The resulting product was purified by column chromagotraphy with a mixture of ethyl acetate and hexane as an eluent to obtain 4.7 g of Intermediate 4 (Yield: 61%). This Intermediate 4 was structurally identified by $^1$H NMR.

$^1$H NMR (300 MHz, CDCl3, δ): 8.54 (d, 1H), 8.43 (d, 2H), 8.21 (s, 1H), 7.99 (d, 1H), 7.82 (d, 1H), 7.75 (d, 2H), 7.61 ppm (d, 2H).

5) Synthesis of Compound 5

After 3.0 g (6.1 mmol) of Intermediate 4 and 0.3 g (0.3 mmol) of Pd(PPh$_3$)$_4$ were placed into a 250-mL, 3-necked flask, dissolved with 30 mL of toluene, and then stirred, 11.1 g (30.4 mmol) of 3-(tributylstannyl)pyridine was added thereto and the resulting mixture was refluxed at about 90° C. for about 9 hours, followed by extraction with CHCl$_3$, drying with anhydrous MgSO$_4$, and then distillation under reduced pressure. The resulting product was purified by column chromagotraphy with a mixture of CH$_2$Cl$_2$ and ethanol (20:1) as an eluent to obtain 0.7 g of Compound 5 (Yield: 23%). This Compound 5 was structurally identified by $^1$H NMR and high-resolution mass spectrometry (HRMS).

$^1$H NMR (300 MHz, CDCl3, δ): 9.10 (d, 1H), 8.97 (dd, 2H), 8.77 (d, 1H), 8.68 (d, 1H), 8.67 (m, 3H), 8.55 (d, 1H), 8.42 (d, 1H), 8.04-8.03 (m, 2H), 8.01-7.95 (m, 5H), 7.84 (d, 2H), 7.46 ppm (m, 3H);

HRMS (EI, m/z): [M$^+$] calcd for C34H22N4 486.1844. found: 486.1846.

Synthesis Example 2

Synthesis of Compound 8

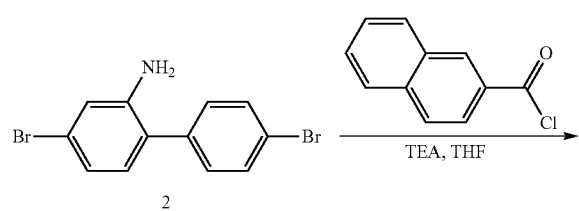

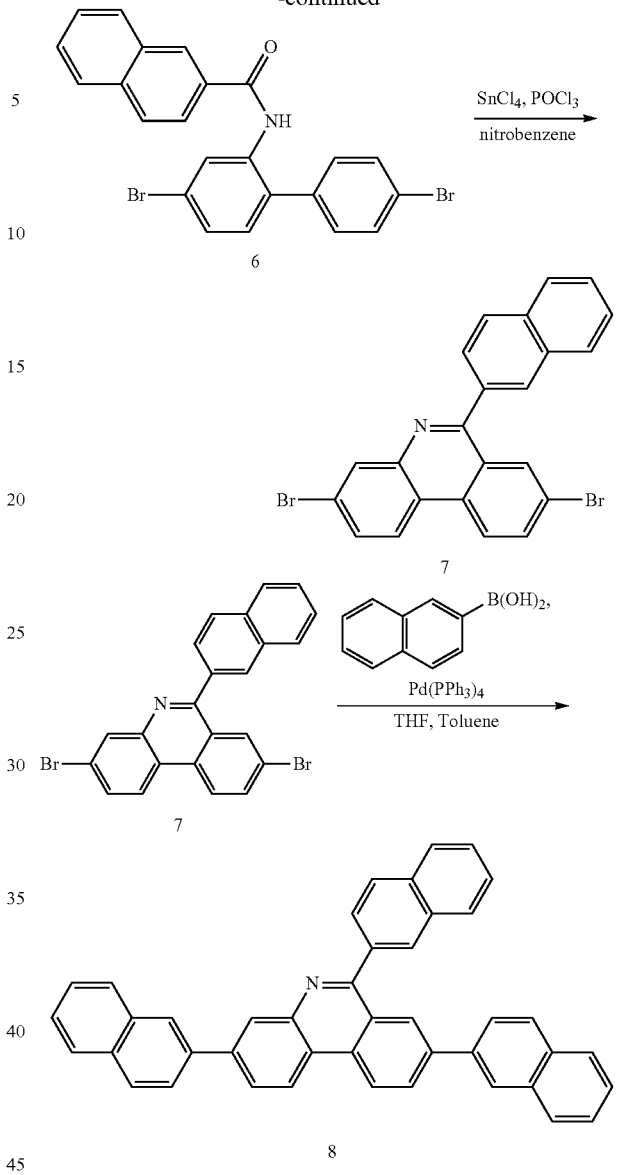

1) Synthesis of Intermediate 6

After 8.0 g (25.4 mmol) of Intermediate 2 was placed into a 500-mL, 3-necked flask and dissolved with 250 mL of THF, 8 mL of triethylamine was added thereto. After the temperature of the reaction product was cooled down to 0° C., a solution of 7.2 g (37.9 mmol) of 2-naphthoyl chloride in THF was slowly dropwise added thereto and the resulting mixture was stirred at room temperature for about 9 hours, followed by extraction with ethyl acetate, drying with anhydrous MgSO$_4$, and then distillation under reduced pressure. The resulting product was purified by column chromagotraphy with a mixture of ethyl acetate and hexane (1:50) as an eluent, and then recrystallized with CH$_2$Cl$_2$ and hexane to obtain 4.0 g of Intermediate 6 (Yield: 32%). This Intermediate 6 was structurally identified by $^1$H NMR.

$^1$H NMR (300 MHz, CD2Cl2, δ): 8.76 (s, 1H), 8.15 (s, 1H), 8.04 (s, 1H), 7.93 (t, 3H), 7.74-7.69 (m, 3H), 7.65-7.58 (m, 2H), 7.45-7.39 (m, 3H), 7.23 ppm (d, 1H).

2) Synthesis of Intermediate 7

After 4.0 g (8.3 mmol) of Intermediate 6 was placed into a 250-mL, 3-necked flask and dissolved with 23 mL of nitrobenzene, 1.8 g (12.0 mmol) of POCl₃ was added thereto and the resulting mixture was then refluxed at about 200° C. for about 1 hour. Then, 0.4 g (1.7 mmol) of tin chloride was slowly added thereto. After 2 hours, the reaction was terminated, followed by extraction with ethyl acetate, drying with anhydrous MgSO₄, and then distillation under reduced pressure. The resulting product was purified by column chromagotraphy with a mixture of ethyl acetate and hexane as an eluent to obtain 1.5 g of Intermediate 7 (Yield: 63%). This Intermediate 7 was structurally identified by ¹H NMR.

¹H NMR (300 MHz, CDCl3, δ): 8.56 (d, 1H), 8.46 (d, 2H), 8.32 (d, 1H), 8.22 (s, 1H), 8.09 (d, 1H), 7.99 (m, 3H), 7.83 (m, 2H), 7.62 ppm (t, 2H).

3) Synthesis of Compound 8

After 2.5 g (5.4 mmol) of Intermediate 7 and 2.8 g (16.2 mmol) of naphthalene-2-yl boronic acid were placed into a 250-mL, 3-necked flask, dissolved with 15 mL of THF and 25 mL of toluene, and then stirred by bubbling for about 1 hour, 20 mL of a 2M K₂CO₃ solution and 0.5 g (0.4 mmol) of Pd(PPh₃)₄ were added thereto and the resulting mixture was refluxed at about 80° C. for about 9 hours, followed by extraction with CHCl₃, drying with anhydrous MgSO₄, and then distillation under reduced pressure. After recrystallization with CHCl₃ and hexane, the resulting product was soxhleted with hexane, toluene, and then CHCl₃ to obtain 0.6 g of Compound 8 (Yield: 20%). This Compound 8 was structurally identified by ¹H NMR and high-resolution mass spectrometry (HRMS).

¹H NMR (300 MHz, CDCl, δ): 8.96 (d, 1H), 8.87 (d, 1H), 8.67 (d, 1H), 8.60 (d, 1H), 8.38 (dd, 3H), 8.23 (dd, 1H), 8.15 (d, 2H), 8.07-7.82 (m, 11H), 7.69-7.50 ppm (m, 6H);

HRMS (EI, m/z): [M⁺] calcd for C43H27N 557.2143. found: 557.2142.

Synthesis Example 3

Synthesis of Compound 11

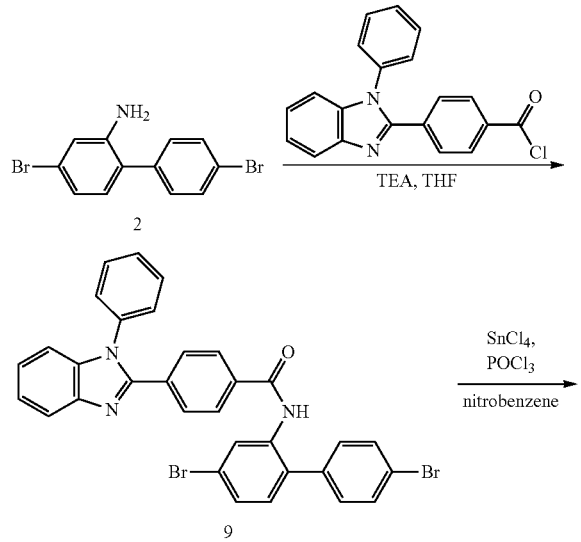

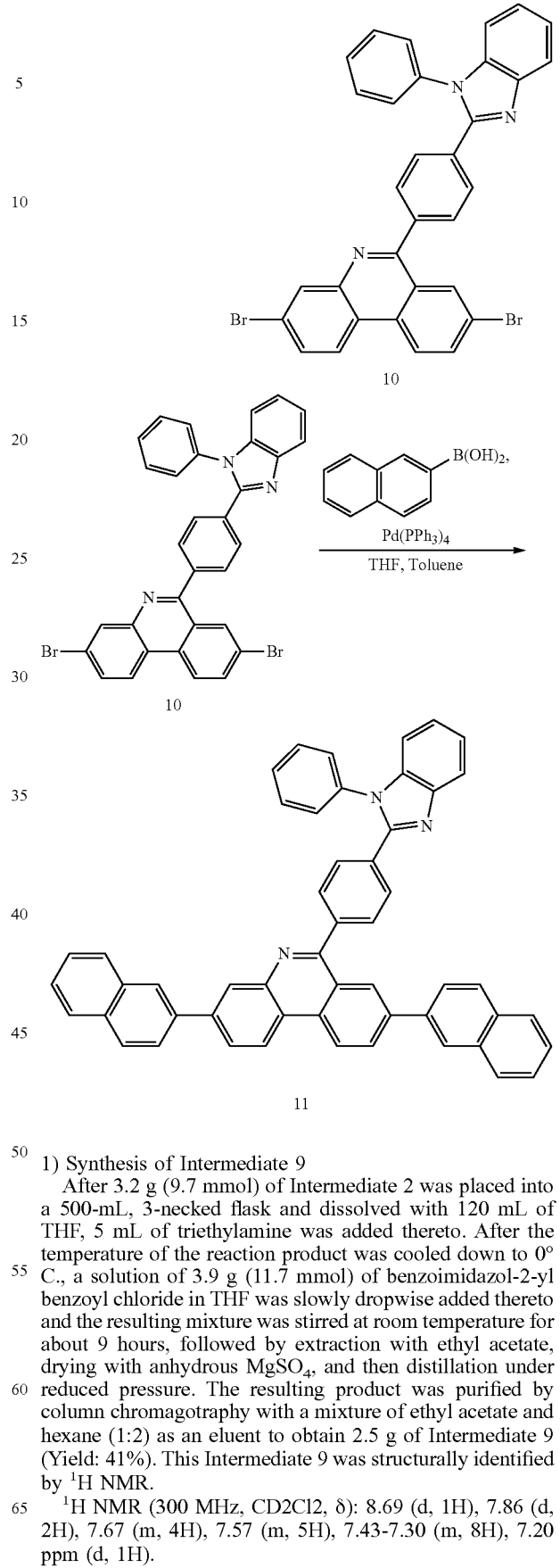

1) Synthesis of Intermediate 9

After 3.2 g (9.7 mmol) of Intermediate 2 was placed into a 500-mL, 3-necked flask and dissolved with 120 mL of THF, 5 mL of triethylamine was added thereto. After the temperature of the reaction product was cooled down to 0° C., a solution of 3.9 g (11.7 mmol) of benzoimidazol-2-yl benzoyl chloride in THF was slowly dropwise added thereto and the resulting mixture was stirred at room temperature for about 9 hours, followed by extraction with ethyl acetate, drying with anhydrous MgSO₄, and then distillation under reduced pressure. The resulting product was purified by column chromagotraphy with a mixture of ethyl acetate and hexane (1:2) as an eluent to obtain 2.5 g of Intermediate 9 (Yield: 41%). This Intermediate 9 was structurally identified by ¹H NMR.

¹H NMR (300 MHz, CD2Cl2, δ): 8.69 (d, 1H), 7.86 (d, 2H), 7.67 (m, 4H), 7.57 (m, 5H), 7.43-7.30 (m, 8H), 7.20 ppm (d, 1H).

2) Synthesis of Intermediate 10

After 2.5 g (4.0 mmol) of Intermediate 9 was placed into a 250-mL, 3-necked flask and dissolved with 25 mL of nitrobenzene, 0.8 g (5.6 mmol) of $POCl_3$ was added thereto and the resulting mixture was then refluxed at about 200° C. for about 1 hour. Then, 0.2 g (0.8 mmol) of tin chloride was slowly added thereto. After 2 hours, the reaction was terminated, followed by extraction with ethyl acetate, drying with anhydrous $MgSO_4$, and then distillation under reduced pressure. The resulting product was purified by column chromagotraphy with a mixture of ethyl acetate and hexane as an eluent to obtain 2.0 g of Intermediate 10 (Yield: 82%). This Intermediate 10 was structurally identified by $^1H$ NMR.

$^1H$ NMR (300 MHz, CD2Cl2,δ): 8.58 (d, 1H), 8.50 (d, 1H), 8.37 (d, 1H), 8.02 (dd, 1H), 7.93-7.82 (m, 4H), 7.72-7.58 (m, 5H), 7.49-7.40 (m, 2H), 7.37-7.33 ppm (m, 3H).

3) Synthesis of Compound 11

After 2.0 g (3.3 mmol) of Intermediate 10 and 1.7 g (9.8 mmol) of naphthalene-2-yl boronic acid were placed into a 250-mL, 3-necked flask, dissolved with 10 mL of THF and 20 mL of toluene, and stirred by bubbling for about 1 hour, 16 mL of a 2M $K_2CO_3$ solution and 0.3 g (0.3 mmol) of $Pd(PPh_3)_4$ were added thereto and the resulting mixture was refluxed at about 80° C. for about 9 hours, followed by extraction with ethyl acetate, drying with anhydrous $MgSO_4$, and then distillation under reduced pressure. The resulting product was purified by column chromagotraphy with a mixture of ethyl acetate and hexane as an eluent to obtain 0.6 g of Compound 11 (Yield: 32%). This Compound 11 was structurally identified by $^1H$ NMR and HRMS.

$^1H$ NMR (300 MHz, CD2Cl2, δ): 8.93 (d, 1H), 8.85 (d, 1H), 8.63 (d, 1H), 8.52 (d, 1H), 8.39-8.36 (m, 2H), 8.24-8.18 (m, 2H), 8.07-7.86 (m, 13H), 7.62-7.34 ppm (m, 12H);

HRMS (EI, m/z): [M$^+$] calcd for $C_{52}H_{33}N_3$ 699.2674. found: 699.2678.

Example 1

A front substrate with ITO/Ag/ITO layers was sonicated in isopropyl alcohol and then in deionized water, in each for about 5 minutes, cleaned by irradiation of ultraviolet rays for about 10 minutes and exposure to ozone, and then mounted into a vacuum deposition device.

After HT-D1 was deposited on the ITO anode of the glass substrate to form a hole injection layer (HIL) having a thickness of about 100 Å, HT3 was deposited on the HIL to form a hole transport layer (HTL) having a thickness of about 1100 Å, and then ADN (as a host) and FD9 (as a dopant) were co-deposited in a weight ratio of about 200:3 on the HTL to form an emission layer (EML) having a thickness of about 200 Å.

Then, Compound 5 was deposited on the EML to form an electron transport layer (ETL) having a thickness of about 360 Å, ET-D1 (lithium quinolate, Liq) was deposited on the ETL to form an EIL having a thickness of about 10 Å, and Mg and Ag were co-deposited on the EIL in a weight ratio of about 110:10 to form a cathode having a thickness of about 110 Å, thereby manufacturing an organic light-emitting device.

Example 2

An organic light-emitting device was manufactured in the same (or substantially the same) manner as in Example 1, except that Compound 8, instead of Compound 5, was used to form the ETL.

Example 3

An organic light-emitting device was manufactured in the same (or substantially the same) manner as in Example 1, except that Compound 11, instead of Compound 5, was used to form the ETL.

Example 4

A front substrate with ITO/Ag/ITO layers was sonicated in isopropyl alcohol and then in deionized water, in each for about 5 minutes, cleaned by irradiation of ultraviolet rays for about 10 minutes and exposure to ozone, and then mounted into a vacuum deposition device.

After HT-D1 was deposited on the ITO anode of the glass substrate to form a HIL having a thickness of about 100 Å, HT3 was deposited on the HIL to form a HTL having a thickness of about 1100 Å, and then ADN (as a host) and FD9 (as a dopant) were co-deposited in a weight ratio of about 200:3 on the HTL to form an EML having a thickness of about 200 Å.

Then, Compound 5 and ET-D1 were co-deposited in a weight ratio of about 50:50 on the EML to form an ETL having a thickness of about 360 Å, ET-D1 was deposited on the ETL to form an EIL having a thickness of about 10 Å, and Mg and Ag were co-deposited on the EIL in a weight ratio of about 110:10 to form a cathode having a thickness of about 110 Å, thereby manufacturing an organic light-emitting device.

Example 5

An organic light-emitting device was manufactured in the same (or substantially the same) manner as in Example 4, except that Compound 8, instead of Compound 5, was used to form the ETL.

Example 6

An organic light-emitting device was manufactured in the same (or substantially the same) manner as in Example 4, except that Compound 11, instead of Compound 5, was used to form the ETL.

Comparative Example 1

An organic light-emitting device was manufactured in the same (or substantially the same) manner as in Example 1, except that $Alq_3$, instead of Compound 5, was used to form the ETL.

Comparative Example 2

An organic light-emitting device was manufactured in the same (or substantially the same) manner as in Example 1, except that Compound A, instead of Compound 5, was used to form the ETL.

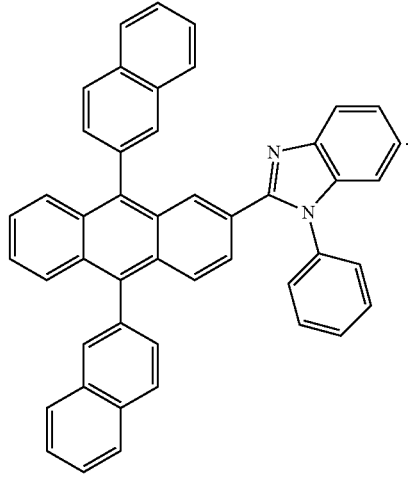

Compound A

Comparative Example 3

An organic light-emitting device was manufactured in the same (or substantially the same) manner as in Example 4, except that Alq$_3$, instead of Compound 5, was used to form the ETL.

Comparative Example 4

An organic light-emitting device was manufactured in the same (or substantially the same) manner as in Example 4, except that Compound A, instead of Compound 5, was used to form the ETL.

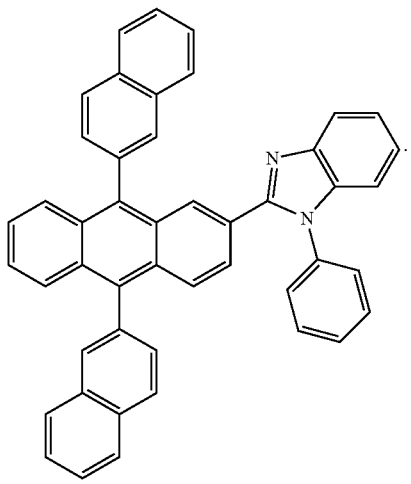

Compound A

Evaluation Example 1

Driving voltages, current densities, luminances, efficiencies, and color of the organic light-emitting devices of Examples 1 to 6 and Comparative Examples 1 to 4 were evaluated using a Keithley source-measure unit (SMU) 236 and a PR650 (available from Photo Research, Inc.). The results are shown in Tables 1 and 2.

Referring to Table 1, most of the organic light-emitting devices of Examples 1 to 6 were found to have improved driving voltage, current density, efficiency, and color purity, as compared to the organic light-emitting devices of Comparative Examples 1 to 4.

Evaluation Example 2

Figure 3:
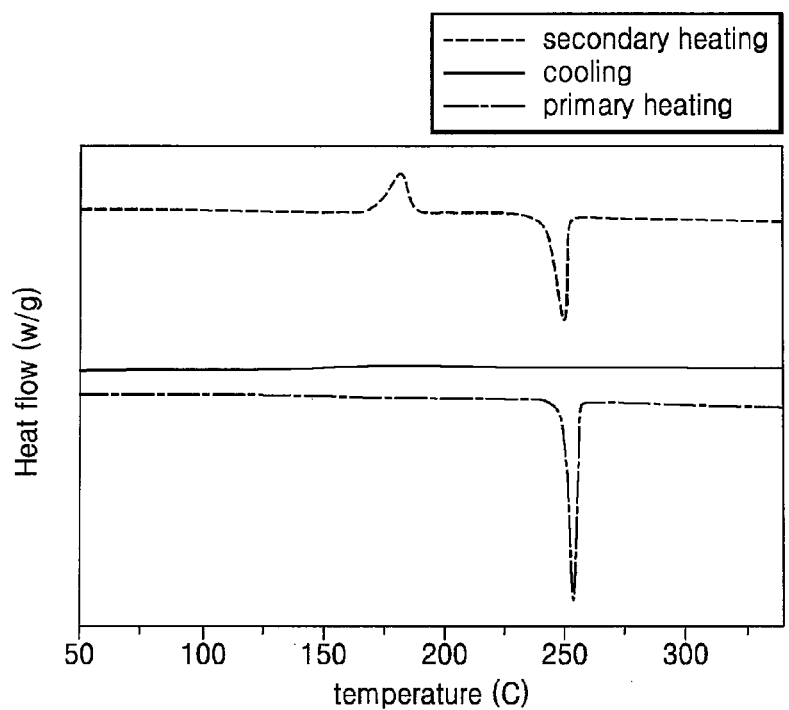
FIG. 3 illustrates results of differential scanning calorimetry performed on Compound 5 according to Synthesis Example 1.

Compound 5 of Synthesis Example 1 was analyzed by thermogravimetric analysis (TGA) and differential scanning calorimetry (DSC) while the temperature was increased from about 40° C. to about 800° C. at a rate of 10° C./min. The results are shown in FIGS. 2 and 3, and Table 2.

TABLE 2

| $T_d$ | $T_g$ | $T_m$ |
|---|---|---|
| 438° C. | 109° C. | 253° C. |

In Table 2, $T_d$ indicates decomposition temperature, $T_g$ indicates glass transition temperature, and $T_m$ indicates melting point.

Evaluation Example 3

Figure 4:
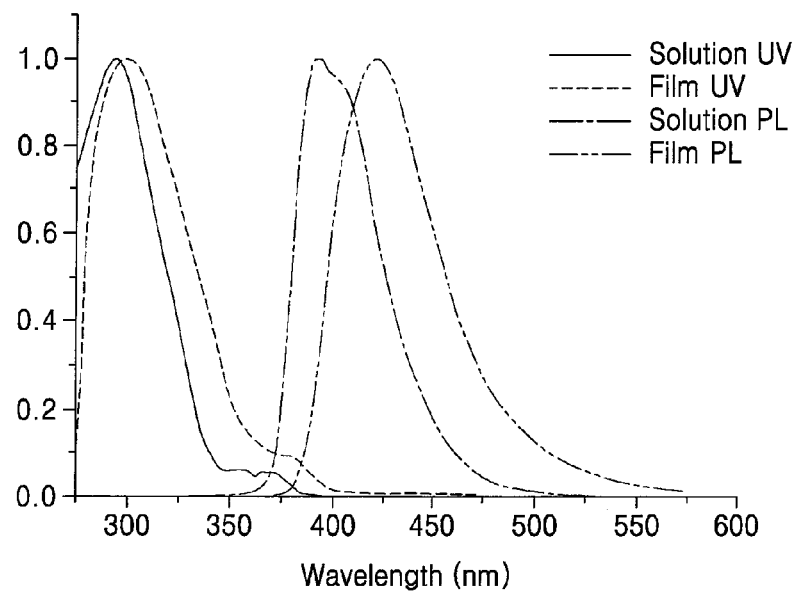
FIG. 4 illustrates photoluminescent (PL) spectra and ultraviolet (UV) absorption spectra of Compound 5 according to Synthesis Example 1.

About $1\times10^{-5}$M of Compound 5 of Synthesis Example 1 was dissolved in a chloroform solvent, and ultraviolet (UV) and photoluminescence (PL) spectra of the solution were analyzed. A film of Compound 5 was formed, and UV and PL spectra of the film were also analyzed. The results are shown in FIG. 4, and Table 3.

TABLE 3

| UV spectrum (nm) | | PL spectrum (nm) | |
|---|---|---|---|
| Solution | Film | Solution | Film |
| 294 | 298 | 393 | 421 |

Evaluation Example 4

Electrochemical characteristics of Compound 5 of Synthesis Example 1 were evaluated using cyclic voltammetry.

TABLE 1

| Example | ETL | Driving voltage (V) | Current density (mA/cm$^2$) | Luminance (cd/m$^2$) | Efficiency (cd/A) | CIE_x | CIE_y |
|---|---|---|---|---|---|---|---|
| Example 1 | Compound 5 | 3.9 | 16.9 | 600 | 3.4 | 0.147 | 0.040 |
| Example 2 | Compound 8 | 4.5 | 16.6 | 600 | 3.2 | 0.149 | 0.041 |
| Example 3 | Compound 11 | 5.2 | 16.1 | 600 | 3.4 | 0.144 | 0.040 |
| Example 4 | Compound 5: Liq = 50:50 | 4.8 | 14.5 | 600 | 4.5 | 0.141 | 0.048 |
| Example 5 | Compound 8: Liq = 50:50 | 5.2 | 15.3 | 600 | 4.2 | 0.143 | 0.045 |
| Example 6 | Compound 11: Liq = 50:50 | 4.9 | 14.8 | 600 | 4.2 | 0.146 | 0.048 |
| Comparative Example 1 | Alq$_3$ | 6.6 | 23.6 | 600 | 2.6 | 0.145 | 0.044 |
| Comparative Example 2 | A | 5.1 | 16.9 | 600 | 3.0 | 0.144 | 0.047 |
| Comparative Example 3 | Compound Alq$_3$: Liq = 50:50 | 6.3 | 17.6 | 600 | 3.2 | 0.146 | 0.043 |
| Comparative Example 4 | Compound A: Liq = 50:50 | 4.5 | 14.6 | 600 | 3.6 | 0.141 | 0.043 |

Figure 5:
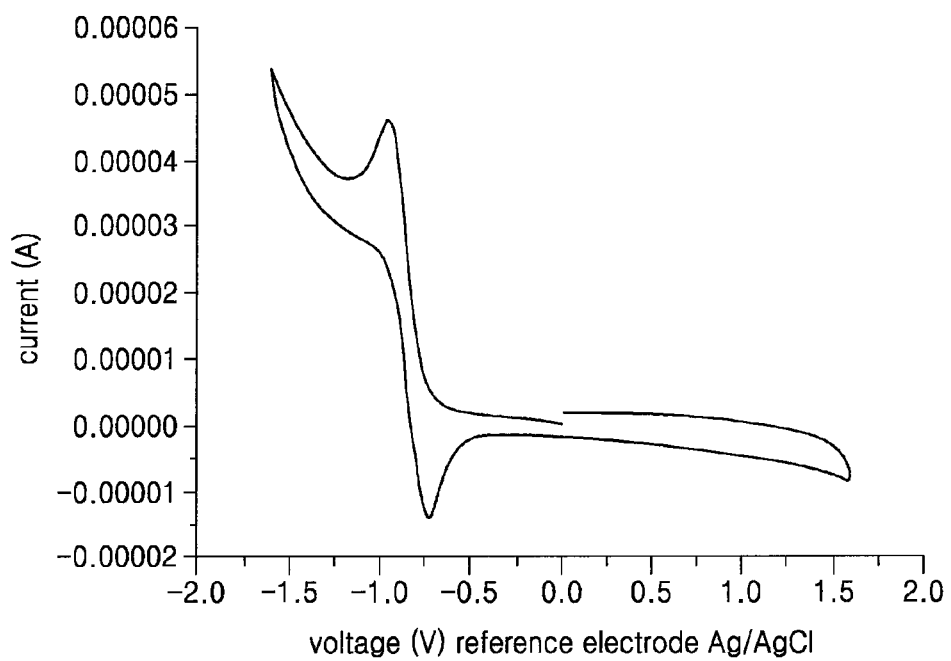
FIG. 5 illustrates results of cyclic voltammetry performed on Compound 5 according to Synthesis Example 1.

The results are shown in FIG. 5. Compound 5 was found to have a highest occupied molecular orbital (HOMO) level of about 6.77 eV, a lowest unoccupied molecular orbital (LUMO) level of about 3.67 eV, and a band gap of about 3.10.

As described above, according to one or more embodiments of the present disclosure, an organic light-emitting device including an electron transport material represented by Formula 1 may have low driving voltage, improved efficiency, improved luminance, and improved lifetime.

It should be understood that the embodiments described herein should be considered in a descriptive sense only and not for purposes of limitation. Descriptions of features or aspects within each embodiment should typically be considered as available for other similar features or aspects in other embodiments.

As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

While one or more embodiments of the present disclosure have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:
a first electrode;
a second electrode facing the first electrode;
an organic layer between the first electrode and the second electrode, the organic layer comprising an emission layer; and
an electron transport region between the emission layer and the second electrode, the electron transport region comprising
an electron transport material represented by Formula 1-11:

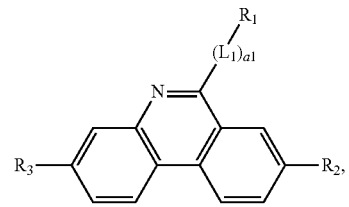

Formula 1-11 wherein, in Formula 1-11, $L_1$ is selected from:

a phenylene group, and a phenylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, and a cyclohexenyl group;

a1 is selected from 0 and 1;

$R_1$ is selected from a phenyl group, a naphthyl group, a pyridinyl group, and a benzimidazolyl group, and a phenyl group, a naphthyl group, a pyridinyl group, and a benzimidazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group and a benzimidazolyl group;

$R_2$ and $R_3$ are each independently selected from a phenyl group, a naphthyl group, and a pyridinyl group, and a phenyl group, a naphthyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and a pyridinyl group; and $R_2$ and $R_3$ are identical to each other;

provided that when $R_1$ is selected from a substituted or unsubstituted phenyl group and a substituted or unsubstituted naphthyl group, $R_2$ and $R_3$ is each a substituted or unsubstituted pyridinyl group, and when $R_2$ and $R_3$ are selected from a substituted or unsubstituted phenyl group and a substituted or unsubstituted naphthyl group, $R_1$ is selected from a substituted or unsubstituted pyridinyl group and a substituted or unsubstituted benzimidazolyl group.

2. The organic light-emitting device of claim 1, wherein $L_1$ is selected from groups represented by Formulae 3-1 and 3-2:

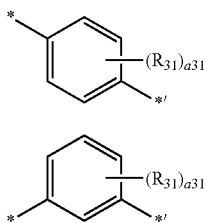

3-1

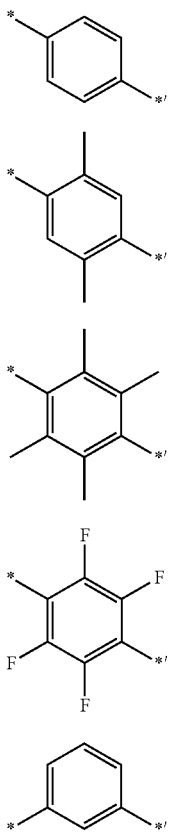

3-2 wherein, in Formulae 3-1 and 3-2,
$R_{31}$ is selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;
a31 is selected from 1, 2, 3, and 4; and
* and *' are each independently a binding site with an adjacent atom.

3. The organic light-emitting device of claim 1, wherein $L_1$ is selected from groups represented by Formulae 4-1 to 4-5:

4-1

4-2

4-3

4-4

4-5 wherein, in Formulae 4-1 to 4-5,
* and *' are each independently a binding site with an adjacent atom.

4. The organic light-emitting device of claim 1, wherein $R_1$ is selected from groups represented by Formulae 5-1 to 5-3, 5-10 to 5-12 and 5-46 to 5-51, and $R_2$ and $R_3$ are each independently selected from groups represented by Formulae 5-1 to 5-3 and 5-10 to 5-12:

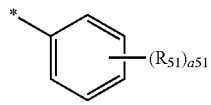

5-1

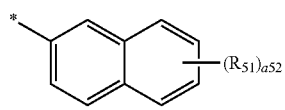

5-2

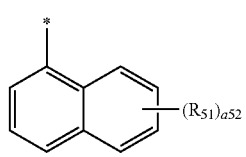

5-3

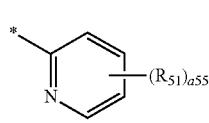

5-10

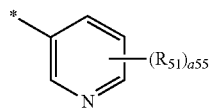

5-11

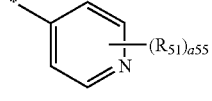

5-12

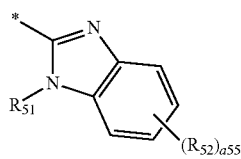

5-46

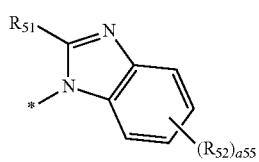

5-47

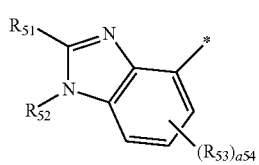

5-48

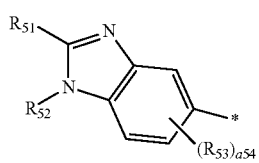

5-49

-continued

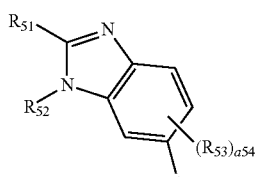 5-50

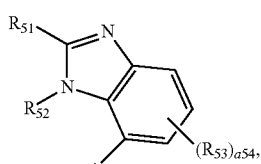 5-51 wherein, in Formulae 5-1 to 5-3, 5-10 to 5-12 and 5-46 to 5-51, $R_{51}$ to $R_{53}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and a pyridinyl group;

a51 is selected from 1, 2, 3, 4, and 5;

a52 is selected from 1, 2, 3, 4, 5, 6, and 7;

a54 is selected from 1, 2, and 3;

a55 is selected from 1, 2, 3, and 4; and

* is a binding site with an adjacent atom.

5. The organic light-emitting device of claim 1, wherein $R_1$ is selected from groups represented by Formulae 6-1 to 6-3, 6-6 to 6-40, 6-46 to 6-51, 6-82 and 6-83 and $R_2$ and $R_3$ are each independently selected from groups represented by Formulae 6-1 to 6-3, 6-6 to 6-40, and 6-46 to 6-51:

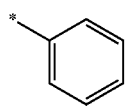 6-1

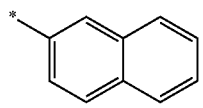 6-2

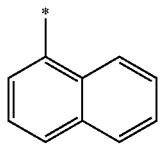 6-3

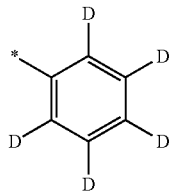 6-6

-continued

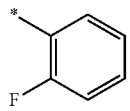 6-7

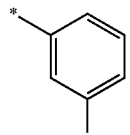 6-8

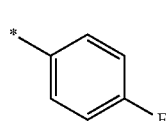 6-9

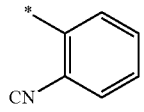 6-10

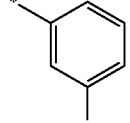 6-11

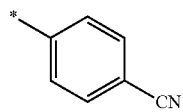 6-12

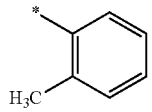 6-13

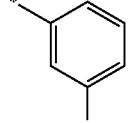 6-14

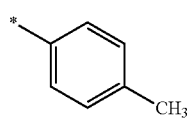 6-15

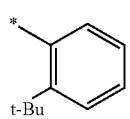 6-16

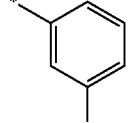 6-17

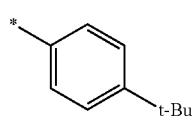 6-18

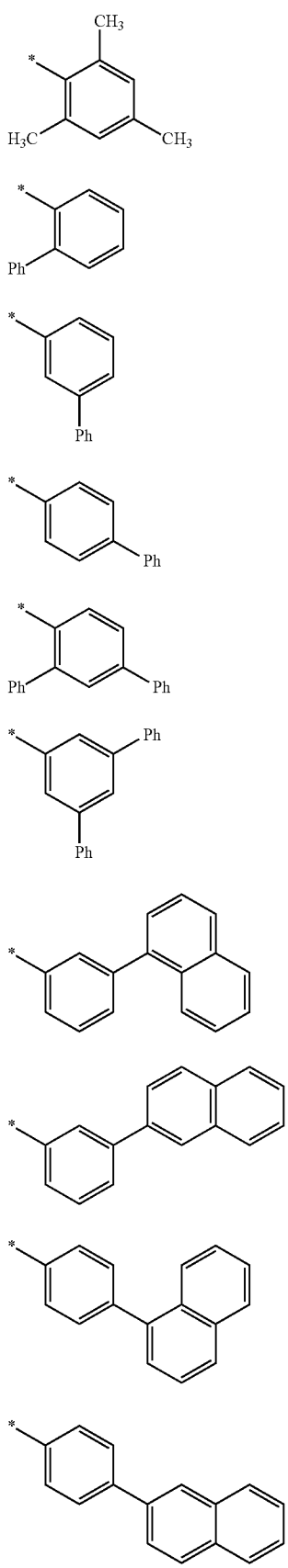
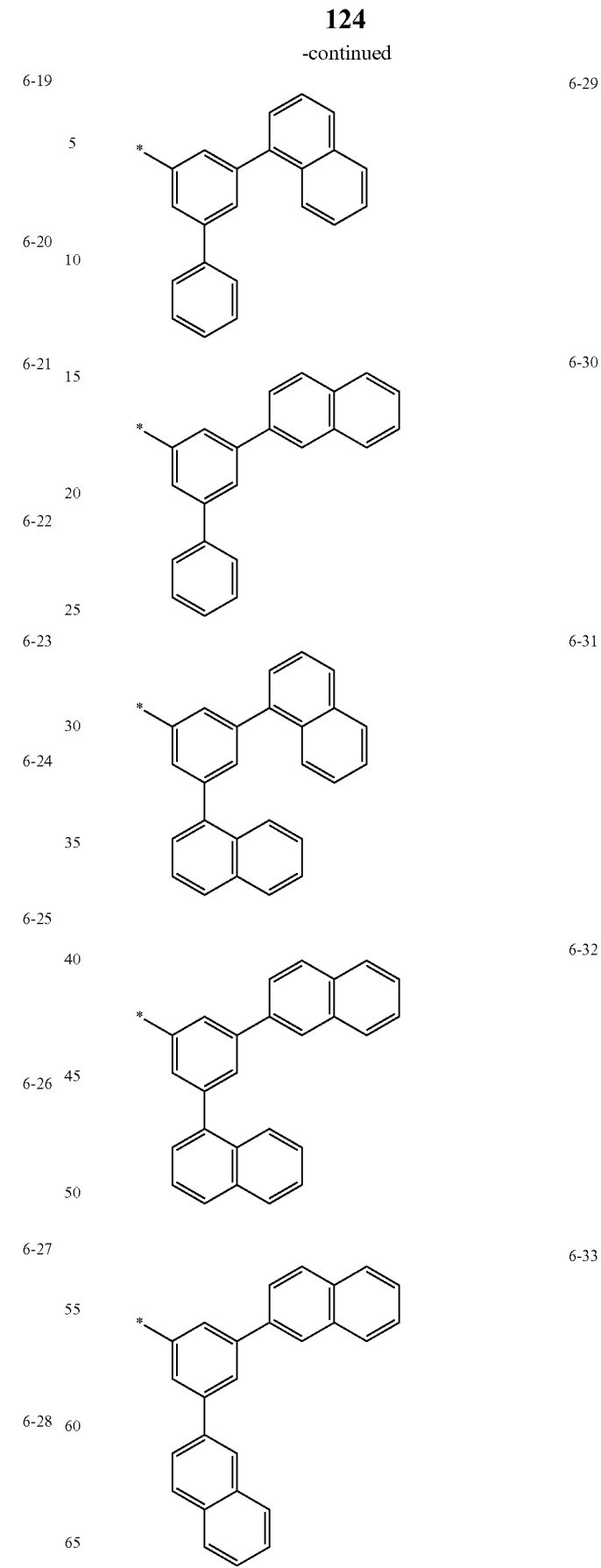

125
-continued
6-34 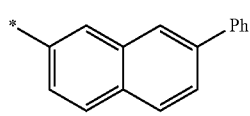
6-35 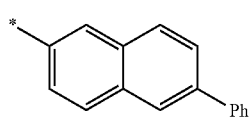
6-36 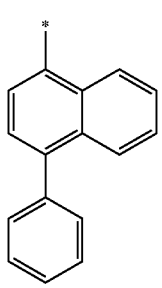
6-37 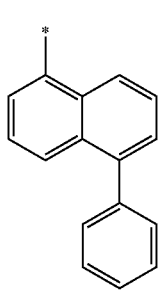
6-38 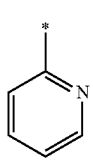
6-39 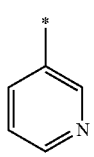
6-40 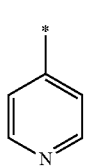
6-46 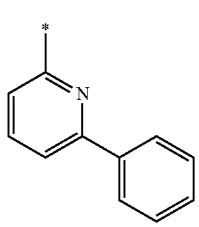
126
-continued
6-47 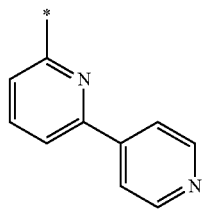
6-48 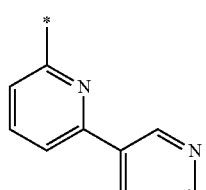
6-49 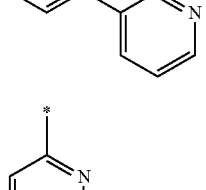
6-50 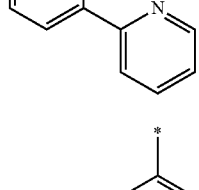
6-51 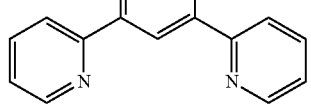
6-82 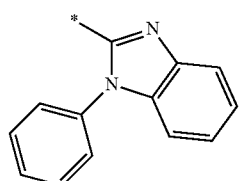
6-83 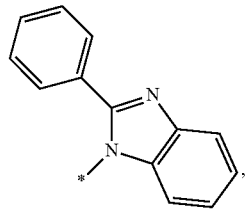
wherein, in Formulae 6-1 to 6-3, 6-6 to 6-40, 6-46 to 6-51, 6-82 and 6-83,
t-Bu is a tert-butyl group; Ph is a phenyl group; and * is a binding site with an adjacent atom.

6. The organic light-emitting device of claim 1, wherein the electron transport region further includes an alkali metal complex.

7. The organic light-emitting device of claim 6, wherein the alkali metal complex is represented by one of Formulae 2-1 to 2-4:

Formula 2-1
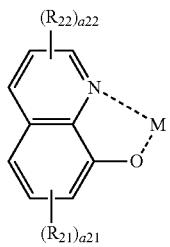

Formula 2-2
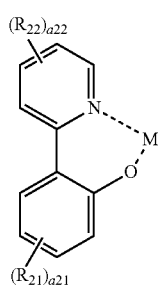

Formula 2-3
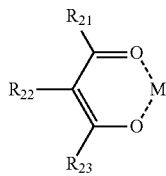

Formula 2-4
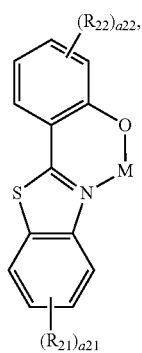

wherein, in Formulae 2-1 to 2-4,

M is an alkali metal;

$R_{21}$ to $R_{23}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

wherein $R_{21}$ to $R_{23}$ are optionally linked to one another to form a ring; and a21 and a22 are each independently selected from 1, 2, 3, and 4.

8. The organic light-emitting device of claim 6, wherein a weight ratio of the electron transport material to the alkali metal complex is in a range of about 10:90 to about 90:10.

9. The organic light-emitting device of claim 1, wherein the electron transport region comprises an electron transport layer, and the electron transport layer comprises the electron transport material.

10. The organic light-emitting device of claim 9, wherein the electron transport layer further comprises an alkali metal complex.

11. An organic light-emitting device comprising:

a first electrode;

a second electrode facing the first electrode;

an organic layer between the first electrode and the second electrode, the organic layer comprising an emission layer; and an electron transport region between the emission layer and the second electrode, the electron transport region comprising an electron transport material, wherein the electron transport material is selected from compounds represented by the following formulae:

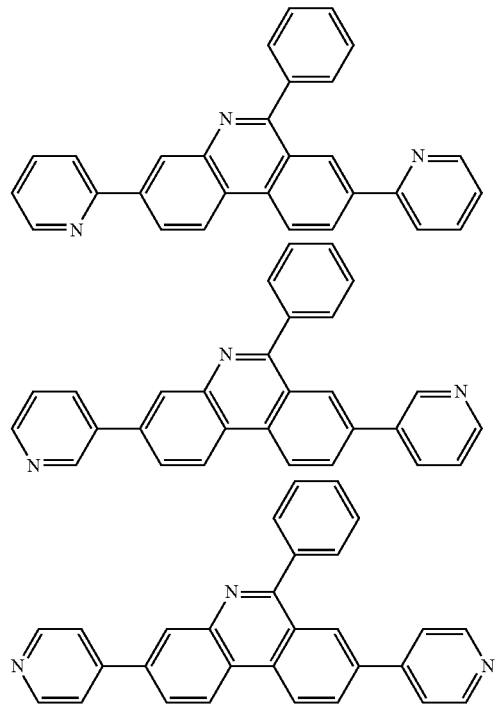

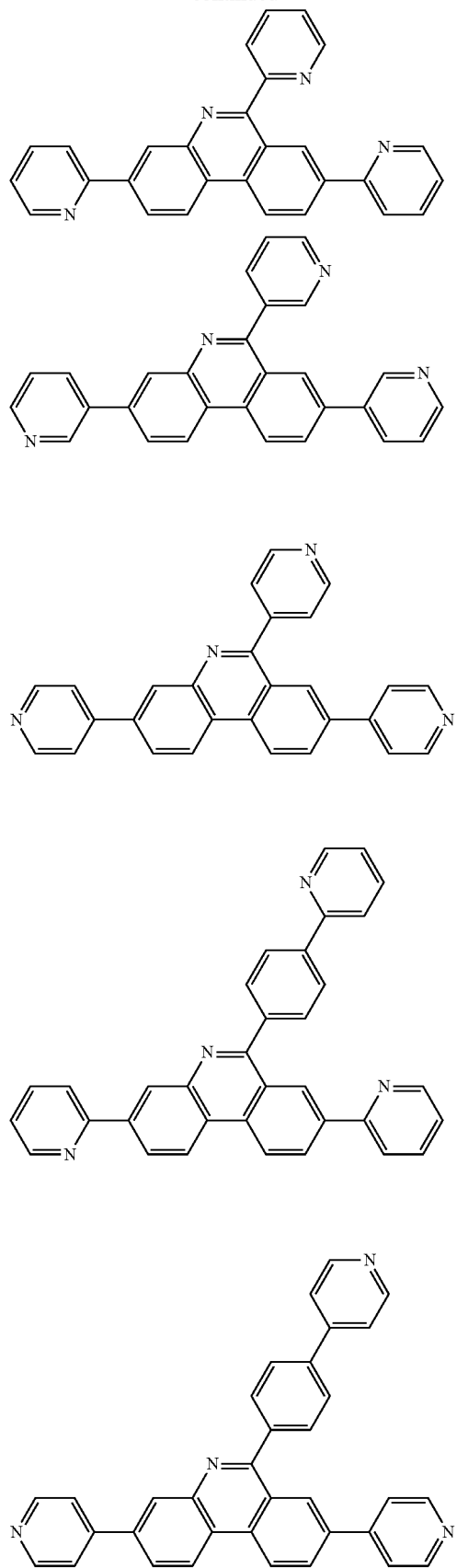
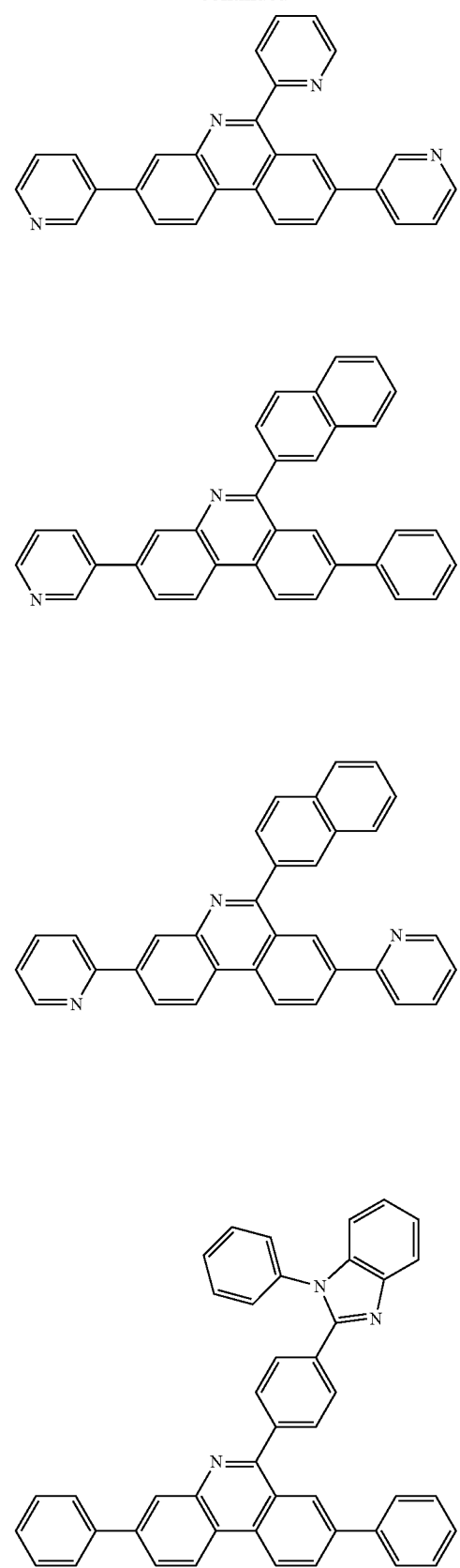

131
-continued
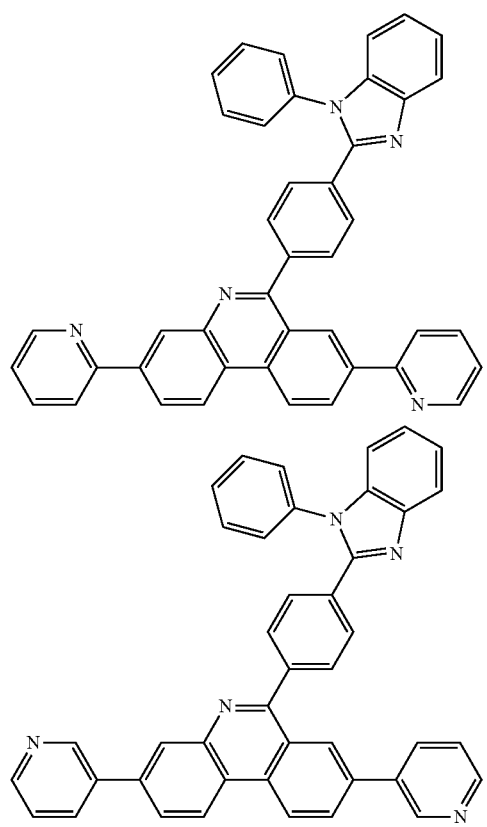
132
-continued
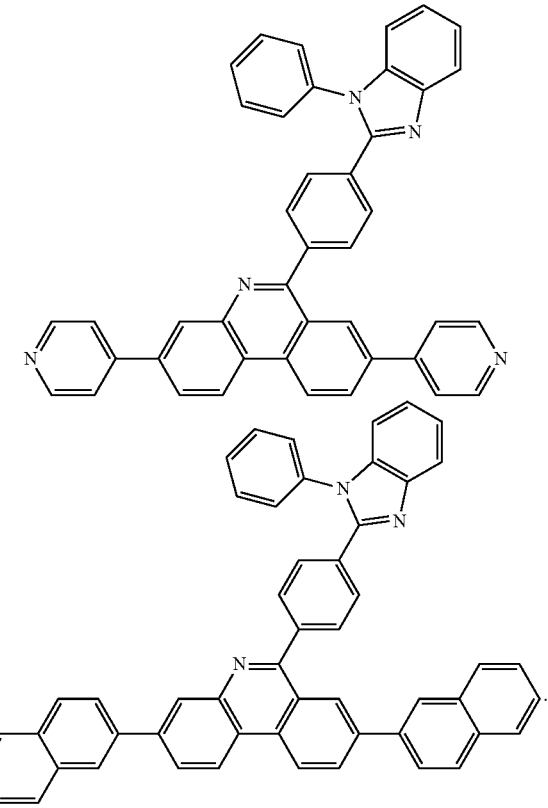
* * * * *